United States Patent
Iwata

(10) Patent No.: US 6,947,317 B2
(45) Date of Patent: Sep. 20, 2005

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/939,459

(22) Filed: Sep. 14, 2004

(65) Prior Publication Data

US 2005/0036384 A1 Feb. 17, 2005

Related U.S. Application Data

(62) Division of application No. 10/170,366, filed on Jun. 14, 2002, now Pat. No. 6,804,144.

(30) Foreign Application Priority Data

Nov. 15, 2001 (JP) .................. 2001-350013

(51) Int. Cl.⁷ .............................. G11C 11/00
(52) U.S. Cl. .................. 365/158; 365/66; 365/189.09; 365/209; 365/230.06
(58) Field of Search .............. 365/158, 66, 189.09, 365/209, 230.06

(56) References Cited

U.S. PATENT DOCUMENTS

| | | |
|---|---|---|
| 5,289,410 A | 2/1994 | Katti et al. |
| 5,565,695 A | 10/1996 | Johnson |
| 5,587,943 A | * 12/1996 | Torok et al. .............. 365/158 |

(Continued)

FOREIGN PATENT DOCUMENTS

WO   WO 01/24185 A1   4/2001

OTHER PUBLICATIONS

Roy Sheuerlein et al., "a 10ns Read and Write Non–Volatile Memory Array Using a Magnetic Tunnel Junction and FET Switch in Each Cell", 2000 IEEE, International Solid State Circuits Conference, Digest of Technical Papers, Feb. 8, 2000 (6 pages).

M. Durlam, et al., "Nonvolatile RAM Based on Magnetic Tunnel Junction Elements", 2000 IEEE International Solid–State Circuits Conference, Digest of Technical Papers, Feb. 8, 2000, (6 pages).

Primary Examiner—Hoai Ho
Assistant Examiner—Ly Duy Pham
(74) Attorney, Agent, or Firm—Oblon, Spivak, McClelland, Maier & Neustadt, P.C.

(57) ABSTRACT

In the first read operation, a read current is supplied to TMR elements connected in parallel in one column or one block to detect initial data. Trial data is then written in a selected memory cell. At the same time of or in parallel with writing of the trial data, the second read operation is performed. In the second read operation, a read current is supplied to the TMR elements connected in parallel in one column or one block to read comparison data. Subsequently, the initial data is compared with the comparison data to determine the data value in the selected memory cell. Finally, rewrite operation is performed for the selected memory cell.

9 Claims, 52 Drawing Sheets

U.S. PATENT DOCUMENTS

| | | | |
|---|---|---|---|
| 5,699,293 | A | 12/1997 | Tehrani et al. |
| 5,748,519 | A | 5/1998 | Tehrani et al. |
| 6,128,239 | A | 10/2000 | Perner |
| 6,134,138 | A | 10/2000 | Lu et al. |
| 6,166,944 | A * | 12/2000 | Ogino ......................... 365/97 |
| 6,188,615 | B1 | 2/2001 | Perner et al. |
| 6,225,933 | B1 | 5/2001 | Salter et al. |
| 6,312,074 | B1 | 11/2001 | Walker |
| 6,469,927 | B2 | 10/2002 | Spitzer et al. |
| 6,532,163 | B2 | 3/2003 | Okazawa |
| 6,538,921 | B2 | 3/2003 | Daughton et al. |
| 6,545,908 | B1 | 4/2003 | Lienau |
| 6,576,969 | B2 | 6/2003 | Tran et al. |
| 6,587,370 | B2 * | 7/2003 | Hirai .......................... 365/171 |
| 2001/0017798 | A1 | 8/2001 | Ishill |
| 2002/0006061 | A1 | 1/2002 | Poechmueller |
| 2002/0024842 | A1 | 2/2002 | Spitzer et al. |
| 2002/0044481 | A1 | 4/2002 | Hidaka |
| 2002/0051381 | A1 | 5/2002 | Numata et al. |
| 2002/0135018 | A1 | 9/2002 | Hidaka |
| 2002/0186582 | A1 | 12/2002 | Sharma et al. |
| 2002/0190291 | A1 | 12/2002 | Hosotani |
| 2003/0058685 | A1 * | 3/2003 | Tran et al. .................. 365/158 |
| 2003/0156448 | A1 | 8/2003 | Hidaka |

* cited by examiner

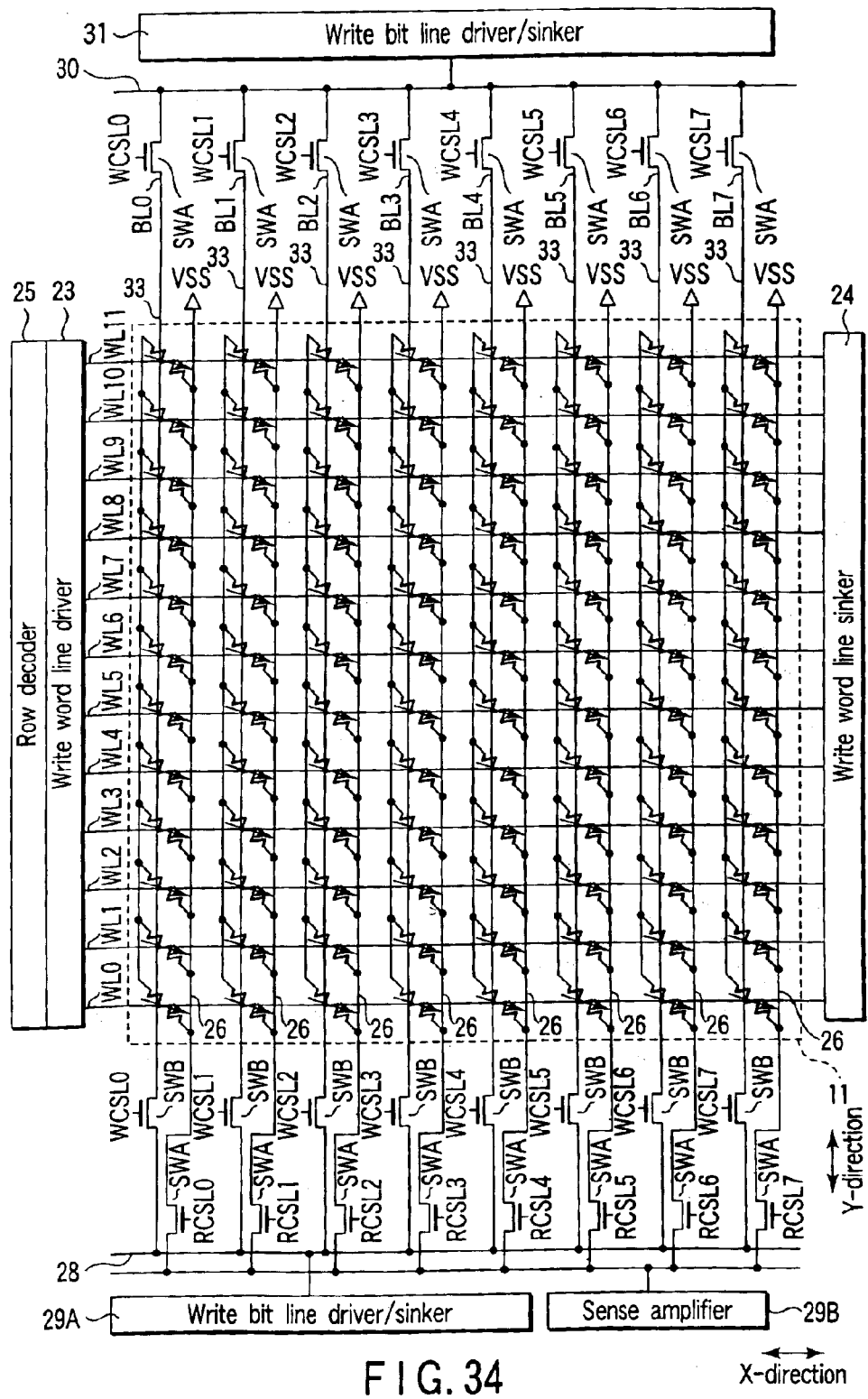
F I G. 34

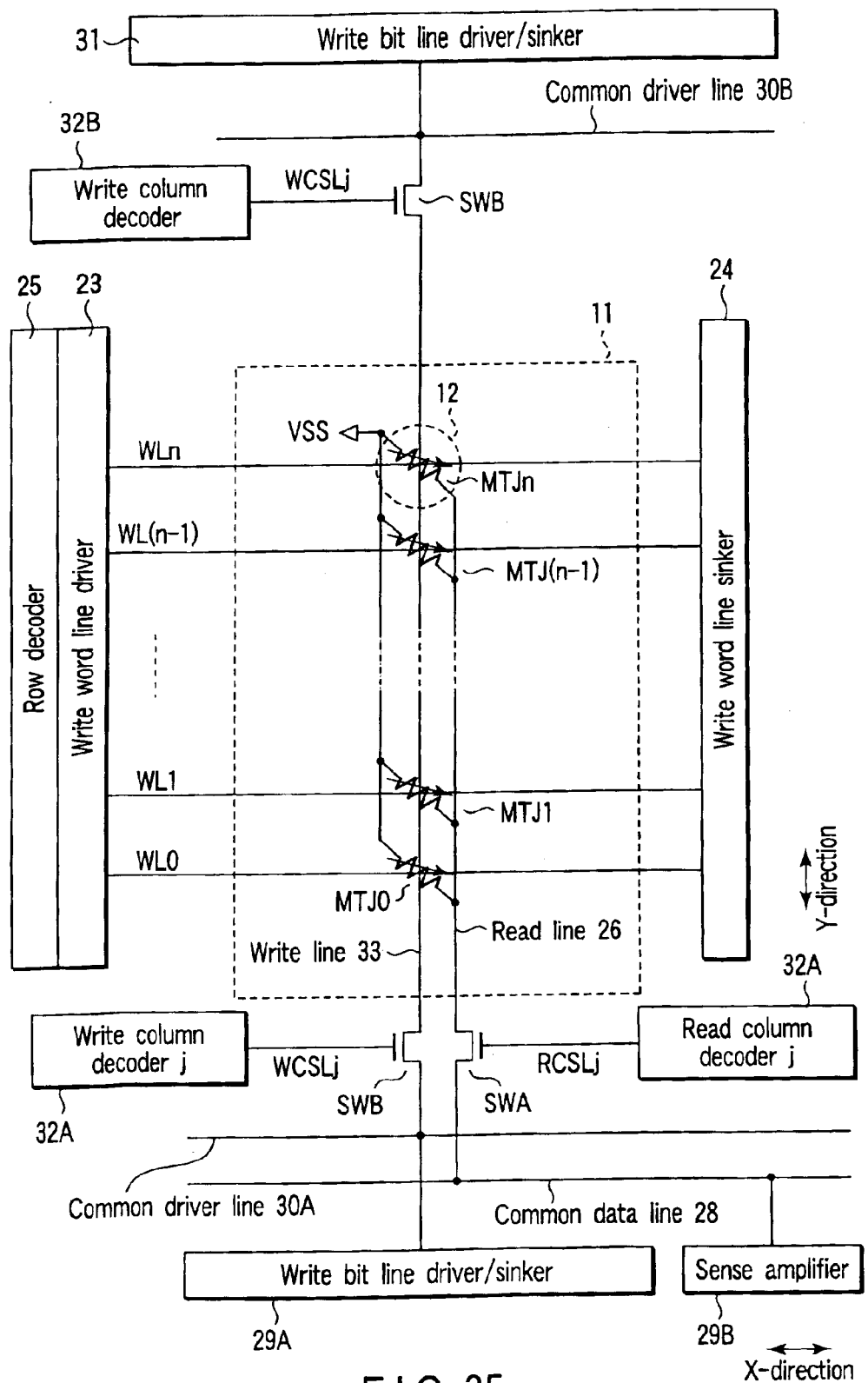
F I G. 35

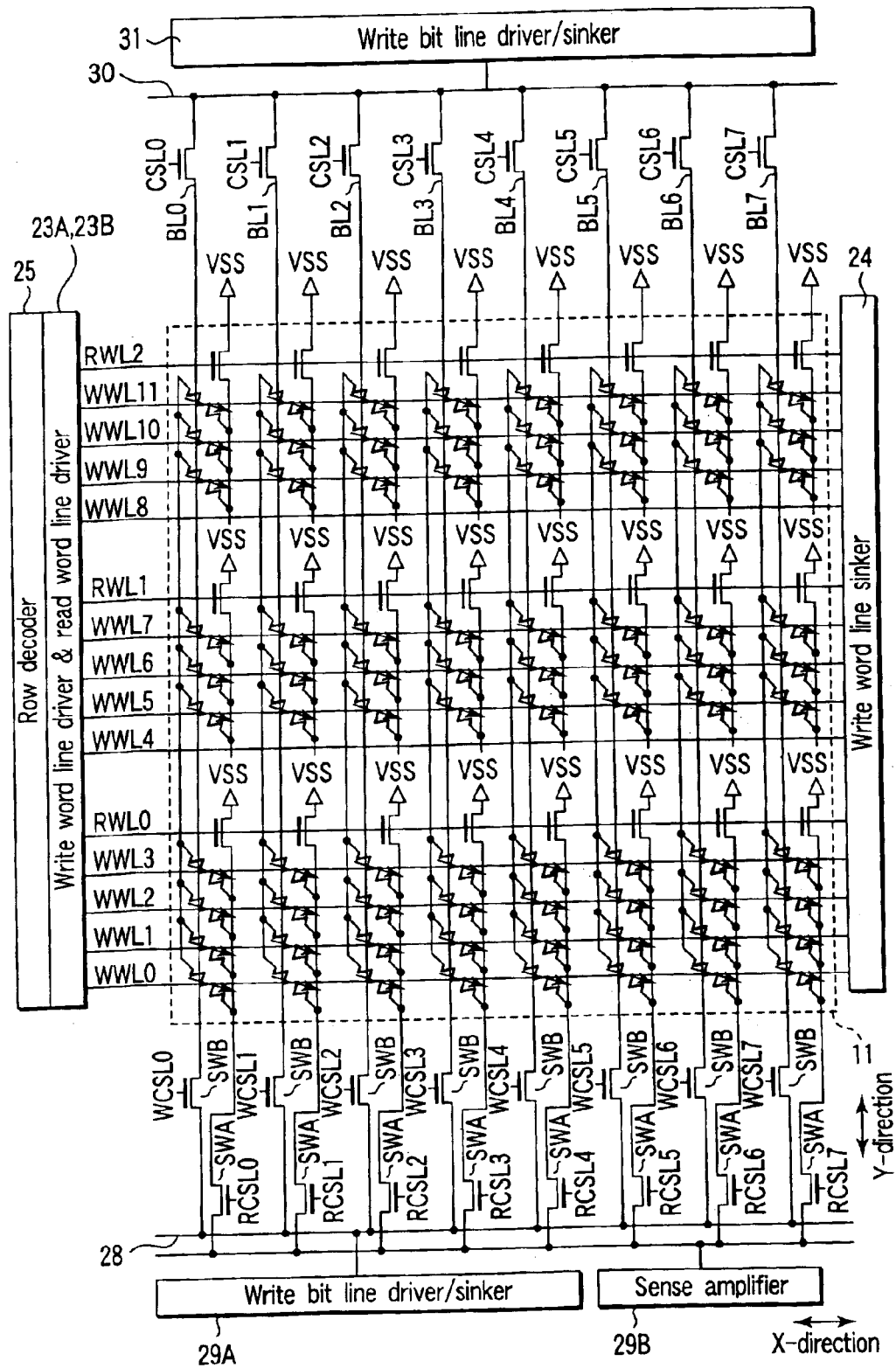
F I G. 36

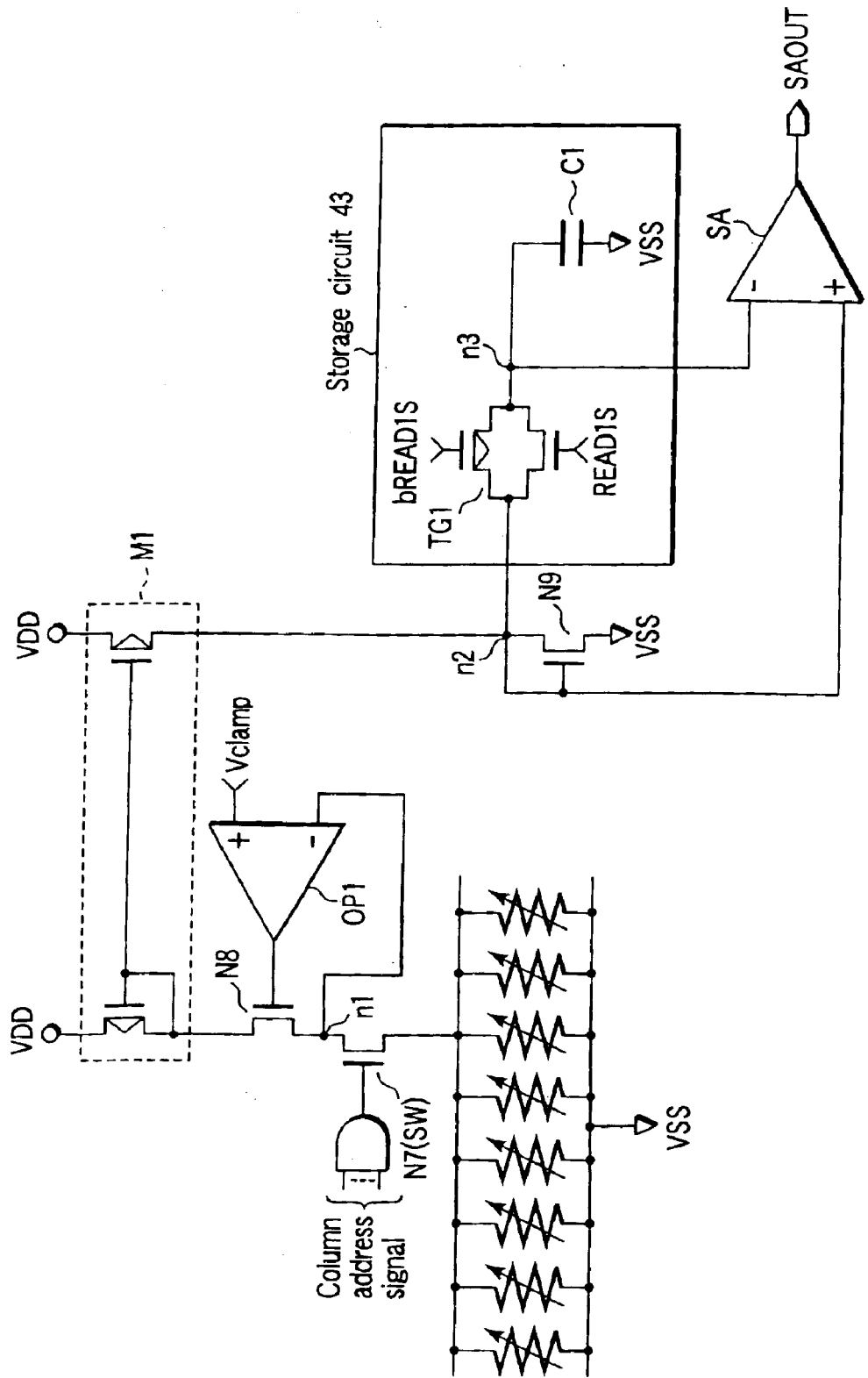
F I G. 44

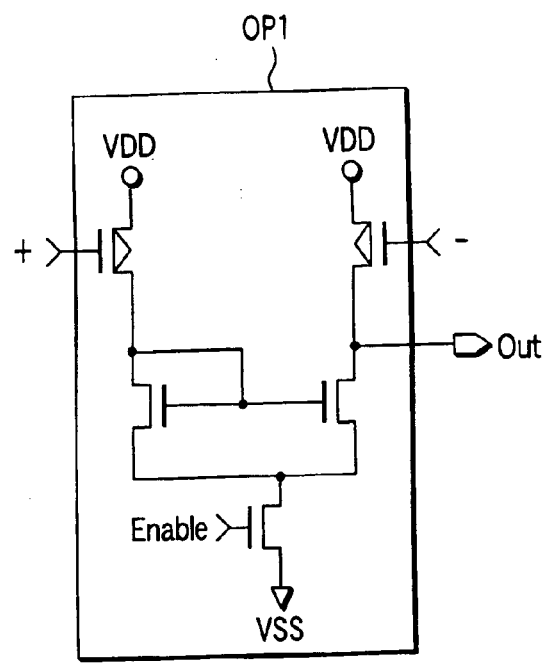
F I G. 49
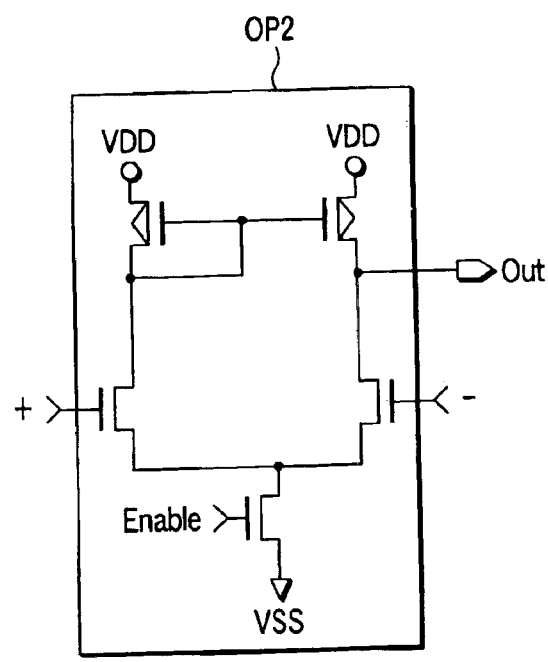
F I G. 50

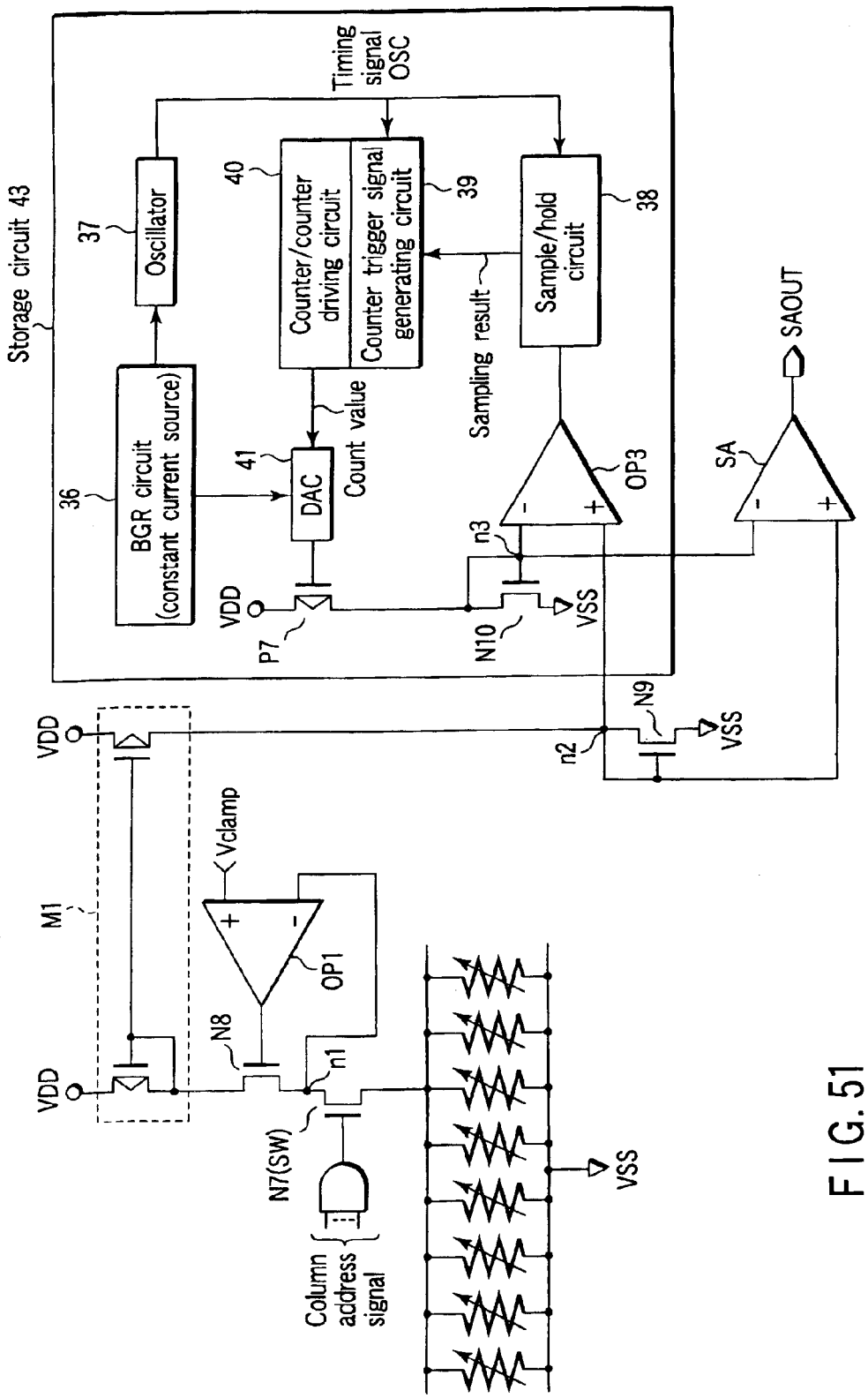
F I G. 51

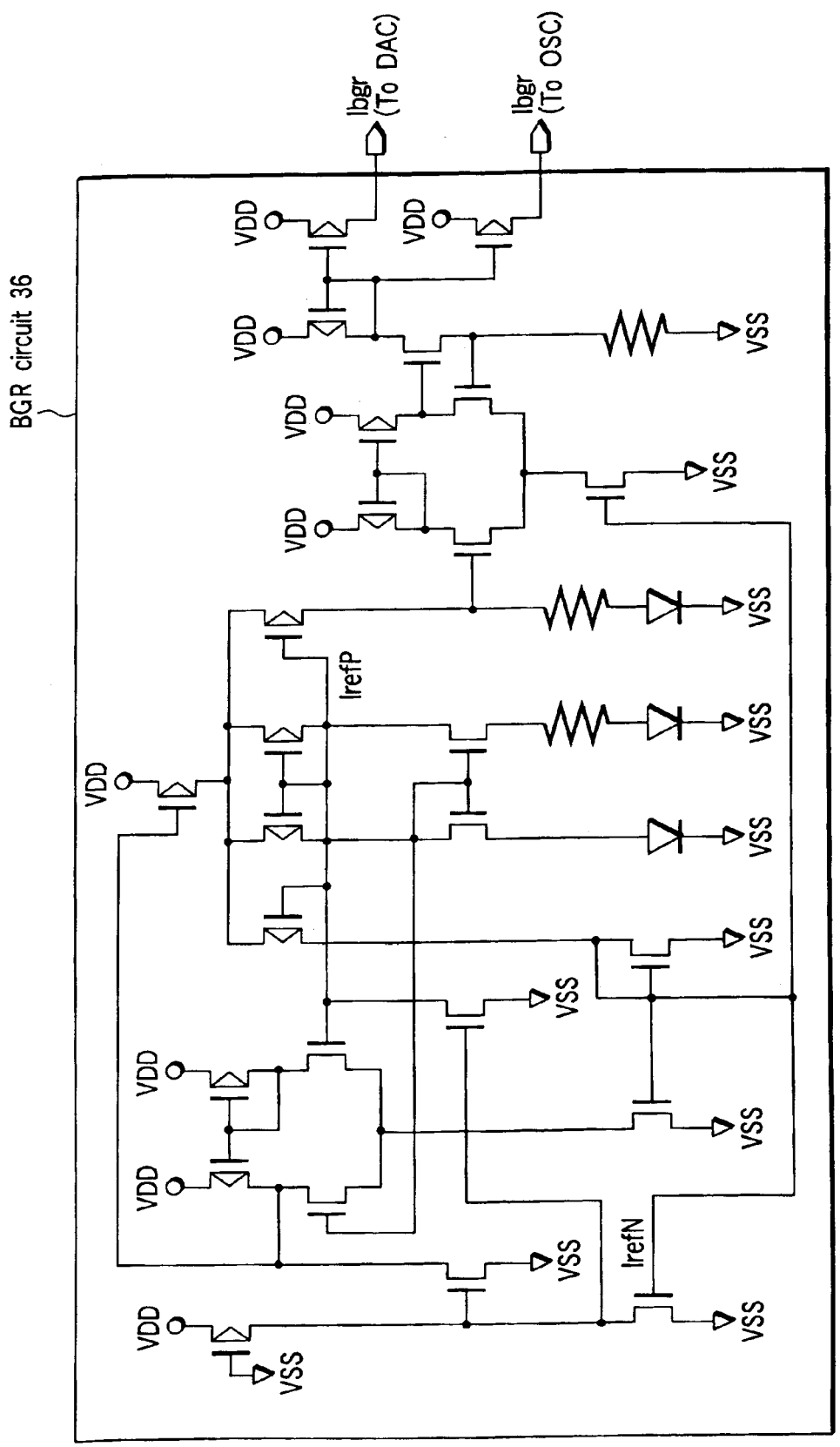
F I G. 52

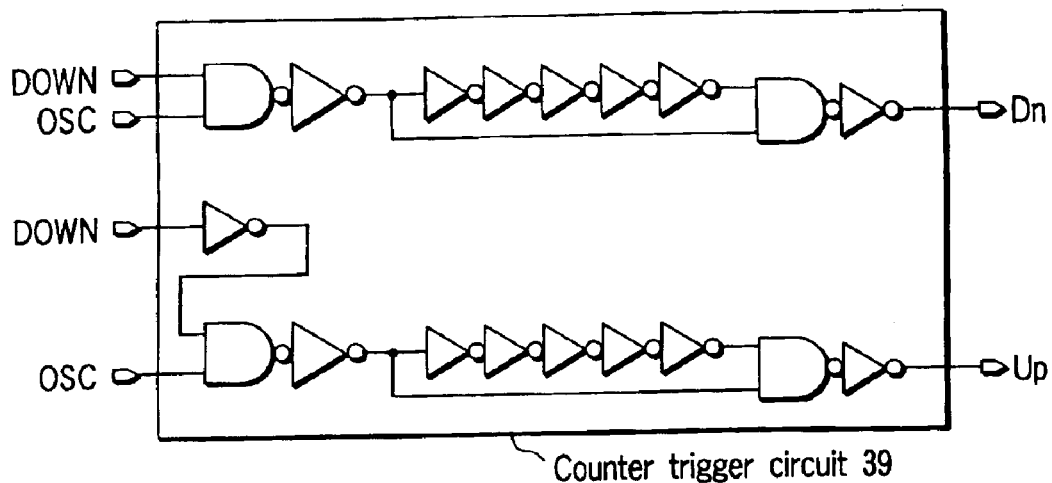
F I G. 55
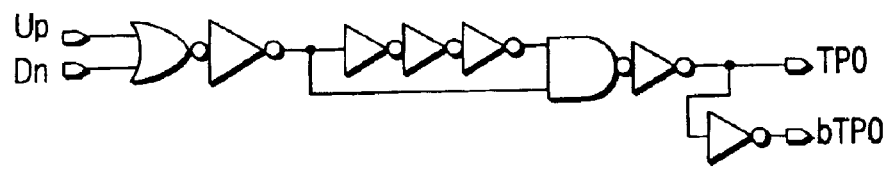
F I G. 56
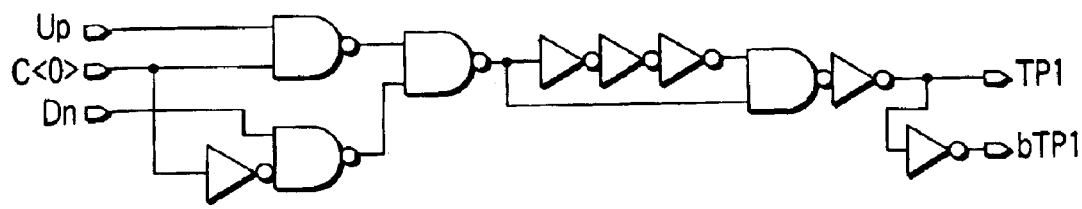
F I G. 57

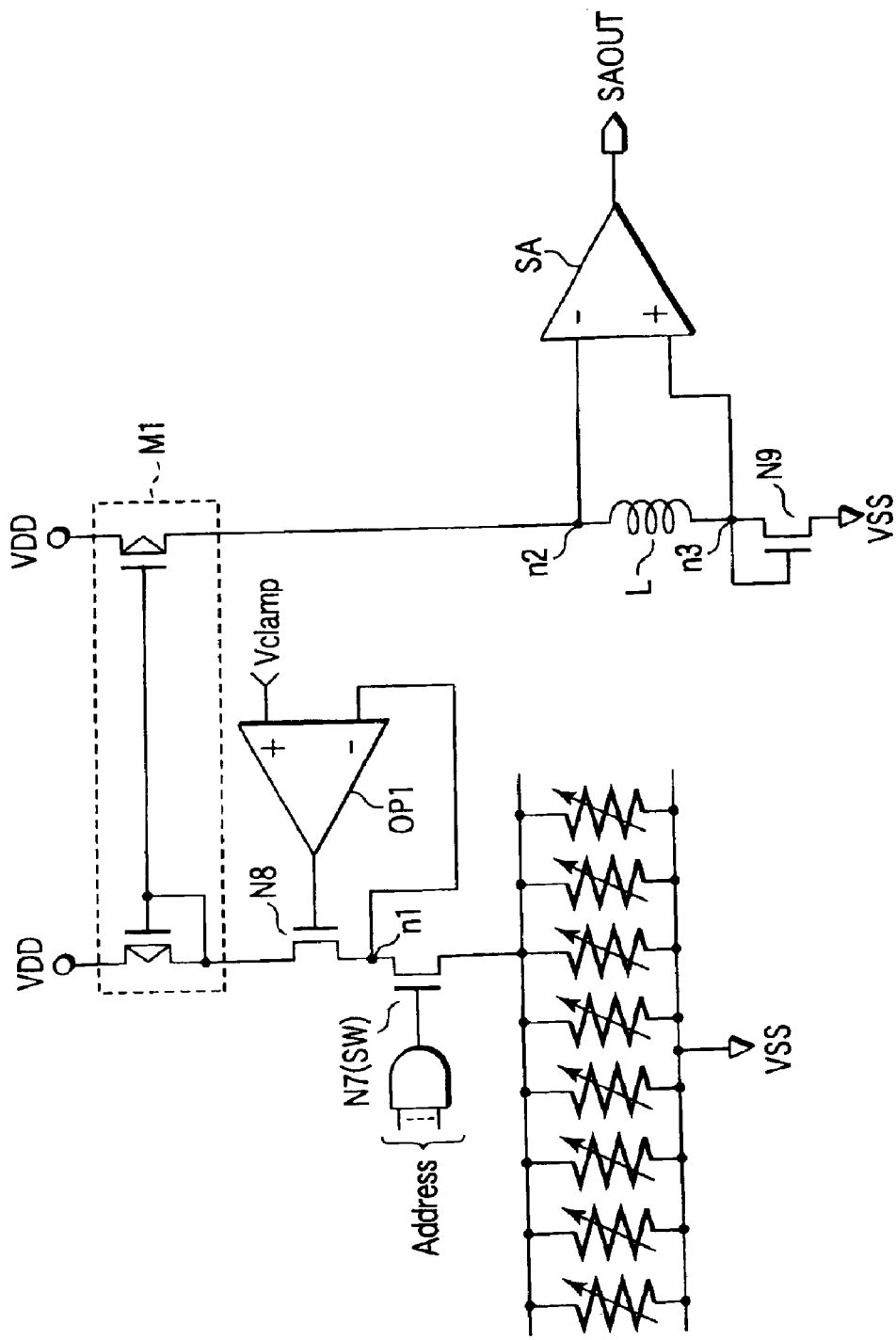
F I G. 67

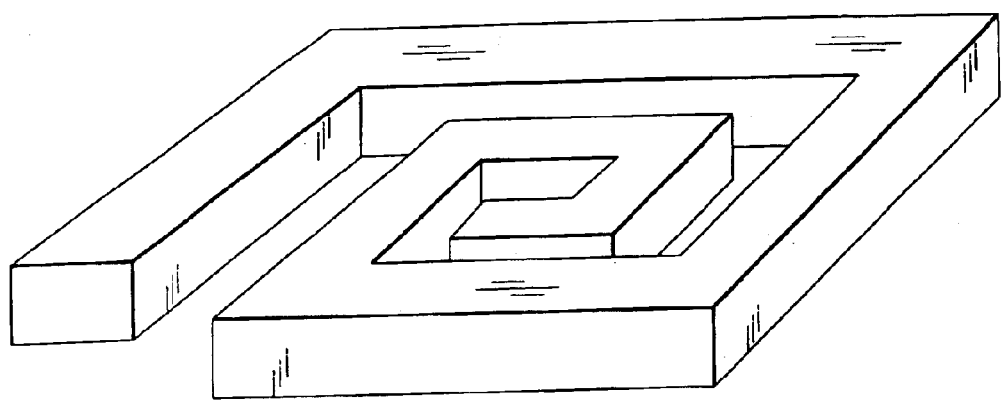
F I G. 68A
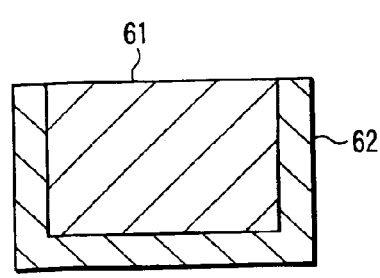
F I G. 68B
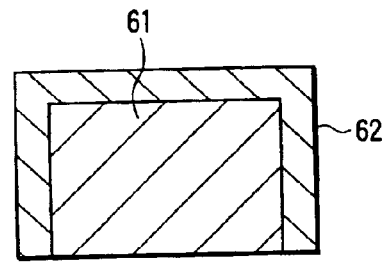
F I G. 68C

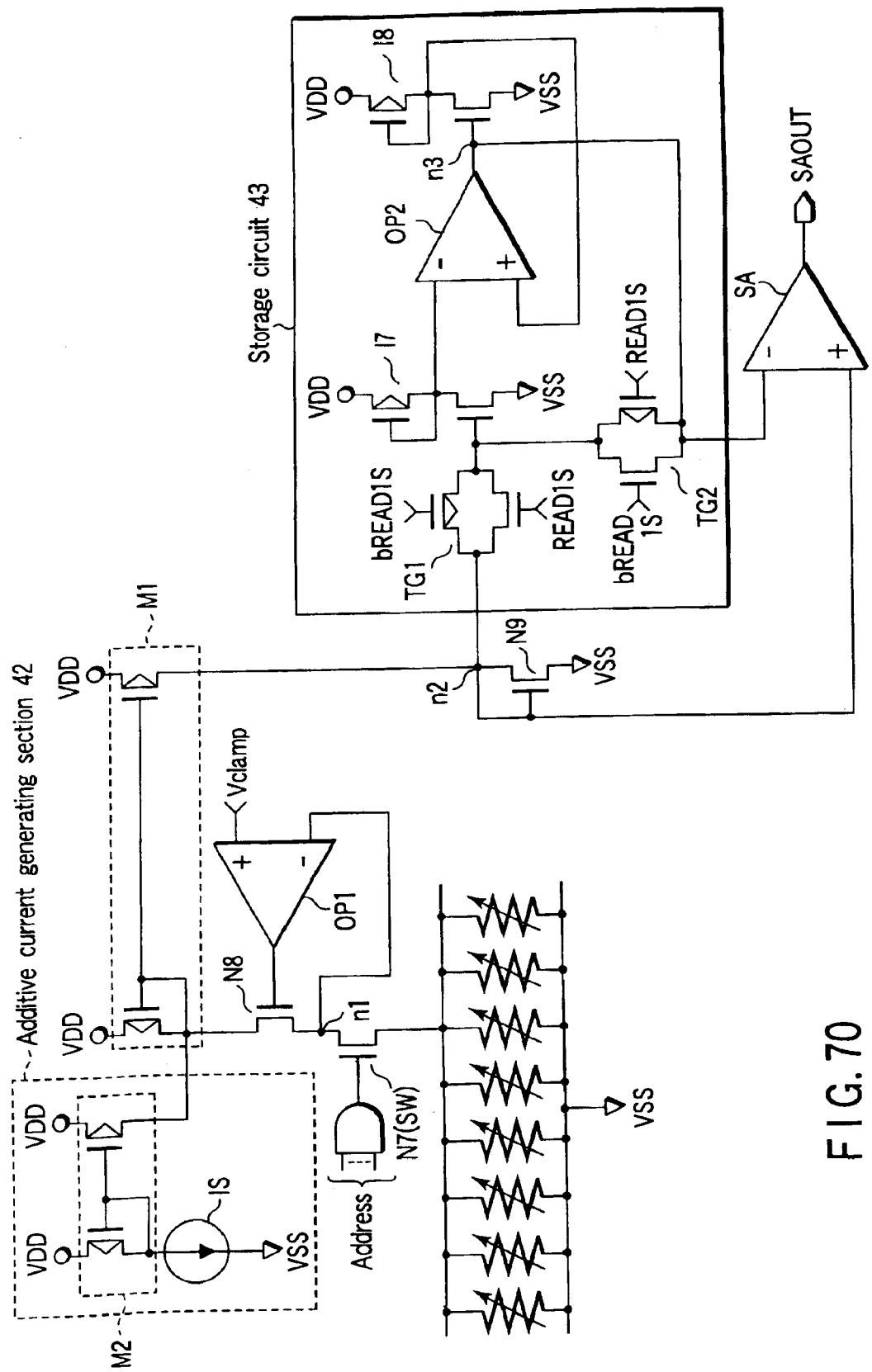
F I G. 70

MAGNETIC RANDOM ACCESS MEMORY

CROSS-REFERENCE TO RELATED APPLICATIONS

This application is a division of and claims the benefit of priority under 35 USC §120 from U.S. application Ser. No. 10/170,366, filed Jun. 14, 2002 now U.S. Pat. No. 6,804,144, and is based upon and claims the benefit of priority under 35 USC §119 from Japanese Patent Application No. 2001-350013, filed Nov. 15, 2001, the entire contents of which are incorporated herein by reference.

BACKGROUND OF THE INVENTION

1. Field of the Invention

The present invention relates to a magnetic random access memory (MRAM) which stores "1"- and "0"-data using a magnetoresistive effect.

2. Description of the Related Art

In recent years, many memories which store data by new principles have been proposed. One of them is a magnetic random access memory which stores "1"- and "0"-data using a tunneling magnetoresistive (to be referred to as TMR hereinafter) effect.

As a proposal for a magnetic random access memory, for example, Roy Scheuerlein et al, "A 10 ns Read and Write Non-Volatile Memory Array Using a Magnetic Tunnel Junction and FET Switch in each Cell", ISSCC2000 Technical Digest, p. 128 is known.

A magnetic random access memory stores "1"- and "0"-data using TMR elements. As the basic structure of a TMR element, an insulating layer (tunneling barrier) is sandwiched between two magnetic layers (ferromagnetic layers). Note that various TMR element structures have been proposed for the optimization of an MR (MagnetoResistive) ratio.

Data stored in the TMR element is determined on the basis of whether the magnetizing states of the two magnetic layers are parallel or antiparallel. "Parallel" means that the two magnetic layers have the same magnetizing direction. "Antiparallel" means that the two magnetic layers have opposite magnetizing directions.

Normally, one (fixed layer) of the two magnetic layers has an antiferromagnetic layer. The antiferromagnetic layer serves as a member for fixing the magnetizing direction of the fixed layer. In fact, data ("1" or "0") stored in the TMR element is determined by the magnetizing direction of the other (free layer) of the two magnetic layers.

When the magnetizing states in the TMR element are parallel, the tunneling resistance of the insulating layer (tunneling barrier) sandwiched between the two magnetic layers of the TMR element is minimized. For example, this state is defined as a "1"-state. When the magnetizing states in the TMR element are antiparallel, the tunneling resistance of the insulating layer (tunneling barrier) sandwiched between the two magnetic layers of the TMR element is maximized. For example, this state is defined as a "0"-state.

Write/read operation principles for TMR elements will be briefly described next.

TMR elements are arranged at the intersections of write word lines and bit lines. Write operation is performed by supplying currents to a write word line and a bit line and determining the magnetizing direction of the free layer of a TMR element using the magnetic field formed by the currents flowing in the two lines.

For example, in write operation, a current flowing only in one direction is supplied to a write word line, and a current flowing in one or the other direction is supplied to a write bit line in accordance with write data. When a current flowing in one direction is supplied to a write bit line, the magnetizing state of the TMR element placed at the intersection of the write word line and the write bit line becomes parallel ("1"-state). When a current flowing in the other direction is supplied to a write bit line, the magnetizing state of the TMR element placed at the intersection of the write word line and the write bit line becomes antiparallel ("0"-state).

Read operation is performed by supplying a read current to a selected TMR element and detecting the resistance value of the selected TMR element.

The read operation principle greatly changes depending on the array structure of a magnetic random access memory. In an array structure in which one switching element is connected in series with one TMR element, the switching element connected to a selected read word line is turned on to supply a read current to a selected TMR element. This read current is guided to a sense amplifier to read the resistance value of the selected TMR element, thereby determining the data in the TMR element.

There is one big problem with read operation.

Since a read current passes through the insulating layer (tunnel barrier) in a TMR element, the resistance value of the TMR element greatly depends on the thickness of the insulating layer. More specifically, the resistance value of the TMR element logarithmically changes with changes in the thickness of the insulating layer in the TMR element.

More specifically, the thickness of a tunnel barrier in a TMR element currently reported is about several nm. However, as variations in tunnel barrier thickness increase among a plurality of TMR elements, variations in resistance value logarithmically increase.

It is therefore difficult for a magnetic random access memory to adopt a sense scheme using reference cells like those used in a NOR type flash memory.

Assume that in a magnetic random access memory, the resistance value of a selected TMR element is compared with that of a reference cell by using a differential sense amplifier to read the data stored in the selected TMR element. In this case, the data must be prevented from being buried in noise due to variations in tunnel barrier thickness.

That is, a resistance change (the difference between the resistance value in a parallel magnetizing state and that in an antiparallel magnetizing state) $\Delta R$ determined by the MR ratio (magnetoresistive change ratio) must be sufficiently increased relative to variations in the resistance values of TMR elements and reference cells.

However, the currently feasible MR ratio is 20 to 40% in general, and about 50% at maximum. At such MR ratios, in consideration of manufacturing margin and yield in mass production, it is impossible to attain the resistance change $\Delta R$ of a TMR element large enough to prevent data from being buried in noise.

As a proposal for solving the above problem associated with read operation, a technique of storing 1-bit data in two TMR elements is known. More specifically, in this technique, correct data is stored in one of two TMR elements, opposite data is stored in the other TMR element, and the two data are compared at the time of a read. According to this technique, the resistance change $\Delta R$ based on the MR ratio can be substantially increased twice.

In this case, however, storage of 1-bit data in two TMR elements disadvantageous increases the memory capacity. In addition, this technique cannot completely eliminate the influence of variations in resistance value among a plurality of TMR elements. Depending on the magnitude of variations in resistance value among TMR elements, therefore, the resistance change ΔR of a TMR element may not be sufficiently large.

A breakthrough technique of solving the problem associated with a read, i.e., the problem associated with variations in resistance value among a plurality of TMR elements, and offering an advantage in increasing the integration degree of memory cells and increasing memory capacity has been disclosed in U.S. Ser. No. 09/961,326.

A magnetic random access memory using this technique has an array structure having a plurality of TMR elements connected in parallel with each other.

In read operation, a read current is supplied to a plurality of TMR elements connected in parallel, and the resistance value of the plurality of TMR elements is detected by a sense amplifier. Thereafter, predetermined data is written in a selected one of the plurality of TMR elements. After this operation, a read current is supplied to the plurality of TMR elements connected in parallel again, and the resistance value of the plurality of TMR elements is detected by the sense amplifier.

The resistance value of the plurality of TMR elements, detected previously, is compared with the resistance value of the plurality of TMR elements, detected afterward. If they are substantially equal, it is determined that the data in the selected TMR element is the predetermined data. If they differ from each other, it is determined that the data in the selected TMR element is data having an opposite value to that of the predetermined data.

According to this read operation principle, the resistance value (or MR ratio) of a selected TMR element can be accurately read regardless of variations in resistance value among a plurality of TMR elements in read operation. The feasibility of a magnetic random access memory using this read operation principle is therefore high.

In this read operation principle, the data stored in a selected TMR element may be destroyed (destructive read) at the time of read operation. After the data value in the selected TMR element is determined, therefore, data must be rewritten in the TMR element.

Although the technique disclosed in U.S. Ser. No. 09/961, 326 is very effective as described above, no specific proposals of a write circuit such as a write driver and a read circuit such as a sense amplifier have been made. In addition, the array structure of a magnetic random access memory and the read operation principle need to be further improved to increase the feasibility.

BRIEF SUMMARY OF THE INVENTION (1) According to an aspect of the present invention, there is provided a read method of a magnetic random access memory having a memory cell which stores data using a magnetoresistive effect, comprising supplying a first read current to the memory cell, supplying a second read current to the memory cell at the same time of or in parallel with writing of write data having a predetermined value in the memory cell, and detecting a difference or a change between the first and second read currents and determining data of the memory cell.

(2) According to a first aspect of the present invention, there is provided a magnetic random access memory comprising a plurality of memory cells which are connected in parallel with each other and store data by using a magnetoresistive effect, a bit line which is connected to one terminal of each of the plurality of memory cells and extends in a first direction, first and second write bit line drivers/sinkers which supply a write current to the bit line or absorb the write current from the bit line, a first switch connected between one end of the bit line and the first write bit line driver/sinker, a second switch connected between the other end of the bit line and the second write bit line driver/sinker, a read circuit which supplies a read current to the bit line, and a plurality of write word lines extending in a second direction perpendicular to the first direction.

According to a second aspect of the present invention, there is provided a magnetic random access memory comprising a memory cell which stores data by using a magnetoresistive effect, a current source which supplies a read current to the memory cell, a storage circuit which stores the read current or a current proportional to the read current, and a sense amplifier which determines data in the memory cell on the basis of the read current or the current proportional to the read current and the current stored in the storage circuit.

BRIEF DESCRIPTION OF THE SEVERAL VIEWS OF THE DRAWING

FIG. 34 is a view showing a magnetic random access memory according to Improved Example 5 of the present invention;

FIG. 35 is a view showing a one-column portion of the memory in FIG. 34;

FIG. 36 is a view showing a magnetic random access memory according to Improved Example 6 of the present invention;

FIG. 44 is a view showing Circuit Example 3 of the read circuit;

FIG. 49 is a view showing an example of an operational amplifier in a read circuit;

FIG. 50 is a view showing another example of the operational amplifier in a read circuit;

FIG. 51 is a view showing Circuit Example 4 of a read circuit;

FIG. 52 is a view showing an example of a BGR circuit;

FIG. 55 is a view showing an example of a counter trigger circuit;

FIG. 56 is a view showing part of a counter driving circuit;

FIG. 57 is a view showing part of a counter driving circuit;

FIG. 67 is a view showing Circuit Example 5 of a read circuit;

FIG. 68A is a view showing an example of an inductance element;

FIG. 68B is a view showing an example of a cross-sectional view of an inductance element;

FIG. 68C is a view showing an example of a cross-sectional view of an inductance element;

FIG. 70 is a view showing Circuit Example 6 of a read circuit;

DETAILED DESCRIPTION OF THE INVENTION

A magnetic random access memory of an aspect of the present invention will be described below in detail with reference to the accompanying drawings.

1. REFERENCE EXAMPLE

Figure 1:
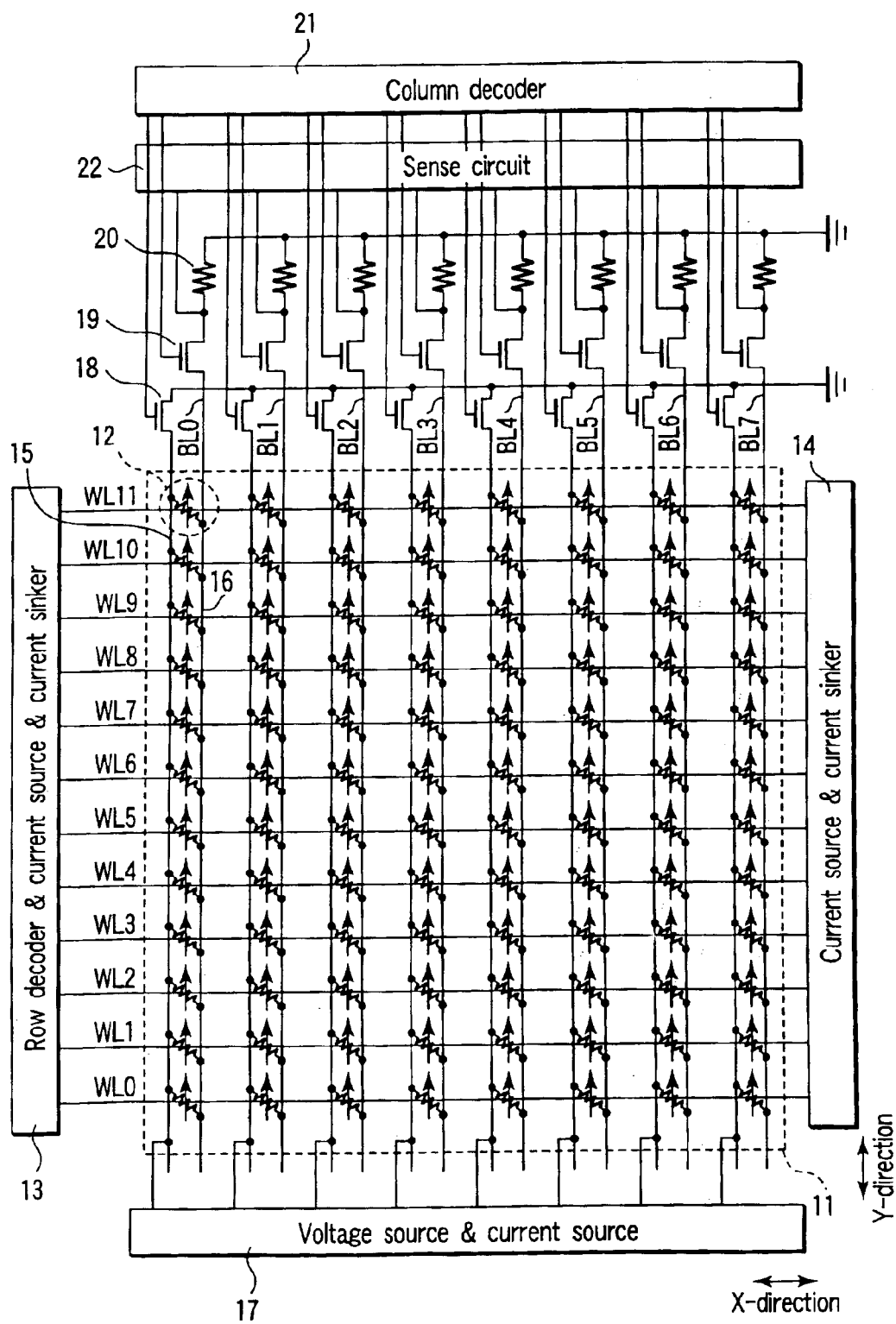
FIG. 1 is a view showing a magnetic random access memory according to a reference example of the present invention.

FIG. 1 shows the main part of a magnetic random access memory as a reference example of the present invention.

A memory cell array 11 has a plurality of TMR elements 12 arranged in the form of an array in the X- and Y-directions. Word lines WL0, WL1, . . . , WL11 extending in the X-direction are arranged near the TMR elements 12 arranged in the X-direction. One end of each of the word lines WL0, WL1, . . . , WL11 is connected to a circuit block 13 including a row decoder, current source, and current sinker. The other of each of these word lines is connected to a circuit block 14 including a current source and current sinker.

A current sinker is a circuit for absorbing the current generated by a current source.

The TMR elements 12 arranged in the Y-direction are connected in parallel between a first data transfer line 15 and a second data transfer line 16. One end of the first data transfer line 15 is connected to a circuit block 17 including a voltage source and current source. The other end of this transfer line is connected to a ground current via a write select switch (MOS transistor) 18. One end of the second data transfer line 16 is connected to ground terminal via a read select switch (MOS transistor) 19 and sense resistor 20.

A column decoder 21 is connected to the gates of the write/read select switches 18 and 19. A sense circuit 22 is connected to the two terminals of the sense resistor 20 to detect the voltage between the two terminals of the sense resistor 20.

The read operation principle of the magnet random access memory in FIG. 1 will be described next with reference to the timing chart of FIG. 2.

The read operation described below is constituted by four cycles.

① In the first cycle, initial data is read. In this case, the initial data indicates reference data required to determine the value of data in a selected TMR element.

First of all, the read select switch 19 connected to the selected column including the selected TMR element 12 is turned on. A column is a group of TMR elements arranged in the Y-direction and connected in parallel with each other. As a consequence, the read current generated by the current source in the circuit block 17 flows to a ground terminal via the plurality of TMR elements 12 and sense resistor 20 of the selected column.

While a read current is flowing, the voltage generated between the two ends of the sense resistor 20 depends on the combined resistance of the plurality of TMR elements 12 which constitute the selected column and are connected in parallel with each other. If, therefore, the voltage generated between the two terminals of the sense resistor 20 is detected by using the sense circuit 22, initial data can be detected. The initial data is stored in the sense circuit 22.

Thereafter, the read select switch 19 is turned off.

② In the second cycle, trial data is written in the selected TMR element 12. In this case, the trial data is data which has a predetermined value and is written in a selected TMR element to obtain comparison data to be compared with reference data. More specifically, the trial data is "1" or "0".

First of all, the write select switch 18 connected to the selected column including the selected TMR element 12 is turned on. As a consequence, the write current generated by the current source in the circuit block 17 flows to the ground terminal via the first data transfer line 15 and write select switch 18 of the selected column.

In addition, a write current flows to a write word line placed near the selected row including the selected TMR element 12. The direction of the write current flowing to the write word line is determined by the value of trial data. Note that a row is a group of TMR elements 12 arranged in the X-direction.

As a consequence, the trail data ("1" or "0") is written in the selected TMR element 12. Thereafter, the write select switch 18 is turned off to block the write current flowing to the first data transfer line 15. In addition, the write current flowing to the write word line placed near the selected row is also blocked.

③ In the third cycle, comparison data is read. In this case, comparison data indicates data that is compared with reference data to determine the value of the data in the selected TMR element.

First of all, the read select switch 19 connected to the selected column including the selected TMR element 12 is turned on. As a consequence, the read current generated by the current source in the circuit block 17 flows to the ground terminal via the plurality of TMR elements 12 and sense resistor 20 of the selected column.

While the read current is flowing, the voltage generated between the two terminals of the sense resistor 20 depends on the combined resistance of the plurality of parallel-connected TMR elements constituting the selected column. If, therefore, the voltage generated between the two terminals of the sense resistor 20 is detected by using the sense circuit 22, comparison data can be detected.

The sense circuit 22 then compares the initial data with the comparison data to determine the value of the data in the selected TMR element 12.

More specifically, if it is determined that the initial data coincides with the comparison, since it indicates that the resistance value of the selected TMR element 12 has not changed upon writing of the trial data, it is determined that the value of the data in the selected TMR element 12 is equal to that value of the trial data.

If it is determined that initial data differs from the comparison data, since it indicates that the resistance value of the selected TMR element 12 has changed upon writing of the trial data, it is determined that the data in the selected TMR element 12 has an opposite value to that of the trial data.

Assume that the trial data is "1". In this case, if the initial data coincides with the comparison data, the data in the selected TMR element 12 is determined as "1". If the initial data differs from the comparison data, the data in the selected TMR element 12 is determined as "0".

Assume that the trial data is "0". In this case, if the initial data coincides with the comparison data, the data in the selected TMR element 12 is determined as "0". If the initial data differs from the comparison data, the data in the selected TMR element 12 is determined as "1".

In this manner, the value of the data in the selected TMR element 12 is determined.

Subsequently, the read select switch 19 is turned off.

④ In the fourth cycle, data is rewritten in the selected TMR element 12.

According to the read operation principle of this embodiment, in the second cycle, the trial data is written in a selected TMR element. At this time, the data in the selected TMR element is destroyed (destructive read).

After the value of the data in the selected TMR element is determined, data, must be rewritten in the selected TMR element 12.

First of all, the write select switch 18 connected to the selected column including the selected TMR element 12 is turned on. As a consequence, the write current generated by the current source in the circuit block 17 flows to the ground terminal via the first data transfer line 15 and write select switch 18 of the selected column.

In addition, a write current flows to the write word line placed near the selected row including the selected TMR element 12. The direction of the write current flowing to the write word line is determined by the value of the data in the selected TMR element which is determined in the third cycle.

As a consequence, the original correct data is written in the selected TMR element 12. Thereafter, the write select switch 18 is turned off to block the write current flowing to the first data transfer line 15. In addition, the write current flowing to the write word line located near the selected row is also blocked.

As described above, the magnetic random access memory according to the reference example uses the so-called destructive read operation principle. The resistance value (or MR ratio) of a selected TMR element can be accurately read regardless of variations in resistance among a plurality of TMR elements in read operation.

2. IMPROVED EXAMPLE

In the reference example, the destructive read operation principle and an example of the magnetic random access memory to which this principle is applied have been described.

An improved magnetic random access memory to which the destructive read operation principle can be applied and an improved destructive read operation principle will be described in detail below.

(1) Improved Example 1

Figure 3:
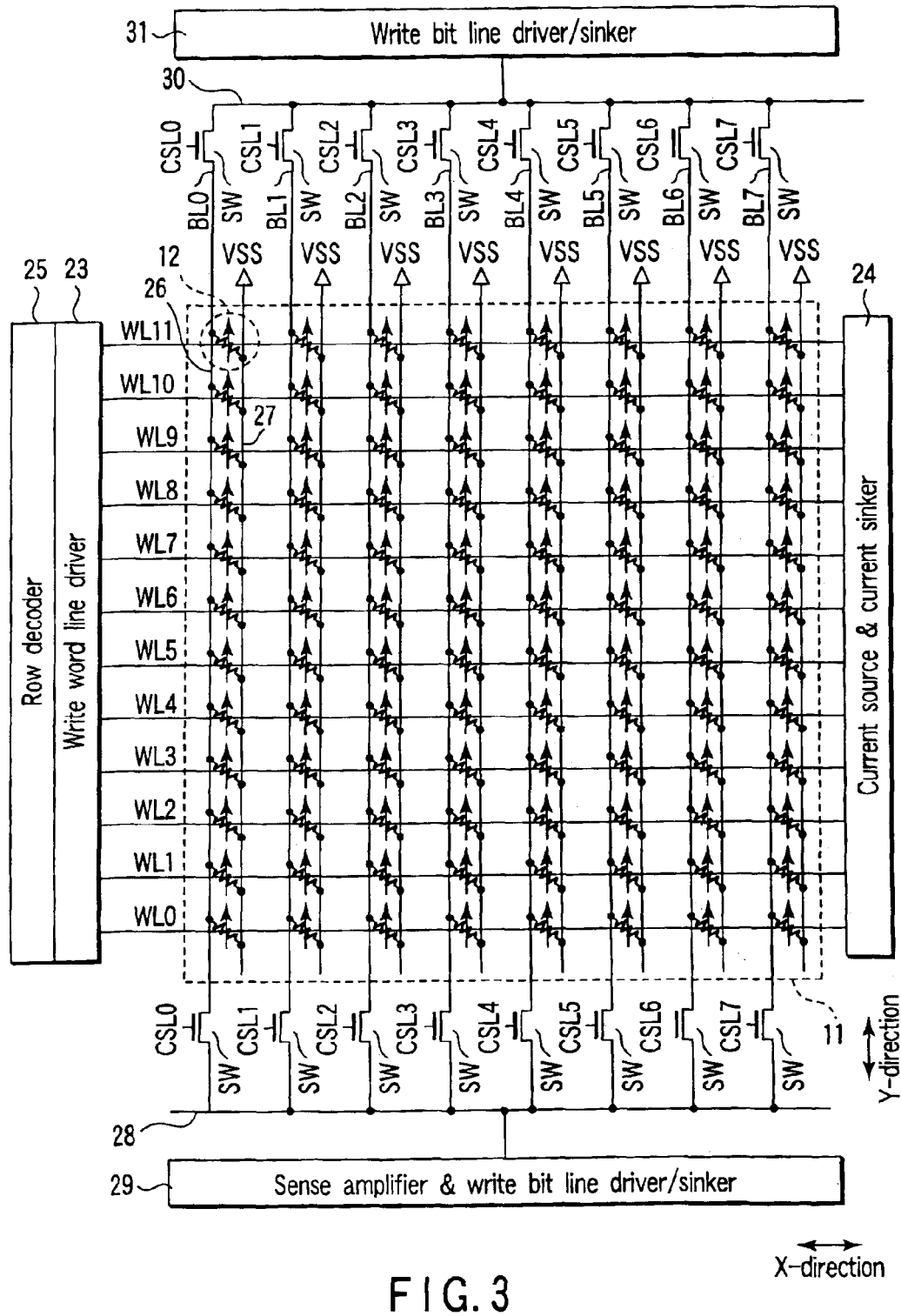
FIG. 3 is a view showing a magnetic random access memory according to Improved Example 1 of the present invention.
Figure 4:
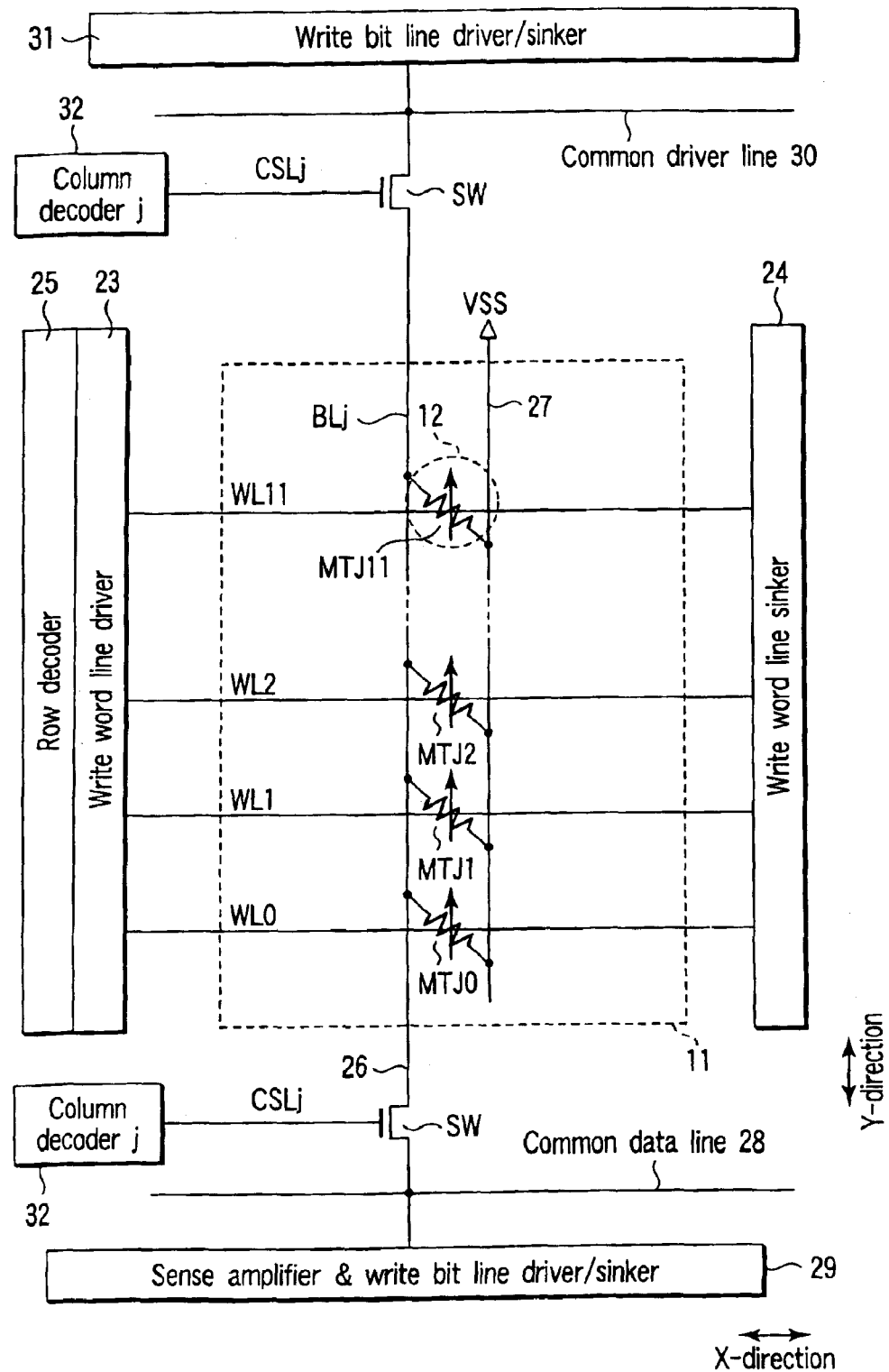
FIG. 4 is a view showing a one-column portion of the memory in FIG. 3.

FIG. 3 shows the main part of a magnetic random access memory as Improved Example 1 of the present invention. FIG. 4 shows only one column of the magnetic random access memory in FIG. 3.

The magnetic random access memory according to Improved Example 1 has the same array structure as that of the reference example. As compared with the reference example, Improved Example 1 is characterized by a peripheral circuit for write/read operation.

A memory cell array 11 has a plurality of TMR elements 12 arranged in the form of an array in the X- and Y-direction. A plurality of (12 in this example) word lines WL0, WL1, . . . , WL11 extending in the X-direction are arranged near the TMR elements 12 arranged in the X-direction. One end of each of the word lines WL0, WL1, . . . , WL11 is connected to a write word line driver 23. The other end of each of these write word lines is connected to a write word line sinker 24.

In write operation, a row decoder 25 selects one of the word lines WL0, WL1, . . . , WL11 on the basis of a row address signal. The write word line driver 23 supplies a write current to the selected write word line. The write current flows through the selected word line and is absorbed by the write word line sinker 24.

The TMR elements 12 arranged in the Y-direction are connected in parallel between a first data transfer line (bit line) 26 and a second data transfer line 27.

One end of the first data transfer line 26 is connected to a common data line 28 via a column select switch (MOS transistor) SW. The common data line 28 is connected to a circuit block 29 including a read circuit (including a sense amplifier), write bit line driver, and write bit line sinker.

The other end of the first data transfer line 26 is connected to a common driver line 30 via a column select switch (MOS transistor) SW. The common driver line 30 is connected to a circuit block 31 including a write bit line driver and write bit line sinker.

Column select signals CSL0, CSL1, . . ., CSL7 are input to the column select switch SW. Column decoders 32 are arranged in correspondence with the column select switches SW and output the column select signals CSL0, CSL1, . . . , CSL7. The second data transfer line 27 is connected to a ground terminal.

In the magnetic random access memory according to this example, in write operation, a write current flows through a selected write word line from the write word line driver 23 to the write word line sinker 24. In addition, a write current flows through the first data transfer line (bit line) in the selected column. The direction of the write current flowing through the first data transfer line changes in accordance with the value of write data.

In read operation, in a selected column, a read current flows from the circuit block 29 to the ground terminal via the first data transfer line, the plurality of TMR elements, and the second data transfer line. The sense amplifier in the circuit block 29 detects read data corresponding to the combined resistance of the plurality of TMR elements while the read current flows.

The principle of read operation using the magnetic random access memory according to this example will be described in detail later.

(2) Improved Example 2

Figure 5:
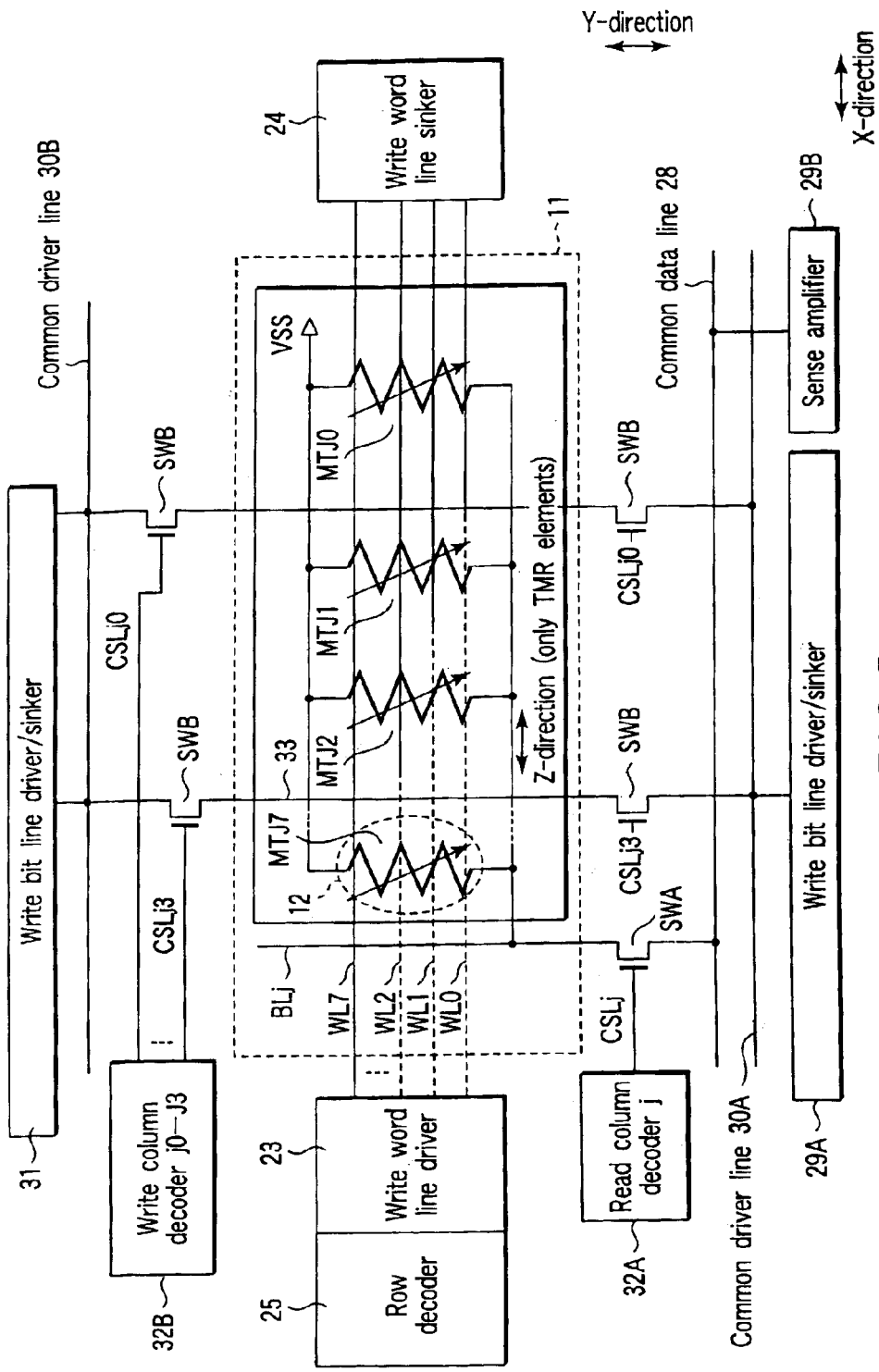
FIG. 5 is a view showing a one-column portion of a memory according to Improved Example 2 of the present invention.

FIG. 5 shows the main part of a magnetic random access memory according to Improved Example 2 of the present invention. FIG. 5 shows only one column of a memory cell array in correspondence with FIG. 4.

As compared with Improved Example 1, the magnetic random access memory according to Improved Example 2 is characterized in the arrangement of TMR elements corresponding to one column. In Improved Example 1, the TMR elements in one column are arrayed in a line in the Y-direction. In Improved Example 2, however, the TMR elements in one column are arranged in a line in the Z-direction.

In this case, the Z-direction is a direction which is perpendicular to the X- and Y-directions and vertical to the drawing surface. That is, the TMR elements in FIG. 5 are stacked on each other in a direction vertical to the drawing surface.

A memory cell array 11 has a plurality of TMR elements 12 arranged in the form of an array in the X- and Z-directions. In this example, eight TMR elements 12 are stacked in the Z-direction. A plurality of (eight in this example) write word lines WL0, WL1, . . . , WL7 which extend in the X-direction and are stacked in the Z-direction are arranged near the TMR elements 12.

For example, the write word line WL0 is placed near the TMR elements (MTJ (Magnetic Tunnel Junction) 0) arranged at the first stage (lowermost stage). The write word line WL1 is placed near the TMR elements (MTJ1) arranged at the second stage. The write word line WL7 is placed near the TMR elements (MTJ7) arranged at the eighth stage (uppermost stage).

One of each of the write word lines WL0, WL1, . . . , WL7 is connected to a write word line driver 23. The other end of each of these lines is connected to a write word line sinker 24.

In write operation, a row decoder 25 selects one of the write word lines WL0, WL1, ..., WL7 on the basis of a row address signal. The write word line driver 23 supplies a write current to the selected write word line. The write current flows through the selected write word line and is absorbed by the write word line sinker 24.

The TMR elements 12 arranged in the Z-direction are connected in parallel with each other. One terminal of the TMR element 12 is connected to a first data transfer line (bit line BLi) 26. The other terminal of the TMR element is connected to a ground terminal.

One end of the first data transfer line 26 is connected to a common data line 28 via a column select switch (MOS transistor) SWA. The common data line 28 is connected to a read circuit (including a sense amplifier) 29B.

In the magnetic random access memory according to this example, write lines 33 which extend in the Y-direction and are used only for write operation are newly arranged in the memory cell array 11. For example, eight such write lines 33 may be arranged in correspondence with the eight TMR elements 12 in the Z-direction. In this example, however, one write line 33 corresponds to two TMR elements. That is, the four write lines 33 are arranged in one column.

One end of each write line 33 is connected to a common driver line 30A via a column select switch (MOS transistor) SWB. The common driver line 30A is connected to a circuit block 29A including a write bit line driver and write bit line sinker.

The other end of the write line 33 is connected to a common driver line 30B via the column select switch (MOS transistor) SWB. The common driver line 30B is connected to a circuit block 31 including a write bit line driver and write bit line sinker.

A column select signal CSLj (j=0, 1, ..., 7) is input to the gate of the column select switch SWA. A read column decoder 32A is provided for each column select switch SWA and outputs the column select signal CSLj.

A column select line signal CSLjk (j=0, 1, ... 7; k=0, 1, 2, 3) is input to the gate of the column select switch SWB. A write column decoder 32B is provided for each column select switch SWB and outputs the column select line signal CSLjk.

In the magnetic random access memory according to this example, a plurality of TMR elements (memory cells) constituting one column are not arranged in the horizontal direction (Y-direction), i.e., a direction parallel to the surface of the semiconductor substrate, but are arranged in the vertical direction (Z-direction), i.e., a direction vertical to the surface of the semiconductor substrate.

As compared with Improved Example 1, Improved Example 2 has an array structure suitable for high integration of TMR elements (memory cells).

(3) Examples of Peripheral Circuits in Improved Examples 1 and 2

① Write Word Line Driver/Sinker

Circuit examples of the write word line driver 23 and write word line sinker 24 in Improved Examples 1 and 2 (FIGS. 3, 4, and 5) will be described first.

The same write word line driver 23 and the same write word line sinker 24 can be used in Improved Examples 1 and 2.

Figure 6:
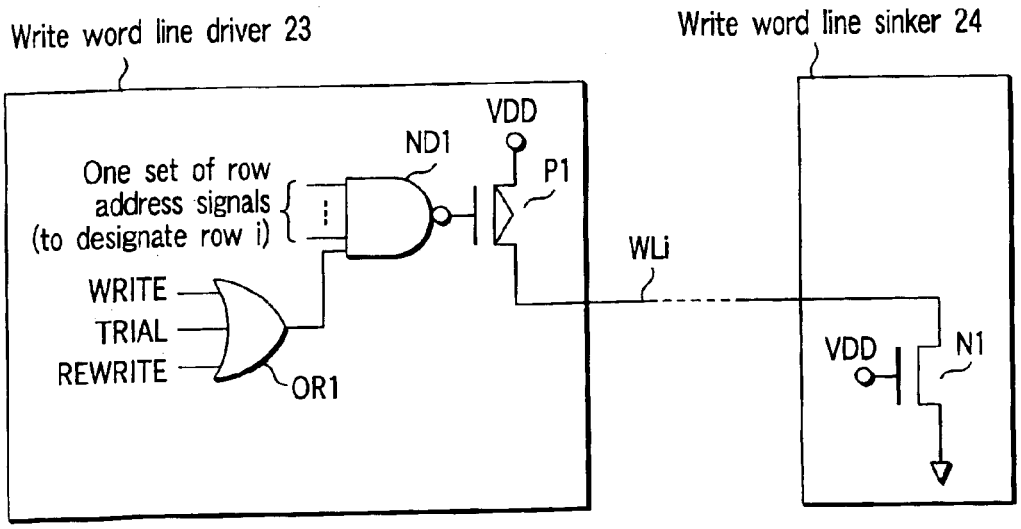
FIG. 6 is a view showing a write word line driver/sinker.

FIG. 6 shows an example of the write word line driver/sinker.

The write word line driver 23 is comprised of an OR circuit OR1, NAND circuit ND1, and PMOS transistor P1. The write word line sinker 24 is formed from an NMOS transistor N1. A power supply potential VDD is input to the gate of the NMOS transistor N1.

A write signal WRITE, trial signal TRIAL, and rewrite signal REWRITE are input to the OR circuit OR1.

The write signal WRITE is a signal that is set "H (High)" at the time of normal write operation for a selected TMR element. The trial signal TRIAL is a signal that is set at "H" when so-called trial data is written in a selected TMR element at the time of read operation (destructive read operation). The rewrite signal REWRITE is a signal that is set at "H" when correct data is written in a selected TMR element at the time of read operation (destructive read operation).

When one of these three signals WRITE, TRIAL, and REWRITE is set at "H", an output signal from the OR circuit OR1 is set at "H".

The output signal from the OR circuit OR1 and a row address signal (row i) are input to the NAND circuit ND1. When the row i is (write word line WLi) is to be selected, all the bits of the row address signal (row i) are set at "H". If, therefore, the row i is selected and one of the three signals WRITE, TRIAL, and REWRITE is at "H", an output signal from the NAND circuit ND1 is set at "L".

When the output signal from the NAND circuit ND1 is set at "L", the PMOS transistor P1 is turned on. As a consequence, a write current flows from the power supply potential VDD to the write word line sinker 24 via the write word line WLi.

Note that since at least one bit of the row address signal is set at "L (Low)", no current flows through the write word lines existing in the rows other than the row i.

② Column Decoder

A circuit example of the column decoder 32 in Improved Example 1 (FIGS. 3 and 4) will be described below.

Figure 7:
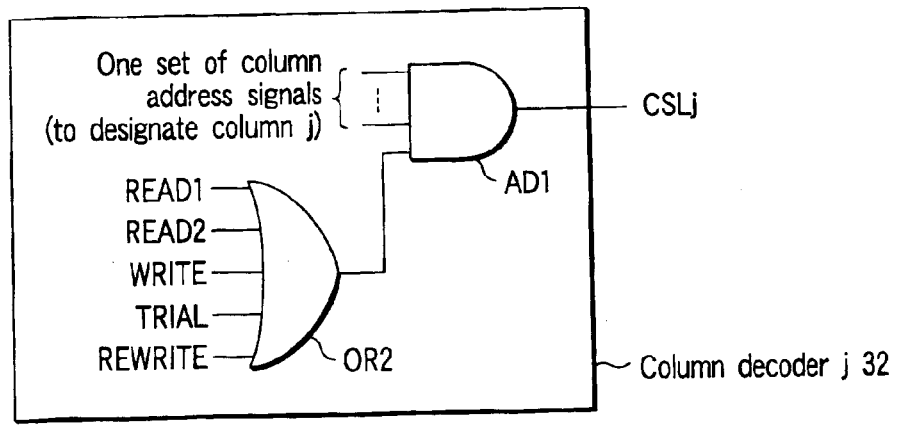
FIG. 7 is a view showing an example of a column decoder.

FIG. 7 shows an example of the column decoder.

The column decoder 32 is comprised of an OR circuit OR2 and AND circuit AD1. Read signals READ1 and READ2, write signal WRITE, trial signal TRIAL, and rewrite signal REWRITE are input to the OR circuit OR2.

The write signal WRITE, trial signal TRIAL, and rewrite signal REWRITE are identical to the write signal WRITE, trial signal TRIAL, and rewrite signal REWRITE input to the write word line driver 23 in FIG. 6.

The read signals READ1 and READ2 are signals that are set at "H" when the value of the combined resistance of a plurality of TMR elements constituting a selected column is read at the time of read operation (destructive read operation). For example, as described above, according to the normal destructive read operation principle, read operation needs to be performed twice (the first and second cycles in FIG. 2). The read signal READ1 is set at "H" in the first cycle, whereas the read signal READ2 is set at "H" in the third cycle.

When one of these five signals READ1, READ2, WRITE, TRIAL, and REWRITE is set at "H", an output signal from the OR circuit OR2 is set at "H".

The output signal from the OR circuit OR2 and a column address signal (to designate a column j) are input to the AND circuit AD1. When the column j (bit line BLj) is to be selected, all the bits of the column address signal (to designate the column j) are set at "H". If, therefore, the column j is selected and one of the five signals READ1, READ2, WRITE, TRIAL, and REWRITE is set at "H", an output signal from the AND circuit AD1 is set at "H".

When the output signal from the AND circuit AD1 is set at "H", a column select switch (NMOS transistor) SW is turned on. As a consequence, in write operation, a write current flows through the bit line BLj, whereas in read operation, a read current flows to a plurality of TMR elements.

Figure 8:
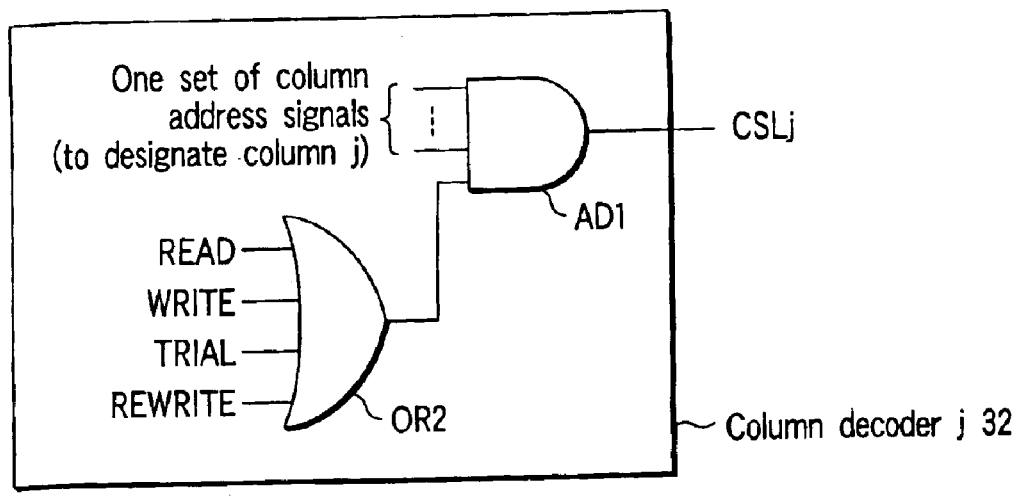
FIG. 8 is a view showing another example of the column decoder.

FIG. 8 shows another example of the column decode.

As compared with the column decoder 32 in FIG. 7, a column decoder 32 in FIG. 8 is characterized in that a read signal READ is added in place of the read signals READ1 and READ2.

Figure 2:
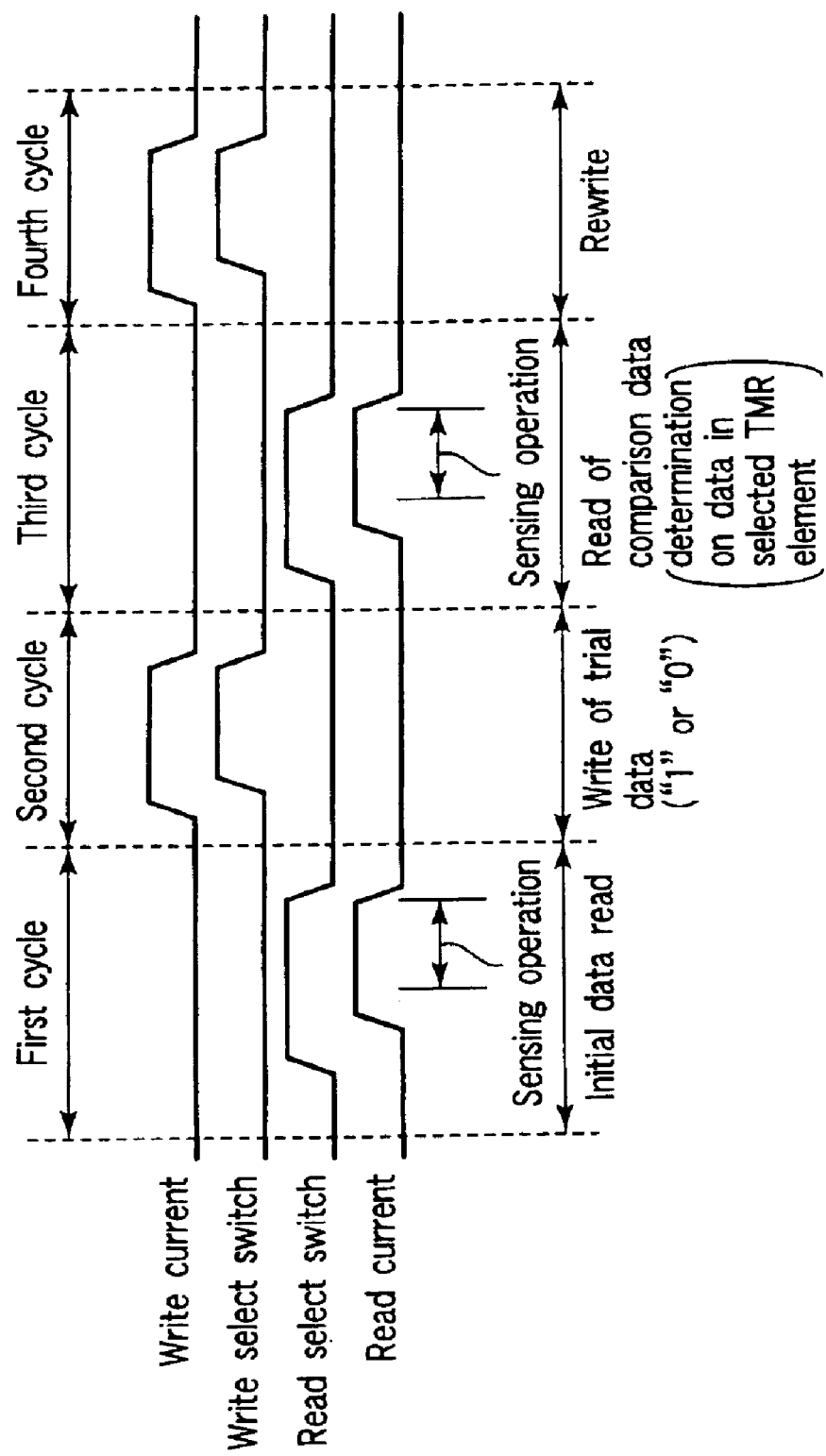
FIG. 2 is a timing chart showing a destructive read operation principle according to the reference example of the present invention.

This column decoder 32 is used when a new destructive read operation principle improved from the destructive read operation principle described with reference to FIG. 2 is applied to a magnetic random access memory.

This new destructive read operation principle will be described in detail later. A characteristic feature of the principle will be briefly described here. According to this destructive read operation principle, the second and third cycles in FIG. 2 are integrated into one cycle.

For example, therefore, the read signal READ that is set at "H" in the first cycle in FIG. 2 is input to the column decoder 32 in place of the two read signals READ1 and READ2.

③ Read/Write Column Decoder

Circuit examples of the read/write column decoders 32A and 32B in Improved Example 2 (FIG. 5) will be described below.

Figure 9:
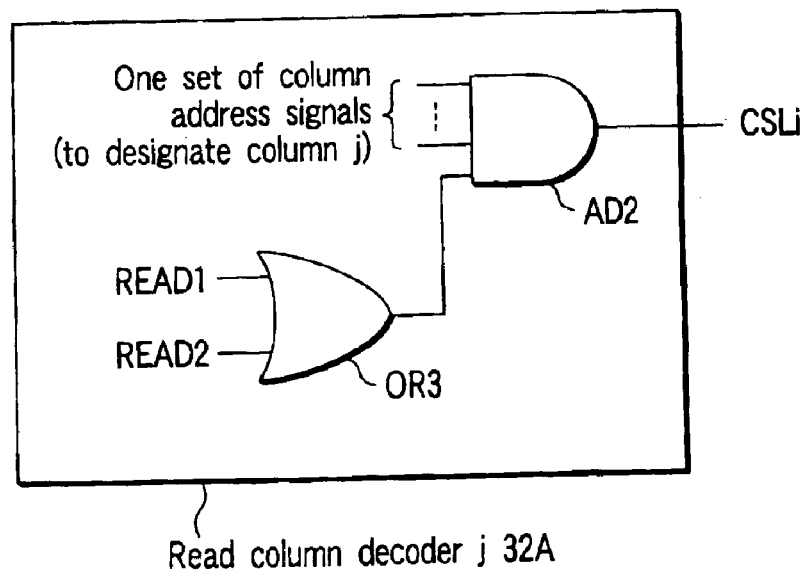
FIG. 9 is a view showing an example of a read column decoder.

FIG. 9 shows an example of the read column decoder.

The read column decoder 32A is comprised of an OR circuit OR3 and AND circuit AD2. Read signals READ1 and READ2 are input to the OR circuit OR3.

The read signals READ1 and READ2 are signals that are set at "H" when the value of the combined resistance of a plurality of TMR elements constituting a selected column is read at the time of read operation (destructive read operation). For example, as described above, according to the normal destructive read operation principle, read operation needs to be performed twice (the first and second cycles in FIG. 2). That is, the read signal READ1 is set at "H" in the first cycle, whereas the read signal READ2 is set at "H" in the third cycle.

When one of the two signals READ1 and READ2 is set at "H", an output signal from the OR circuit OR3 is set at "H".

The output signal from the OR circuit OR3 and a column address signal (to designate a column j) are input to the AND circuit AD2. When the column j (bit line BLj) is to be selected, all the bits of the column address signal (to designate the column j) are set at "H". If, therefore, the column j is selected and one of the two signals READ1 and READ2 is at "H", an output signal from the AND circuit AD2 is set at "H".

When the output signal from the AND circuit AD2 is set at "H", a column select switch (NMOS transistor) SWA in FIG. 5 is turned on. As a consequence, in read operation, a read current flows to a plurality of TMR elements.

Figure 10:
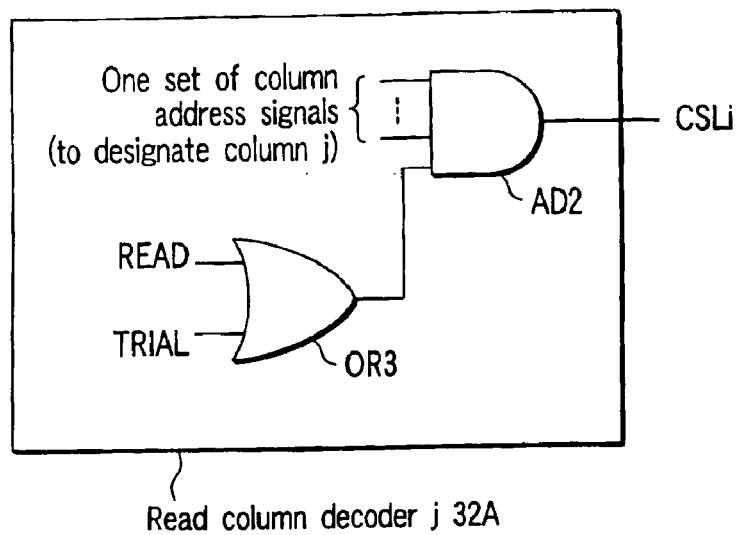
FIG. 10 is a view showing another example of the read column decoder.

FIG. 10 shows another example of the read column decoder.

As compared with the read column decoder 32A in FIG. 9, a read column decoder 32A in FIG. 10 is characterized in that a read signal READ and trial signal TRIAL are added in place of the read signals READ1 and READ2.

This read column decoder 32A is used when the new destructive read operation principle improved from the destructive read operation principle described with reference FIG. 2 is applied to a magnetic random access memory.

This new destructive read operation principle will be described in detail later. A characteristic feature of the principle will be briefly described here. According to this destructive read operation principle, the second and third cycles in FIG. 2 are integrated into one cycle.

For example, therefore, the read signal READ that is set at "H" in the first cycle in FIG. 2 and the trial signal TRIAL that is set at "H" in the second cycle are input to the column decoder 32 in place of the two read signals READ1 and READ2.

Figure 11:
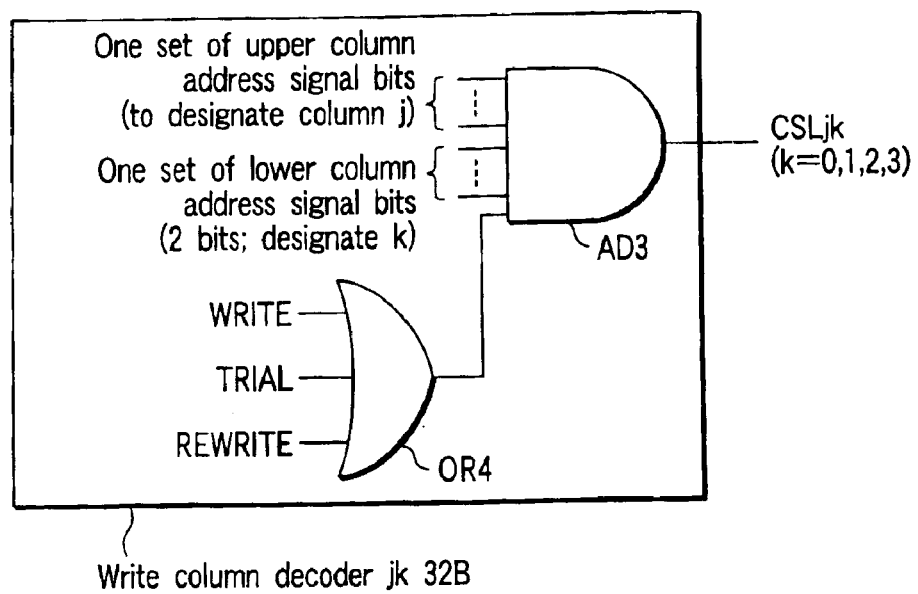
FIG. 11 is a view showing an example of a write column decoder.

FIG. 11 shows an example of the write column decoder.

The write column decoder 32B is comprised of an OR circuit OR4 and AND circuit AD3. The write signal WRITE, trial signal TRIAL, and rewrite signal REWRITE are input to the OR circuit OR4.

The write signal WRITE, trial signal TRIAL, and rewrite signal REWRITE are identical to the write signal WRITE, trial signal TRIAL, and rewrite signal REWRITE input to the write word line driver 23 in FIG. 6.

When one of these three write signal WRITE, trial signal TRIAL, and rewrite signal REWRITE is set at "H", an output signal from the OR circuit OR4 is set at "H".

The output signal from the OR circuit OR4 and a column address signal (to designate a column j) are input to the AND circuit AD3. The column address signal is formed from an upper column address signal and lower column address signal.

The upper column address signal selects one column. The lower column address signal is used to select a plurality of TMR elements which are present in the selected column and stacked in the Z-direction. In the example shown in FIG. 5, eight TMR elements are stacked on each other in the Z-direction, and four write lines 33 are provided to select them. For this reason, the lower column address signal is a 2-bit signal.

When the TMR elements at the (k+1)th stage in the column j are selected by a column address signal and one of the three signals WRITE, TRIAL, and REWRITE is at "H", an output signal from the AND circuit AD3 is set at "H".

When the output signal from the AND circuit AD3 is set at "H", i.e., a column select line signal CSLjk is set at "H", a column select switch (NMOS transistor) SWB in FIG. 5 is turned on. As a consequence, in write operation, a write current flows through one of the write lines 33 in FIG. 5.

Note that the write column decoder in FIG. 11 can also be used when either the normal destructive read operation principle or the new destructive read operation principle is applied to a magnetic random access memory.

④ Write Bit Line Driver/Sinker

Circuit examples of the write bit line drivers/sinkers 29 and 31 in Improved Examples 1 and 2 (FIGS. 3, 4, and 5) will be described below.

The same write bit line driver/sinker 29 and 31 can be used in Improved Examples 1 and 2.

Figure 12:
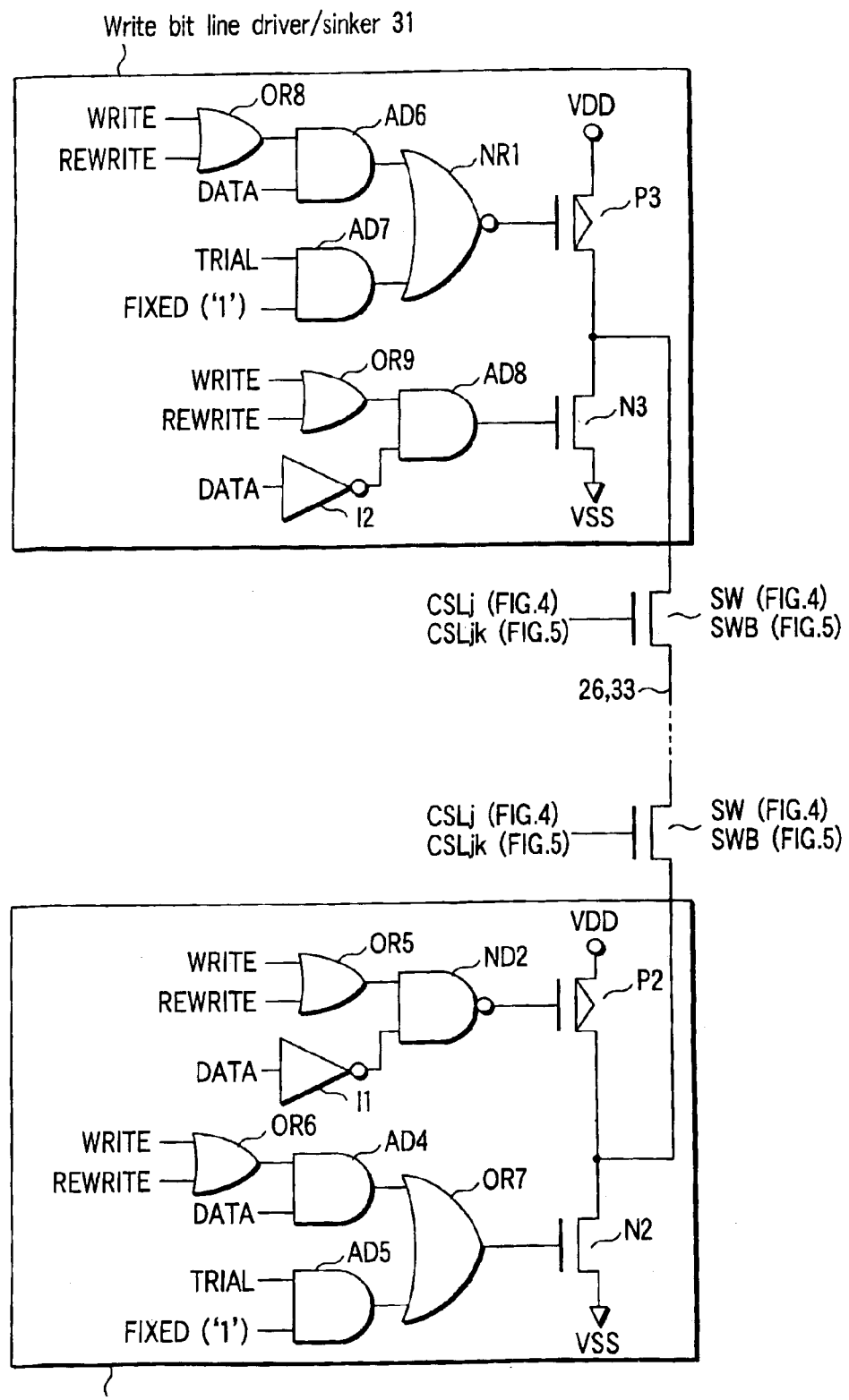
FIG. 12 is a view showing an example of a write bit line driver/sinker.

A. FIG. 12 shows an example of the write bit line driver/sinker.

The write bit line driver/sinker in this example corresponds to a case where so-called trial data to be written in a selected TMR element in the second cycle in the destructive read operation principle (see, for example, FIG. 2) is "1".

a. Write Bit Line Driver/Sinker 29

The write bit line driver/sinker 29 is comprised of OR circuits OR5, OR6, and OR7, AND circuits AD4 and AD5, NAND circuit ND2, inverter circuit I1, PMOS transistor P2, and NMOS transistor N2.

The write bit line driver is comprised of the OR circuit OR5, NAND circuit ND2, inverter circuit I1, and PMOS transistor P2. A write signal WRITE and rewrite signal REWRITE are input to the OR circuit OR5.

The write signal WRITE is a signal that is set at "H" at the time of normal write operation for a selected TMR element. The rewrite signal REWRITE is a signal that is set at "H" when correct data is to be rewritten in a selected TMR element after read operation (destructive read operation).

When one of the two signals WRITE and REWRITE is set at "H", an output signal from the OR circuit OR5 is set at "H".

Write data DATA is input to the inverter circuit I1. In this case, write data means normal write data (including rewrite data) excluding trial data.

Output signals from the OR circuit OR5 and inverter circuit I1 are input to the NAND circuit ND2. Assume that the output signal from the OR circuit OR5 is at "H". In this case, if the data DATA is "1", since the output signal from the inverter circuit I1 is set at "L", an output signal from the NAND circuit ND2 is set at "H". If the data DATA is "0", since the output signal from the inverter circuit I1 is set at "H", the output signal from the NAND circuit ND2 is set at "L".

Note that "1" and "0" respectively correspond to "H" and "L".

If the output signal from the NAND circuit ND2 is at "H", the PMOS transistor P2 is turned off. If the output signal from the NAND circuit ND2 is at "L", the PMOS transistor P2 is turned on.

The write bit line sinker is comprised of the OR circuits OR6 and OR7, AND circuits AD4 and AD5, and NMOS transistor N2. The write signal WRITE and rewrite signal REWRITE are input to the OR circuit OR6. When one of these two signals WRITE and REWRITE is set at "H", an output signal from the OR circuit OR6 is set at "H".

The output signal from the OR circuit OR6 and data DATA are input to the AND circuit AD4.

Assume that the output signal from the OR circuit OR6 is at "H". In this case, if the data DATA is "1", an output signal from the AND circuit AD4 is set at "H". If the data DATA is "0", the output signal from the AND circuit AD4 is set at "L".

The trial signal TRIAL is input to the AND circuit AD5. The trial signal TRIAL is a signal that is set at "H" when trial data is to be written in a selected TMR element at the time of read operation (destructive read operation). The AND circuit AD5 has two input terminals. The trial signal TRIAL is input to one of the input terminals, while the other terminal is always fixed to "1".

The output signal from the OR circuit OR7 is set at "H" when one of output signals from the two AND circuits AD4 and AD5 is at "H". That is, when one of the two signals WRITE and REWRITE is at "H" and the data DATA is "1", the output signal from OR circuit OR7 is set at "H". When the output signal from the OR circuit OR7 is set at "H", the NMOS transistor N2 is turned on.

When the trial signal TRIAL is set at "H" as well, the output signal from the OR circuit OR7 is set at "H", and the NMOS transistor N2 is turned on. That is, when the trial data is "1", a current flows through the write lines 26 and 33 from the write bit line driver/sinker 31 to the write bit line driver/sinker 29.

b. Write Bit Line Driver/Sinker 31

The write bit line driver/sinker 31 is comprised of OR circuits OR8 and OR9, AND circuits AD6, AD7, and AD8, NOR circuit NR1, inverter circuit I2, PMOS transistor P3, and NMOS transistor N3.

The write bit line driver is comprised of the OR circuit OR8, AND circuits AD6 and AD7, NOR circuit NR1, and PMOS transistor P3. A write signal WRITE and rewrite signal REWRITE are input to the OR circuit OR8. When one of these two signals WRITE and REWRITE is set at "H", an output signal from the OR circuit OR8 is set at "H".

The output signal from the OR circuit OR8 and data DATA are input to the AND circuit AD6. Assume that an output signal from the OR circuit OR8 is at "H". In this case, if the write data DATA is "1", an output signal from the AND circuit AD6 is set at "H". If the write data DATA is "0", the output signal from the AND circuit AD6 is set at "L".

The trial signal TRIAL is input to the AND circuit AD7. As described above, the trial signal TRIAL is a signal that is set at "H" when trial data is to be written in a selected TMR element at the time of destructive read operation. The AND circuit AD7 has two input terminals. The trial signal TRIAL is input to one of the input terminals, while the other terminal is always fixed to "1".

The output signal from the NOR circuit NR1 is set at "L" when one of output signals from the two AND circuits AD6 and AD7 is at "H". That is, when one of the two signals WRITE and REWRITE is at "H" and the data DATA is "1", the output signal from NOR circuit NR1 is set at "L". When the output signal from the NOR circuit NR1 is set at "L", the PMOS transistor P3 is turned on.

When the trial signal TRIAL is set at "H" as well, the output signal from the NOR circuit NR1 is set at "L", and the PMOS transistor P3 is turned on. That is, when the trial data is "1", a current flows through the write lines 26 and 33 from the write bit line driver/sinker 31 to the write bit line driver/sinker 29.

The write bit line sinker is comprised of the OR circuit OR9, AND circuit AD8, inverter circuit I2, and NMOS transistor N3. The write signal WRITE and rewrite signal REWRITE are input to the OR circuit OR9. When one of these two signals WRITE and REWRITE is set at "H", an output signal from the OR circuit OR9 is set at "H".

The write data DATA is input to the inverter circuit I2. The output signal from the OR circuit OR9 and an output signal from the inverter circuit I2 are input to the AND circuit AD8.

Assume that the output signal from the OR circuit OR9 is at "H". In this case, if the write data DATA is "1", an output signal from the AND circuit AD8 is set at "L". If the write data DATA is "0", the output signal from the AND circuit AD8 is set at "H". When an output signal from the AND circuit AD8 is at "L", the NMOS transistor N3 is turned off. When the output signal from the AND circuit AD8 is at "H", the NMOS transistor N3 is turned on.

c. As described above, in the write bit line driver/sinker in FIG. 12, when write operation is performed, i.e., one of the signals WRITE and REWRITE is at "H", the direction of a write current flowing through the write lines 26 and 33 is determined in accordance with the value ("1" or "0") of the write data DATA.

In read operation as well, when trial data is written in a TMR element, the trial signal TRIAL is set at "H". In this example, therefore, a write current flows through the write lines 26 and 33 from the write bit line driver/sinker 31 to the write bit line driver/sinker 29. At this time, trial data "1" is written in the selected TMR element.

Figure 13:
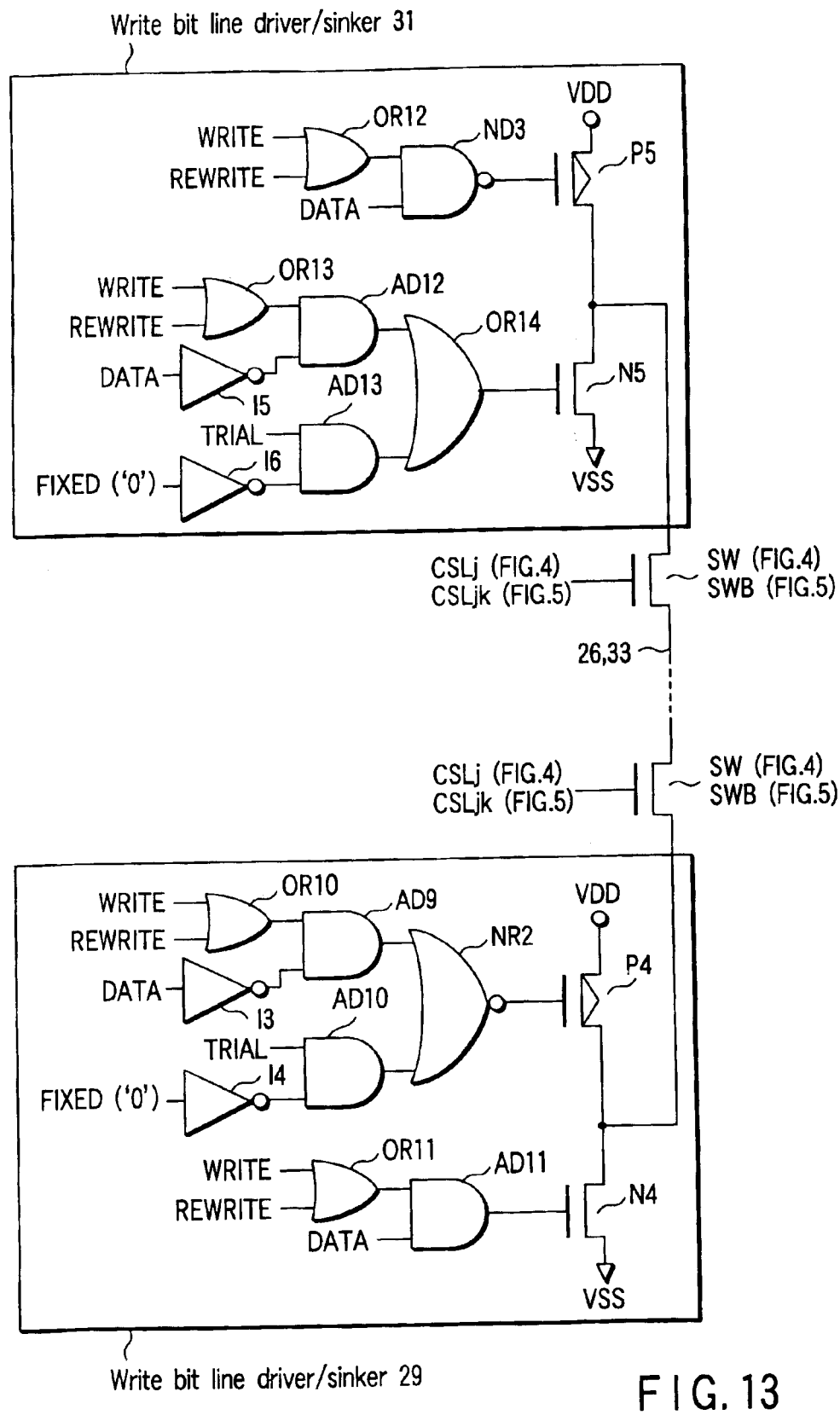
FIG. 13 is a view showing another example of the write bit line driver/sinker.

B. FIG. 13 shows another example of the write bit line driver/sinker.

The write bit line driver/sinker according to this example corresponds to a case where so-called trial data to be written in a selected TMR element in the second cycle of the destructive read operation principle (see, for example, FIG. 2) is "0".

a. Write Bit Line Driver/Sinker 29

The write bit line driver/sinker 29 is comprised of OR circuits OR10 and OR11, AND circuits AD9, AD10, and AD1, NOR circuit NR2, inverter circuits I3 and I4, PMOS transistor P4, and NMOS transistor N4.

The write bit line driver is comprised of the OR circuit OR10, AND circuits AD9 and AD10, NOR circuit NR2, inverter circuits I3 and I4, and PMOS transistor P4. A write signal WRITE and rewrite signal REWRITE are input to the OR circuit OR10. When one of these two signals WRITE and REWRITE is set at "H", an output signal from the OR circuit OR10 is set at "H".

The write data DATA is input to the inverter circuit I3. The output signal from the OR circuit OR10 and an output signal from the inverter circuit I3 are input to the AND circuit AD9. Assume that the output signal from the OR circuit OR10 is at "H". In this case, if the write data DATA is "1", an output signal from the AND circuit AD9 is set at "L". If the write data DATA is "0", the output signal from the AND circuit AD9 is set at "H".

The trial signal TRIAL is input to the AND circuit AD10. The trial signal TRIAL is a signal that is set at "H" when trial data is to be written in a selected TMR element at the time of destructive read operation. The AND circuit AD10 has two input terminals. The trial signal TRIAL is input to one of the input terminals, while the other terminal is always fixed to "H".

The output signal from the NOR circuit NR2 is set at "L" when one of output signals from the two AND circuits AD9 and AD10 is at "H". That is, when one of the two signals WRITE and REWRITE is at "H" and the data DATA is "1", the output signal from NOR circuit NR2 is set at "L". When the output signal from the NOR circuit NR2 is set at "L", the PMOS transistor P4 is turned on.

When the trial signal TRIAL is set at "H" as well, the output signal from the NOR circuit NR2 is set at "L", and the PMOS transistor P4 is turned on. That is, when the trial data is "0", a current flows through the write lines 26 and 33 from the write bit line driver/sinker 29 to the write bit line driver/sinker 31.

The write bit line sinker is comprised of the OR circuit OR11, AND circuit AD11, and NMOS transistor N4. The write signal WRITE and rewrite signal REWRITE are input to the OR circuit OR11. When one of these two signals WRITE and REWRITE is set at "H", an output signal from the OR circuit OR11 is set at "H".

The output signal from the OR circuit OR11 and the write data DATA are input to the AND circuit AD11.

Assume that the output signal from the OR circuit OR11 is at "H". In this case, if the write data DATA is "1", an output signal from the AND circuit AD11 is set at "H". If the write data DATA is "0", the output signal from the AND circuit AD11 is set at "L". If the output signal from the AND circuit AD11 is at "H", the NMOS transistor N4 is turned on. If the output signal from the AND circuit AD11 is at "L", the NMOS transistor N4 is turned off.

b. Write Bit Line Driver/Sinker 31

The write bit line driver/sinker 31 is comprised of OR circuits OR12, OR13, and OR14, AND circuits AD12 and AD13, NAND circuit ND3, inverter circuits I5 and I6, PMOS transistor P5, and NMOS transistor N5.

The write bit line driver is comprised of the OR circuit OR12, NAND circuit ND3, and PMOS transistor P5. A write signal WRITE and rewrite signal REWRITE are input to the OR circuit OR12. When one of these two signals WRITE and REWRITE is set at "H", an output signal from the OR circuit OR12 is set at "H".

The output signal from the OR circuit OR12 and data DATA are input to the NAND circuit ND3. Assume that an output signal from the OR circuit OR12 is at "H". In this case, if the write data DATA is "1", an output signal from the NAND circuit ND3 is set at "L". If the write data DATA is "0", the output signal from the NAND circuit ND3 is set at "H".

If the output signal from the NAND circuit ND3 is at "L", the PMOS transistor P5 is turned on. If the output signal from the NAND circuit ND3 is at "H", the PMOS transistor P5 is turned off.

The write bit line sinker is comprised of the OR circuits OR13 and OR14, AND circuits AD12 and AD13, inverter circuits I5 and I6, and NMOS transistor N5. The write signal WRITE and rewrite signal REWRITE are input to the OR circuit OR13. When one of these two signals WRITE and REWRITE is set at "H", an output signal from the OR circuit OR13 is set at "H".

Write data DATA is input to the inverter circuit I5. The output signal from the OR circuit OR13 and an output signal from the inverter circuit I5 are input to the AND circuit AD12.

Assume that the output signal from the OR circuit OR13 is at "H". In this case, if the write data DATA is "1", an output signal from the AND circuit AD12 is set at "L". If the write data DATA is "0", the output signal from the AND circuit AD12 is set at "H".

A trial signal TRIAL is input to the AND circuit AD13. The trial signal TRIAL is a signal that is set at "H" when so-called trial data is written in a selected TMR element at the time of read operation (destructive read operation). The AND circuit AD13 has two input terminals. The trial signal TRIAL is input to one of the input terminals, while the other terminal is always fixed to "1" because the input signal to the inverter circuit I6 is fixed to "0".

The output signal from the OR circuit OR14 is set at "H" when one of output signals from the two AND circuits AD12 and AD13 is at "H". That is, when one of the two signals WRITE and REWRITE is at "H" and the data DATA is "0", the output signal from OR circuit OR14 is set at "H". When the output signal from the OR circuit OR14 is set at "H", the NMOS transistor N5 is turned on.

When the trial signal TRIAL is set at "H" as well, the output signal from the OR circuit OR14 is set at "H", and the NMOS transistor N5 is turned on. That is, when the trial data is "0", a current flows through the write lines 26 and 33 from the write bit line driver/sinker 29 to the write bit line driver/sinker 31.

c. As described above, in the write bit line driver/sinker in FIG. 13, when trial data is written in a TMR element in read operation, the trial signal TRIAL is set at "H" to cause a write current flowing from the write bit line driver/sinker 29 to the write bit line driver/sinker 31 to flow through the write lines 26 and 33.

That is, in the example shown in FIG. 12, trial data to be written in a TMR element is "1", whereas in the example shown in FIG. 13, trial data to be written in a TMR element is "0".

Note that in normal write operation, since one of the signals WRITE and REWRITE is set at "H" (the trial signal TRIAL is set at "L"), the direction of a write current flowing through the write lines 26 and 33 is determined in accordance with the value of the write data DATA ("1" or "0").

(4) Principle of Read Operation Using Improved Examples 1 and 2

The arrangements of Improved Examples 1 and 2 have been described in detail above. The principle of read operation using Improved Examples 1 and 2 will be described below.

A case where the read operation principle proposed in U.S. Ser. No. 09/961,326 is executed using Improved Examples 1 and 2 will be described first. A case where the new read operation principle proposed by the present invention is executed using Improved Examples 1 and 2 will be described afterward.

① Read Operation Principle 1

Figure 14:
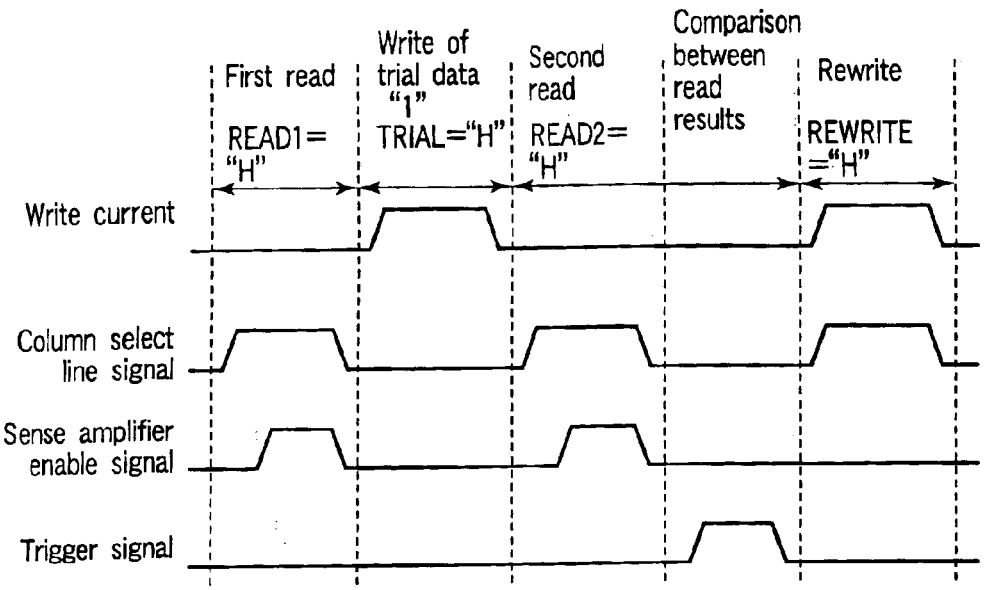
FIG. 14 is a timing chart showing an example of a destructive read operation principle in Improved Examples 1 and 2.

FIG. 14 is a timing chart showing read operation principle 1.

This read operation principle is associated with the read operation principle shown in FIG. 2. In this case, however, one read operation is constituted by five steps. That is, in this example, the step of comparing read results is inserted between the second read step and the rewrite step.

In Improved Example 1 shown in FIGS. 3 and 4, the circuits used in executing this read operation principle are the write word line driver/sinker in FIG. 6, the column decoder in FIG. 7, and the write bit line driver/sinker (trial data "1") in FIG. 12.

In Improved Example 2 shown in FIG. 5, the write word line driver/sinker in FIG. 6, the read column decoder shown in FIG. 9, the write column decoder in FIG. 11, and the write bit line driver/sinker (trial data "1") in FIG. 12 are used.

A. First Step

In the first step, initial data is read (first read). The initial data means reference data required to determine the value of the data in a selected TMR element.

In this step, the read signal READ1 is set at "H".

In Improved Example 1, therefore, in a selected column in which all the bits of a column address signal are "1", the column select signal CSLj (FIG. 7) is set at "H". In Improved Example 2, in a selected column in which all the bits of an upper column address signal are "1", the column select signal CSLj (FIG. 9) is set at "H".

In addition, a sense amplifier enable signal is set at "H" to activate the sense amplifier. As a result, in Improved Example 1 in FIG. 4, the read current generated by the current source in the read circuit in the circuit block 29 flows to the ground terminal via the plurality of TMR elements of the selected column. In Improved Example 2 in FIG. 5, the read current generated by the current source in the read circuit 29B flows to the ground terminal via the plurality of TMR elements of the selected column.

The read circuit detects initial data while a read current is flowing. The initial data depends on the combined resistance of the plurality of TMR elements which constituted the selected column and are connected in parallel with each other. The initial data is stored in the storage circuit in the sense amplifier.

B. Second Step

In the second step, trial data is written in a selected TMR element. The trial data is data which has a predetermined value written in a selected TMR element to obtain comparison data to be compared with reference data. In this example, the trial data is "1".

In this step, the trial signal TRIAL is set at "H".

In Improved Examples 1 and 2, therefore, in a selected row in which all the bits of a row address signal are "1", the PMOS transistor P1 (FIG. 6) in the write word line driver is turned on. As a consequence, a write current flows through the write word line in the selected row.

In Improved Example 1, in a column in which all the bits of a column address signal are "1", the column select line signal CSLj (FIG. 7) is set at "H". In Improved Example 2, the column select line signal CSLjk (FIG. 11) is set at "H" in a column in which all the bits of an upper column address signal are "1" and at a stage where all the bits of a lower column address signal are "1".

That is, in Improved Example 1, the column select switch SW in a selected column is turned on. In Improved Example 2, the column select switch SWB corresponding to a selected stage in a selected column is turned on.

In the write bit line driver/sinker in FIG. 12, since the trial signal TRIAL is at "H", NMOS transistor N2 is set in the ON state. In the write bit line driver/sinker 31 in FIG. 12, since the trial signal TRIAL is at "H", the PMOS transistor P2 is set in the ON state.

In Improved Example 1 in FIG. 4, therefore a write current flows through the write line 26 in the selected column from the write bit line driver/sinker 31 to the write bit line driver/sinker 29. In Improved Example 2 in FIG. 5, a write current flows through the write line 33 in the selected stage in the selected column from the write bit line driver/sinker 31 to the write bit line driver/sinker 29.

As a consequence, the trial data ("1") is written in the selected TMR element. Thereafter, the column select switches SW and SWB are turned off to block the write current. In addition, the write current flowing through the write word line in the selected row is blocked.

C. Third Step

In the third step, comparison data is read (second read). The comparison data means data which is compared with reference data to determine the value of the data in a selected TMR element.

In this step, the read signal READ2 is set at "H".

In Improved Example 1, therefore, in a selected column in which all the bits of a column address signal are "1", the column select line signal CSLj (FIG. 7) is set at "H". In addition, in Improved Example 2, in a column in which all the bits of an upper column address signal are "1", the column select line signal CSLj (FIG. 9) is set at "H".

In addition, a sense amplifier enable signal is set at "H" to activate the sense amplifier. As a consequence, in Improved Example 1 in FIG. 4, the read current generated by the current source in the read circuit in the circuit block 29 flows to the ground terminal via the plurality of TMR elements in the selected column. In Improved Example 2 in FIG. 5, the read current generated by the current source in the read circuit 29B flows to the ground terminal via the plurality of TMR elements in the selected column.

The read circuit detects comparison data while the read current flows. The comparison data depends on the combined resistance of the plurality of TMR elements which constitute the selected column and are connected in parallel with each other.

D. Fourth Step

In the fourth step, the initial data is compared with the comparison data to determine the value of the data in the selected TMR element.

More specifically, if it is determined that the initial data coincides with the comparison data, since it indicates that the resistance value of the TMR element has not changed upon writing of the trial data in the second step, it is determined that the value of the data in the selected TMR element is equal to that of the trial data.

In contrast to this, if it is determined that the initial data differs from the comparison data, since it indicates that the resistance value of the selected TMR element has changed upon writing of the trial data in the second step, it is determined that the value of the data in the selected TMR element has an opposite value to that of the trial data.

In this example, since the trial data is assumed to be "1", if the initial data coincides with the comparison data, it is determined the data in the selected TMR element is "1". If the initial data differs from the comparison data, it is determined that the data in the selected TMR element is "0".

In this manner, the value of the data in the selected TMR element is determined.

In the fourth step, the results obtained by two read operations are compared on the basis of a trigger signal. In this example, a column select line signal and sense amplifier enable signal are set at "L" immediately before the trigger signal is set at "H".

Figure 15:
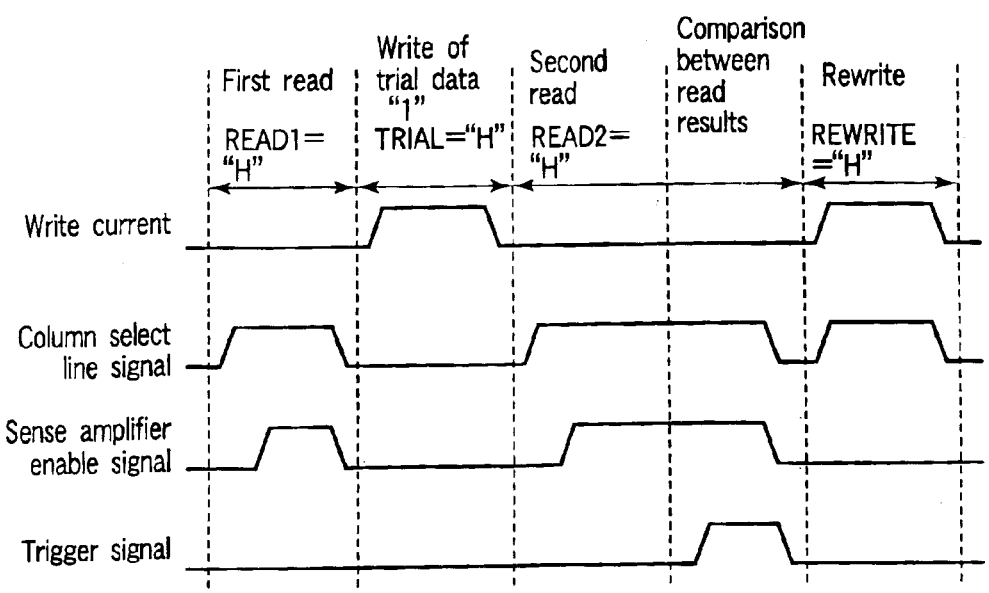
FIG. 15 is a timing chart showing another example of the destructive read operation principle in Improved Examples 1 and 2.

As shown in the timing chart of FIG. 15, the column select line signal and sense amplifier enable signal may be kept at "H" level throughout the third and fourth steps.

The detailed arrangement of a circuit for executing the fourth step, i.e., a read circuit (including a sense amplifier), has not described in the item "Examples of Peripheral Circuits in Improved Examples 1 and 2". Since various improved examples of the read circuit (including the sense amplifier) have been proposed, these examples will be described in detail later.

E. Fifth Step

In the fifth step, data is rewritten in a selected TMR element. According to the read operation principle in this example, in the second step, the trial data is written in the selected TMR element. At this time, the data in the selected TMR element is destroyed.

After the value of the data in the selected TMR element is determined, therefore, data is rewritten in the selected TMR element.

In this step, the rewrite signal REWRITE is set at "H".

In Improved Examples 1 and 2, in a row in which all the bits of a row address signal are "1", the PMOS transistor P1 (FIG. 6) in the write word line driver is turned on. As a consequence, a write current flows through the write word line in the selected row.

In Improved Example 1, in a column in which all the bits of a column address signal are "1", the column select line signal CSLj (FIG. 7) is set at "H". In Improved Example 2, the column select line signal CSLjk (FIG. 11) is set at "H" in a column in which all the bits of an upper column address signal are "1" and at a stage where all the bits of a lower column address signal are "1".

That is, in Improved Example 1, the column select switch SW in the selected column is turned on. In Improved Example 2, the column select switch SWB corresponding to the selected stage in the selected column is turned on.

In the write bit line driver/sinker 29 in FIG. 12, since the rewrite signal REWRITE is at "H", the ON/OFF states of the MOS transistors P2 and N2 are determined in accordance with the value of the rewrite data DATA. In the write bit line driver/sinker 31 in FIG. 12 as well, since the rewrite signal REWRITE is at "H", the ON/OFF states of the MOS transistors P3 and N3 are determined in accordance with the value of the rewrite data DATA.

In Improved Example 1 in FIG. 4, therefore, a write current flows through the write line 26 in the selected column toward the write bit line driver/sinker 29 or 31 in accordance with the value of the rewrite data DATA.

In Improved Example 2 in FIG. 5, a write current flows through the write line 33 in the selected stage in the selected column toward the write bit line driver/sinker 29 or 31 in accordance with the value of the rewrite data DATA.

As a consequence, the data ("1" or "0") which has been stored in the selected TMR element before the execution of read operation constituted by the first to fifth steps described above is rewritten in the selected TMR element. After this operation, the column select switches SW and SWB are turned off to block the write current. In addition, the write current flowing through the write word line in the selected row is blocked.

If it is determined in the fourth step that the initial data coincides with the comparison data, the data that has been stored in the selected TMR element has the same value as that of the trial data. In this case, therefore, the fifth step may be omitted.

That is, only when it is determined in the fourth step that the initial data differs from the comparison data, data having an opposite value to that of the trial data may be rewritten in the selected TMR element in the fifth step.

As described above, the magnetic random access memories according to Improved Examples 1 and 2 can use the so-called destructive read operation principle and actually execute it. Therefore, the resistance value (or MR ratio) of a selected TMR element can be accurately read regardless of variations in resistance among a plurality of TMR elements in read operation.

② Read Operation Principle 2

Figure 16:
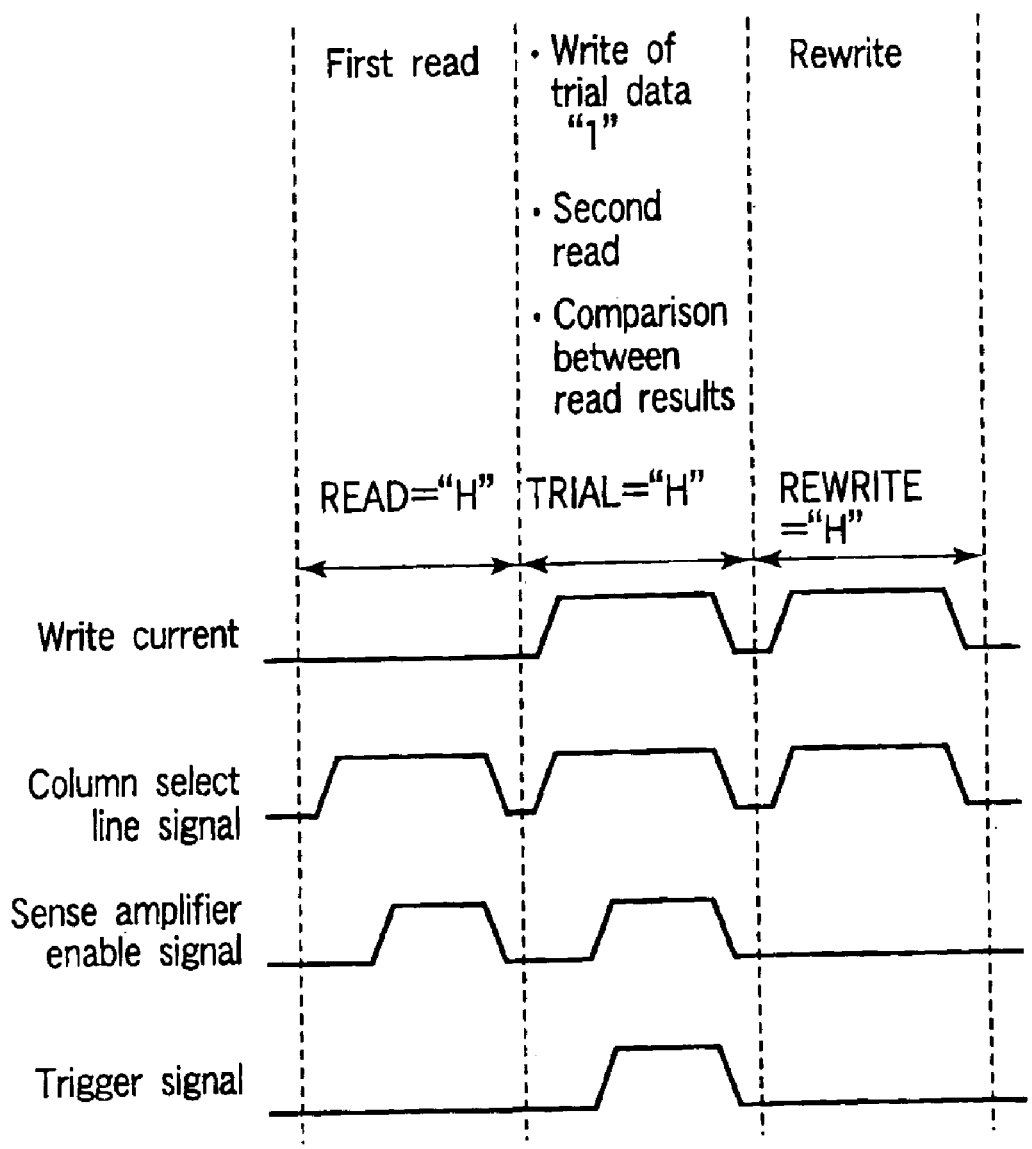
FIG. 16 is a timing chart showing an example of an improved destructive read operation principle in Improved Examples 1 and 2.

FIG. 16 is a timing chart showing read operation principle 2.

This read operation principle is an improved example of read operation principle 1 described above. A characteristic feature of this read operation principle is that the step of writing the trial data, the step of reading the comparison data (second read step), and the step of comparing read results with each other to determine the data in a TMR element are integrated into one step.

In this example, therefore, one read operation is constituted by three steps. In the read operation principle of this example, the second to fourth steps in the read operation principle in FIG. 14 or 15 are integrated into one step.

Assume that circuits to be used in executing this read operation principle in Improved Example 1 shown in FIGS. 3 and 4 are the write word line driver/sinker shown in FIG. 6, the column decoder shown in FIG. 8, and the write bit line driver/sinker shown in FIG. 12 (trial data "1").

In Improved Example 2 in FIG. 5, the write word line driver/sinker shown in FIG. 6, the read column decoder shown in FIG. 10, the write column decoder shown in FIG. 11, and the write bit line driver/sinker shown in FIG. 12 (trial data "1") are used.

A. First Step

In the first step, initial data is read (first read).

In this step, the read signal READ is set at "H".

In Improved Example 1, therefore, in a selected column in which all the bits of a column address signal are "1", the column select signal CSLj (FIG. 8) is set at "H". In Improved Example 2, in a selected column in which all the bits of an upper column address signal are "1", the column select signal CSLj (FIG. 10) is set at "H".

In addition, a sense amplifier enable signal is set at "H" to activate the sense amplifier. As a result, in Improved Example 1 in FIG. 4, the read current generated by the current source in the read circuit in the circuit block 29 flows to the ground terminal via the plurality of TMR elements of the selected column. In Improved Example 2 in FIG. 5, the read current generated by the current source in the read circuit 29B flows to the ground terminal via the plurality of TMR elements of the selected column.

The read circuit detects initial data while a read current is flowing. The initial data depends on the combined resistance of the plurality of TMR elements which constituted the selected column and are connected in parallel with each other. The initial data is stored in the storage circuit in the sense amplifier.

B. Second Step

In the second step, the following three items are executed simultaneously or temporally in parallel with each other:

write of trial data in selected TMR element
read of comparison data (second read)
comparison between results obtained by two reads (determination of value of data in TMR element)

In this step, the trial signal TRIAL is set at "H".

In Improved Examples 1 and 2, therefore, in a selected row in which all the bits of a row address signal are "1", the PMOS transistor P1 (FIG. 6) in the write word line driver is turned on. As a consequence, a write current flows through the write word line in the selected row.

In Improved Example 1, in a column in which all the bits of a column address signal are "1", the column select line signal CSLj (FIG. 8) is set at "H". In Improved Example 2, the column select line signal CSLj (FIG. 11) is set at "H" in a column in which all the bits of an upper column address signal are "1" and at a stage where all the bits of a lower column address signal are "1".

That is, in Improved Example 1, the column select switch SW in a selected column is turned on. In Improved Example 2, the column select switch SWB corresponding to a selected stage in a selected column is turned on.

In the write bit line driver/sinker in FIG. 12, since the trial signal TRIAL is at "H", NMOS transistor N2 is set in the ON state. In the write bit line driver/sinker 31 in FIG. 12, since the trial signal TRIAL is at "H", the PMOS transistor P2 is set in the ON state.

In Improved Example 1 in FIG. 4, therefore a write current flows through the write line 26 in the selected column from the write bit line driver/sinker 31 to the write bit line driver/sinker 29. In Improved Example 2 in FIG. 5, a write current flows through the write line 33 in the selected stage in the selected column from the write bit line driver/sinker 31 to the write bit line driver/sinker 29.

As a consequence, the trial data ("1") is written in the selected TMR element.

A read of the comparison data (second read) is executed concurrently with such writing of the trial data.

More specifically, in Improved Example 1, when the trial signal TRIAL is at "H", the column select signal CSLj (FIG. 8) in a selected column in which all the bits of a column address signal are "1" is set at "H". In Improved Example 2, the column select line signal CSLjk (FIG. 10) in a column in which all the bits of an upper column address signal are "1" is set at "H".

In addition, the sense amplifier enable signal is set at "H" to activate the sense amplifier. As a consequence, in Improved Example 1 in FIG. 4, comparison data is detected by the read circuit in the circuit block 29. In Improved Example 2 in FIG. 5, comparison data is detected by the read circuit 29B. The comparison data depends on the combined resistance of the plurality of TMR elements which constitute the selected column and are connected in parallel with each other.

The comparison data detected by the read circuit is immediately compared with the initial data to determine the value of the data in the selected TMR element.

More specifically, if it is determined that the initial data coincides with the comparison data, since it indicates that the resistance value of the selected TMR element has not changed upon writing of the trial data, the data in the selected TMR element has the same value as that of the trial data.

In contrast to this, if it is determined that the initial data differs from the comparison data, it indicates that the resistance value of the selected TMR element has changed upon writing of the trial data, it is determined that the value of the data in the selected TMR element has an opposite value to that of the trial data.

In this example, since the trial data is assumed to be "1", if the initial data coincides with the comparison data, it is determined the data in the selected TMR element is "1". If the initial data differs from the comparison data, it is determined that the data in the selected TMR element is "0".

In this manner, the value of the data in the selected TMR element is determined.

C. Third Step

In the third step, data is rewritten in a selected TMR element. According to the read operation principle in this example, in the second step, the trial data is written in the selected TMR element. At this time, the data in the selected TMR element is destroyed.

After the value of the data in the selected TMR element is determined, therefore, data is rewritten in the selected TMR element.

In this step, the rewrite signal REWRITE is set at "H".

In Improved Examples 1 and 2, in a row in which all the bits of a row address signal are "1", the PMOS transistor P1 (FIG. 6) in the write word line driver is turned on. As a consequence, a write current flows through the write word line in the selected row.

In Improved Example 1, in a column in which all the bits of a column address signal are "1", the column select line signal CSLj (FIG. 7) is set at "H". In Improved Example 2, the column select line signal CSLjk (FIG. 11) is set at "H" in a column in which all the bits of an upper column address signal are "1" and at a stage where all the bits of a lower column address signal are "1".

That is, in Improved Example 1, the column select switch SW in the selected column is turned on. In Improved Example 2, the column select switch SWB corresponding to the selected stage in the selected column is turned on.

In the write bit line driver/sinker 29 in FIG. 12, since the rewrite signal REWRITE is at "H", the ON/OFF states of the MOS transistors P2 and N2 are determined in accordance with the value of the rewrite data DATA. In the write bit line driver/sinker 31 in FIG. 12 as well, since the rewrite signal REWRITE is at "H", the ON/OFF states of the MOS transistors P3 and N3 are determined in accordance with the value of the rewrite data DATA.

In Improved Example 1 in FIG. 4, therefore, a write current flows through the write line 26 in the selected column toward the write bit line driver/sinker 29 or 31 in accordance with the value of the rewrite data DATA.

In Improved Example 2 in FIG. 5, a write current flows through the write line 33 in the selected stage in the selected column toward the write bit line driver/sinker 29 or 31 in accordance with the value of the rewrite data DATA.

As a consequence, the data ("1" or "0") which has been stored in the selected TMR element before the execution of read operation is rewritten in the selected TMR element. After this operation, the column select switches SW and SWB are turned off to block the write current. In addition, the write current flowing through the write word line in the selected row is blocked.

If it is determined in the second step that the initial data coincides with the comparison data, the data that has been stored in the selected TMR element has the same value as that of the trial data. In this case, therefore, the third step may be omitted.

That is, only when it is determined in the second step that the initial data differs from the comparison data, data having an opposite value to that of the trial data may be rewritten in the selected TMR element in the third step.

As described above, the magnetic random access memories according to Improved Examples 1 and 2 can use the improved destructive read operation principle and actually execute it. Therefore, the resistance value (or MR ratio) of a selected TMR element can be accurately read regardless of variations in resistance among a plurality of TMR elements in read operation.

(5) Improved Example 3

Figure 17:
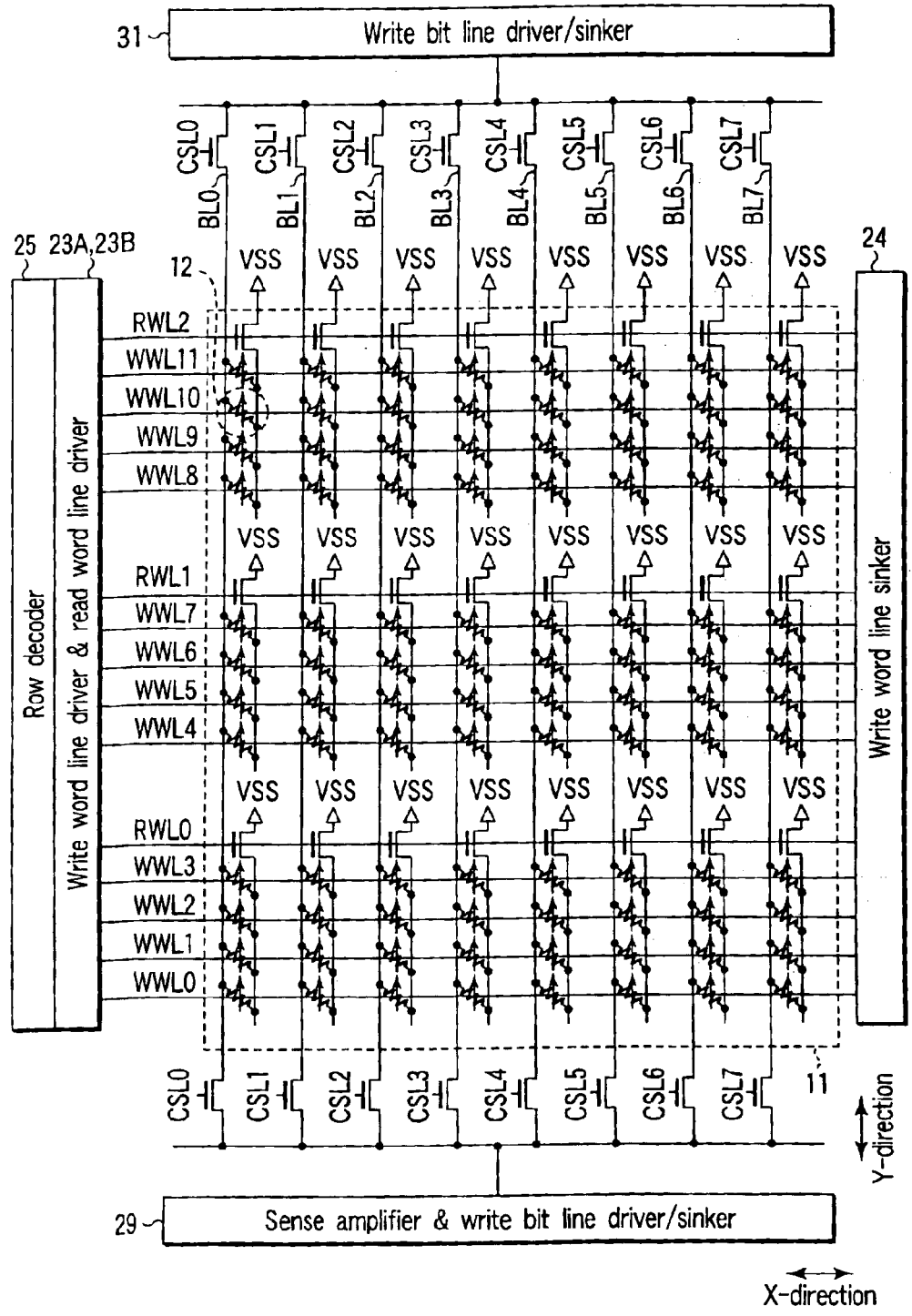
FIG. 17 is a view showing a magnetic random access memory according to Improved Example 3 of the present invention.
Figure 18:
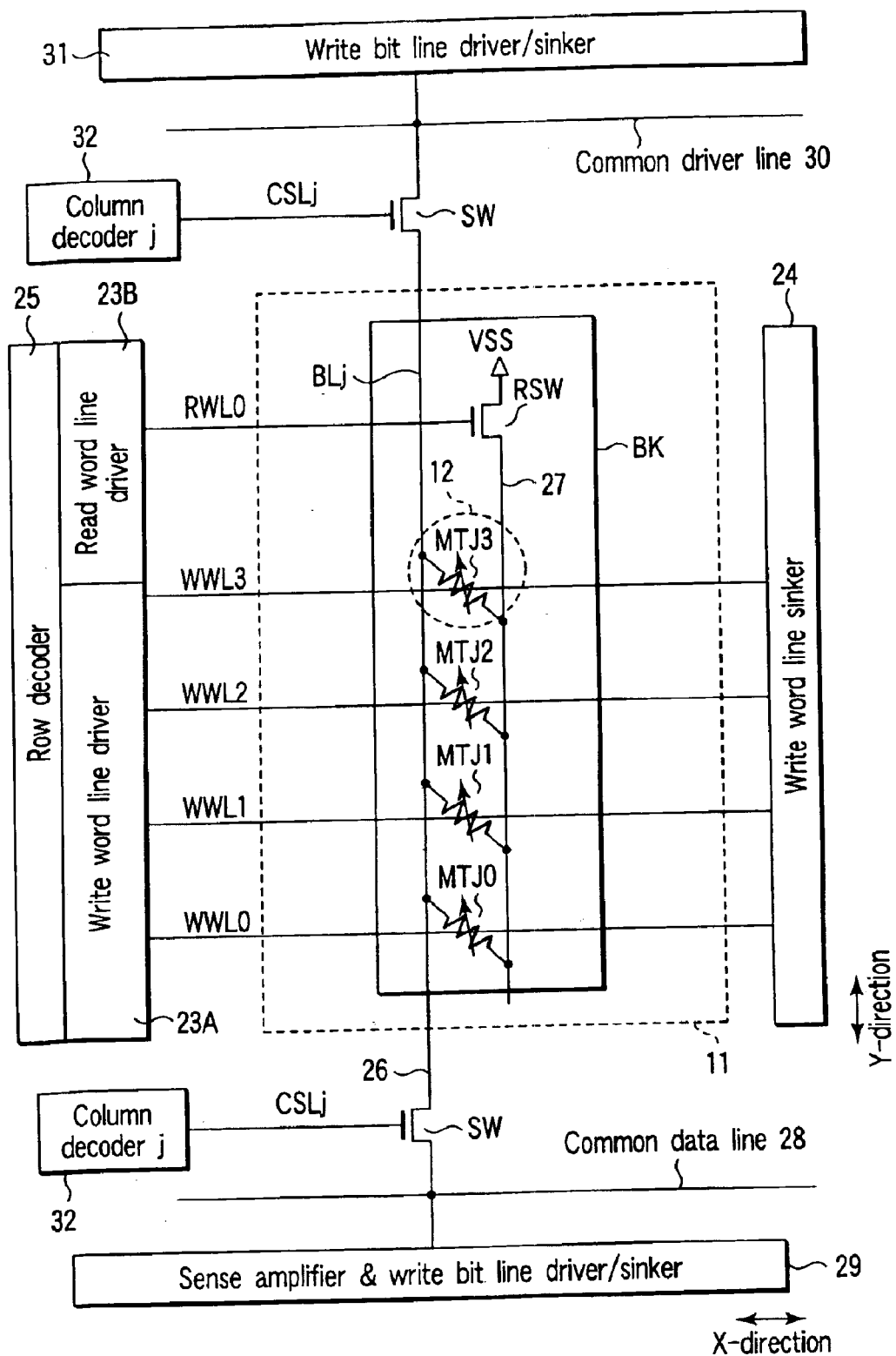
FIG. 18 is a view showing a one-column portion of the memory in FIG. 17.

FIG. 17 shows the main part of a magnetic random access memory as Improved Example 3 of the present invention. FIG. 18 shows only one column portion of the magnetic random access memory in FIG. 17.

The magnetic random access memory according to Improved Example 3 is a modification to the magnetic random access memory (FIGS. 3 and 4) according to Improved Example 1.

More specifically, in Improved Example 1, one column is formed from one block constituted by a plurality of TMR elements which are connected in parallel with each other. In contrast to this, in Improved Example 3, one column is formed from a plurality of blocks each formed from a group of TMR elements connected in parallel with each other.

The main reason why one column is formed from a plurality of blocks is that the number of TMR elements in one block in which a read current flows in destructive read operation is reduced to increase the difference between initial data and comparison data when cell data differs from trial data, thereby increasing the read margin (or sensitivity).

A memory cell array 11 has a plurality of TMR elements 12 arranged in the form of an array in the X- and Y-direction. A plurality of (12 in this example) write word lines WWL0, WWL1, ..., WWL11 extending in the X-direction are arranged near the TMR elements 12 arranged in the X-direction. One end of each of the write word lines WWL0, WWL1, ..., WWL11 is connected to a write word line driver 23A. The other end of each of these lines is connected to a write word line sinker 24.

In this example, one column is constituted by three blocks BK. Since one column is comprised of 12 TMR elements 12 arranged in the Y-direction, one block BK is comprised of four TMR elements 12.

The TMR elements 12 in one block BK are connected in parallel between a first data transfer line (bit line) 26 and a second data transfer line 27.

One end of the first data transfer line 26 is connected to a common data line 28 via a column select switch (MOS transistor) SW. The common data line 28 is connected to a circuit block 29 including a read circuit (including a sense amplifier), write bit line driver, and write bit line sinker.

The other end of the first data transfer line 26 is connected to a common driver line 30 via a column select switch (MOS transistor) SW. The common driver line 30 is connected to a circuit block 31 including a write bit line driver and write bit line sinker.

Column select signals CSL0, CSL1, ..., CSL7 are input to the gate of the column select switch SW. Column decoders 32 are provided in correspondence with the column select switches SW and output the column select signals CSL0, CSL1, ..., CSL7.

The second data transfer line 27 is connected to a ground terminal via a read select switch (MOS transistor) RSW. The gate of the read select switch RSW is connected to a read word line RWLo (o=0, 1, 2). One read word line RWLo corresponds to one block BK in one column and is common to a plurality of blocks in the X-direction.

In this example, since one column is comprised of three blocks, the number of read word lines RWLo is three. Each read word line RWLo extends in the X-direction and its one end is connected to a read word line driver 23B.

A row decoder 25 selects one of the write word lines WWL0, WWL1, ..., WWL11 on the basis of a row address signal in write operation. The write word line driver 23A supplies a write current to a selected write word line. The write current flows through the selected write word line and is absorbed by the write word line sinker 24.

In read operation, for example, the row decoder 25 selects one block on the basis of an upper row address signal. The read word line driver 23B applies a read word line voltage to the read word line RWLo connected to the selected block BK. In the selected block BK, since the read select switch RSW is turned on, a read current flows to the ground terminal via the plurality of TMR elements in the selected block BK.

In the magnetic random access memory according to this example, in write operation, a write current flows through a selected write word line from the write word line driver 23A to the write word line sinker 24. In the selected column, a write current flows through the first data transfer line (bit line) 26. The direction of the write current flowing through the first data transfer line 26 changes in accordance with the value of write data.

In read operation, in a selected block in a selected column, a read current flows to a ground terminal via the first data transfer line, the plurality of TMR elements, and the second transfer line. While the read current is flowing, the read circuit in the circuit block 29 detects read data corresponding to the combined resistance of the plurality of TMR elements in the selected block.

The principle of read operation using the magnetic random access memory of this example will be described in detail later.

(6) Improved Example 4

Figure 19:
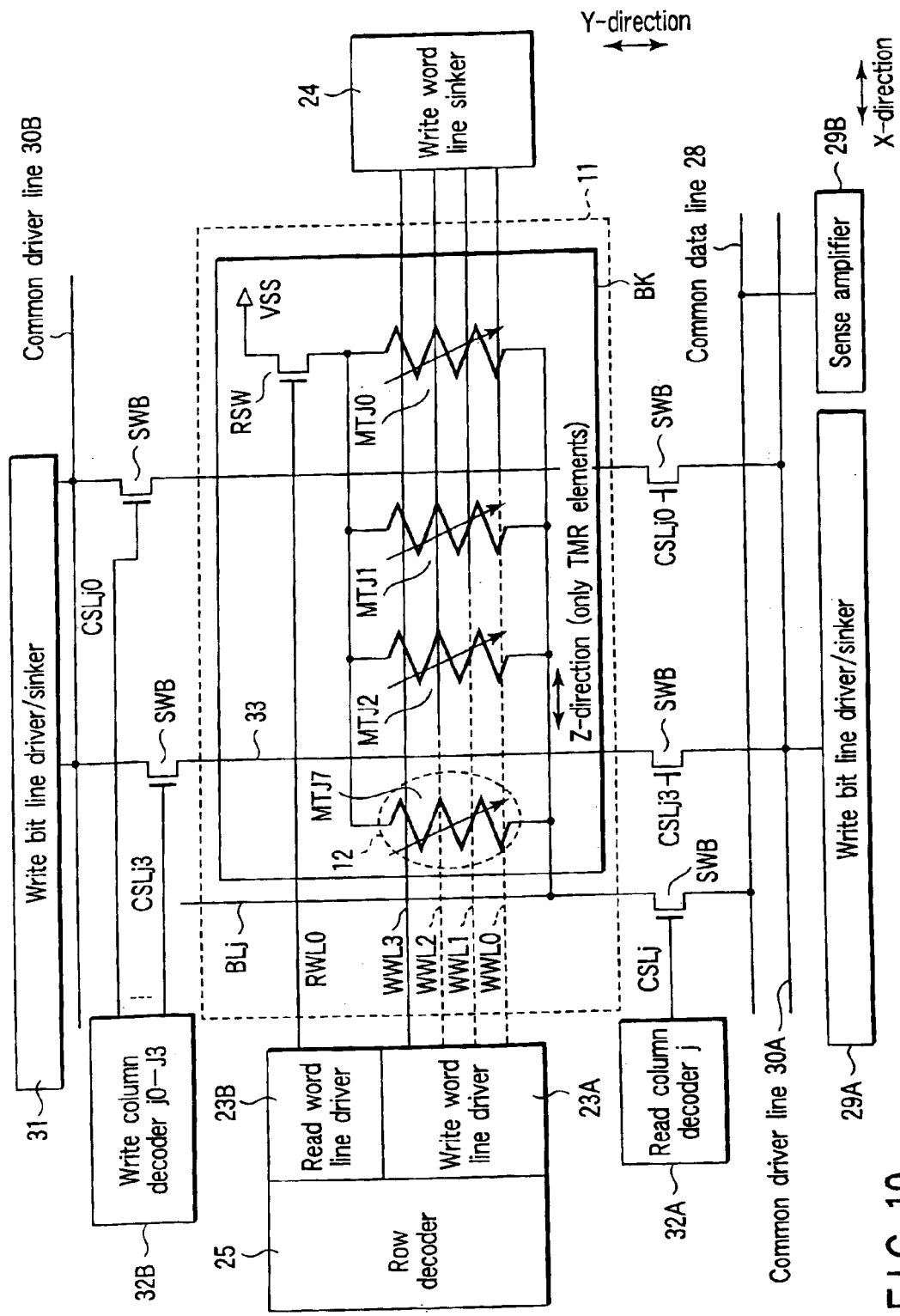
FIG. 19 is a view showing a one-column portion of a memory according to Improved Example 4 of the present invention.

FIG. 19 shows the main part of a magnetic random access memory as Improved Example 4 of the present invention. FIG. 19 shows only one column portion in correspondence with FIG. 18.

As compared with Improved Example 3, the magnetic random access memory according to Improved Example 4 is characterized in the arrangement of TMR elements corresponding one column.

In Improved Example 3, the plurality of blocks in one column and the plurality of TMR elements in one block are arranged in a line in the Y-direction. In Improved Example 4, the plurality of blocks in one column are arranged in a line in the Y-direction, whereas the plurality of TMR elements in one block are arranged in a line in the Z-direction.

In this case, the Z-direction is a direction which is perpendicular to the X- and Y-directions and vertical to the drawing surface. That is, the TMR elements in FIG. 19 are actually stacked on each other in a direction vertical to the drawing surface.

A memory cell array 11 has a plurality of TMR elements 12 arranged in the form of an array in the X-, Y-, and Z-directions. In this example, one column is constituted by a plurality of blocks BK.

One block BK is constituted by a plurality of (four in this example) of TMR elements 12 stacked in the Z-direction. A plurality of (four in this example) write word lines WWL0, WWL1, WWL2, and WWL3 which extend in the X-direction and are stacked in the Z-direction are arranged near the TMR elements 12 constituting one block BK.

For example, the write word line WWL0 is placed near the TMR elements (MTJ (Magnetic Tunnel Junction) 0) arranged at the first stage (lowermost stage). The write word line WWL1 is placed near the TMR elements (MTJ1) arranged at the second stage. The write word line WWL3 is placed near the TMR elements (MTJ3) arranged at the fourth stage (uppermost stage).

One end of each of the write word lines WWL0, WWL1, WWL2, and WWL3 is connected to a write word line driver 23A. The other end of each of these lines is connected to a write word line sinker 24.

The plurality of TMR elements 12 arranged in one block in the Z-direction are connected in parallel with each other.

One terminal of each TMR element 12 is connected to a first data transfer line (bit line BLi) 26. One end of the first data transfer line 26 is connected to a common data line 28 via a column select switch (MOS transistor) SWA. The common data line 28 is connected to a read circuit (including a sense amplifier) 29B.

The other terminal of each TMR element 12 is connected to a ground terminal via a read select switch (MOS transistor) RSW. The gate of the read select switch RSW is connected to a read word line RWLo (o=0, 1, 2). One read word line RWLo corresponds to one block BK in one column and is common to a plurality of blocks in the X-direction.

If, for example, one column is constituted by three blocks, the number of read word lines RWLo is three. Each read word line RWLo extends in the X-direction and its one end is connected to a read word line driver 23B.

In write operation, a row decoder 25 selects one of write word lines WWL0, WWL1, . . . , WWL11 on the basis of a row address signal. The write word line driver 23A supplies a write current to the selected write word line. The write current flows through the selected word line and is absorbed by the write word line sinker 24.

In read operation, for example, the row decoder 25 selects one block on the basis of an upper row address signal. The read word line driver 23B applies a read word line voltage to the read word line RWLo connected to the selected block BK. In the selected block BK, since the read select switch RSW is turned on, a read current flows toward the ground terminal via the plurality of TMR elements in the selected block BK.

In this example, write lines 33 which extend in the Y-direction and are used only in write operation are newly arranged in the memory cell array 11. For example, four such write lines 33 may be arranged in correspondence with the four TMR elements 12 in one block. In this example, however, one write line 33 is brought into correspondence with two TMR elements. That is, two write lines 33 are arranged in one block.

One end of the write line 33 is connected to a common driver line 30A via a column select switch (MOS transistor) SWB. The common driver line 30A is connected to a circuit block 29A including a write bit line driver and write bit line sinker.

The other end of the write line 33 is connected to a common driver line 30B via a column select switch (MOS transistor) SWB. The common driver line 30B is connected to a circuit block 31 including a write bit line driver and a write bit line sinker.

A column select signal CSLj (j=0, 1, . . . , 7) is input to the gate of the column select switch SWA. A read column decoder 32A is provided in correspondence with each column select switch SWA and outputs the column select signal CSLj.

A column select line signal CSLjk (j=0, 1, 7; k=0, 1) is input to the gate of the column select switch SWB. A write column decoder 32B is provided in correspondence with each column select switch SWB and outputs the column select line signal CSLjk.

In the magnetic random access memory according to this example, if one block is formed from a group of TMR elements which are connected in parallel with each other, one column is constituted by a set of blocks. With this arrangement, in destructive read operation, the number of TMR elements in one block in which a read current flows can be reduced to increase the difference between initial data and comparison data when cell data differs from trial data, thereby increasing the read margin (or sensitivity).

In Improved Example 4, the plurality of TMR elements (memory cells) in one block are not arranged in the horizontal direction (Y-direction), i.e., a direction parallel to the surface of the semiconductor substrate, but are arranged in the vertical direction (Z-direction), i.e., a direction vertical to the surface of the semiconductor substrate.

As compared with Improved Example 3, Improved Example 4 has an array structure suitable for high integration of TMR elements (memory cells).

(7) Examples of Peripheral Circuits in Improved Examples 3 and 4

① Write Word Line Driver/Sinker

Circuit examples of the write word line driver 23A and write word line sinker 24 in Improved Examples 3 and 4 (FIGS. 17, 18, and 19) will be described first.

The same write word line driver 23A and same write word line sinker 24 can be used in Improved Examples 3 and 4.

Figure 20:
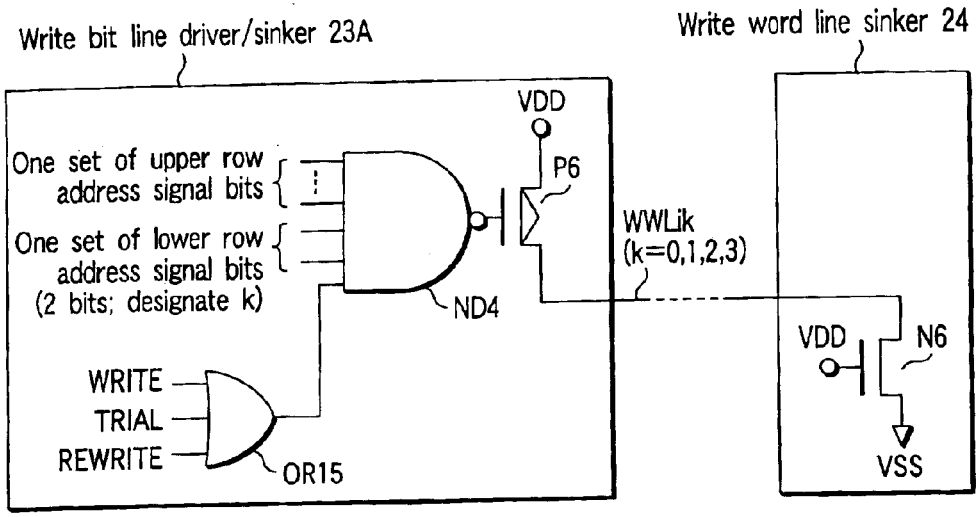
FIG. 20 is a view showing an example of a write word line driver/sinker.

FIG. 20 shows an example of the write word line driver/sinker.

The write word line driver 23A is comprised of an OR circuit OR15, NAND circuit ND4, and PMOS transistor P6. The write word line sinker 24 is formed from an NMOS transistor N6. A power supply potential VDD is input to the gate of the NMOS transistor N6.

A write signal WRITE, trial signal TRIAL, and rewrite signal REWRITE are input to the OR circuit OR15.

The write signal WRITE is a signal that is set at "H" at the time of normal write operation for a selected TMR element. The trial signal TRIAL is a signal that is set at "H" when so-called trial data is written in a selected TMR element at the time of read operation (destructive read operation). The rewrite signal REWRITE is a signal that is set at "H" when correct data is rewritten in a selected TMR element at the time of read operation (destructive read operation).

When one of these three signals WRITE, TRIAL, and REWRITE is set at "H", an output signal from the OR circuit OR15 is set at "H".

The output signal from the OR circuit OR15 and a row address signal (row i) are input to the NAND circuit ND4. When the row i is (write word line WLi) is to be selected, all the bits of the row address signal (row i) are set at "H". If, therefore, the row i is selected and one of the three signals WRITE, TRIAL, and REWRITE is at "H", an output signal from the NAND circuit ND4 is set at "L".

A row address signal is constituted by an upper row address signal and lower row address signal. In this example, an upper row address signal is used to select one of the plurality of blocks in one column. A lower row address signal is used to select one of the plurality of TMR elements in a selected bock.

If, for example, one column is constituted by three or four blocks, a 2-bit signal is used as an upper row address signal. If one block is constituted by four TMR elements, a 2-bit signal is used as a lower row address signal.

When the output signal from the NAND circuit ND4 is set at "L", the PMOS transistor P6 is turned on. As a consequence, a write current flows from the power supply potential VDD to the write word line sinker 24 via the write word line WLi.

Note that since at least one bit of each of row address signals for rows other than the row i is set at "L", no write current flows through the write word lines existing in the rows other than the row i.

② Read Word Line Driver

A circuit example of the read word line driver 23B in Improved Examples 3 and 4 (FIGS. 17, 18, and 19) will be described below.

The same read word line driver 23B can be used in Improved Examples 3 and 4.

Figure 21:
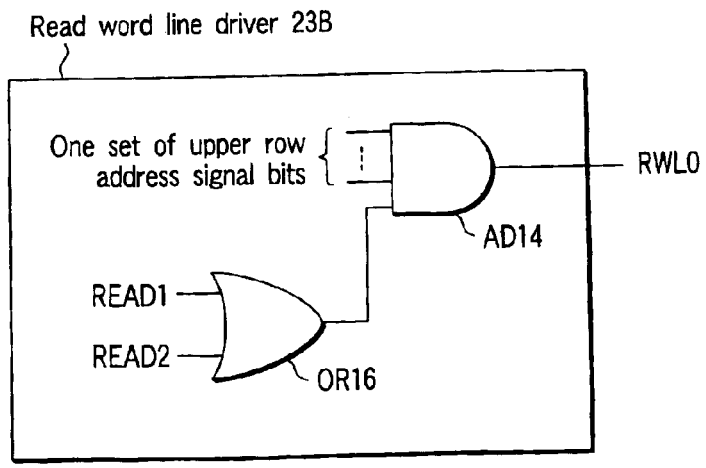
FIG. 21 is a view showing an example of a read word line driver.

FIG. 21 shows an example of the read word line driver.

The read word line driver 23B is comprised of an OR circuit OR16 and AND circuit AD14. Read signals READ1 and READ2 are input to the OR circuit OR16.

The read signals READ1 and READ2 are signals that are set at "H" when the value of the combined resistance of a plurality of TMR elements constituting a selected column is read at the time of read operation (destructive read operation). For example, as described above, according to the normal destructive read operation principle, read operation needs to be performed twice (the first and second cycles in FIG. 2). The read signal READ1 is set at "H" in the first cycle, whereas the read signal READ2 is set at "H" in the third cycle.

When one of the signals READ1 and READ2 is set at "H", an output signal from the OR circuit OR16 is set at "H".

The output signal from the OR circuit OR16 and an upper row address signal (to designate a column m) are input to the AND circuit AD14. When the column m is to be selected, all the bits of the upper row address signal (to designate the column m) are set at "H". If, therefore, the block m is selected and one of the two signals READ1 and READ2 is set at "H", an output signal from the AND circuit AD14 is set at "H".

When the output signal from the AND circuit AD14 is set at "H", a read select switch (NMOS transistor) RSW in a selected block BK is turned on. As a consequence, a read current flows through the plurality of TMR elements in the selected block BK. Obviously, the read select switches RSW in the unselected blocks BK are turned off. Consequently, no read current flows in the plurality of TMR elements in the unselected blocks BK.

Figure 22:
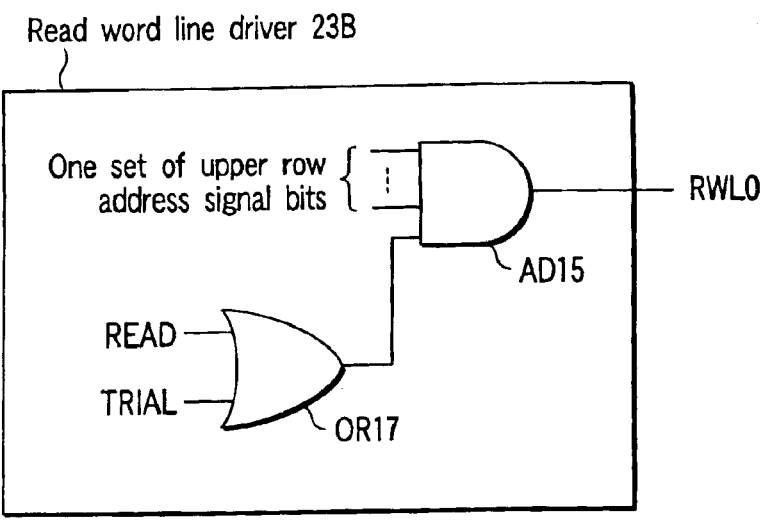
FIG. 22 is a view showing another example of the read word line driver.

FIG. 22 shows another example of the read word line driver.

As compared with the read word line driver in FIG. 21, a read word line driver in this example is characterized in that a read signal READ is added in place of the read signals READ1 and READ2.

This read word line driver is used when a new destructive read operation principle improved from the destructive read operation principle described with reference to FIG. 2 is applied to a magnetic random access memory.

The read word line driver 23B is comprised of an OR circuit OR17 and AND circuit AD15. The read signal READ and trial signal TRIAL are input to the OR circuit OR17.

The read signal READ is a signal that is set at "H" when the value of the combined resistance of the plurality of TMR elements in a selected block is read at the time of read operation (destructive read operation). The trial signal TRIAL is a signal that is set at "H" when so-called trial data is written in a selected TMR element at the time of read operation (destructive read operation).

According to the improved destructive read operation principle, the step of performing second read (comparison data read) and the step of comparing read results (determining the data in a selected TMR element) are performed concurrently with the step of writing the trial data. That is, these operations are simultaneously performed when the trial signal TRIAL is set at "H".

When one of these two signals READ and TRIAL is set at "H", an output signal from the OR circuit OR17 is set at "H".

The output signal from the OR circuit OR17 and an upper row address signal (block m) are input to the AND circuit AD15. When the block m is to be selected, all the bits of the upper row address signal (block m) are set at "H". When, therefore, the block m is selected and one of the two signals READ and TRIAL is set at "H", an output signal from the AND circuit AD15 is set at "H".

When the output signal from the AND circuit AD15 is set at "H", the read select switch (NMOS transistor) RSW in the selected block BK is turned on. As a consequence, a read current flows through the plurality of TMR elements in the selected block BK. Obviously, the read select switches RSW in the unselected blocks BK are turned off. Therefore, no read current flows through the plurality of TMR elements in the unselected blocks BK.

③ Row Decoder

A circuit example of the row decoder 25 in Improved Examples 3 and 4 (FIGS. 17, 18, and 19) will be described below. The same row decoder 25 can be used in Improved Examples 3 and 4.

Figure 30:
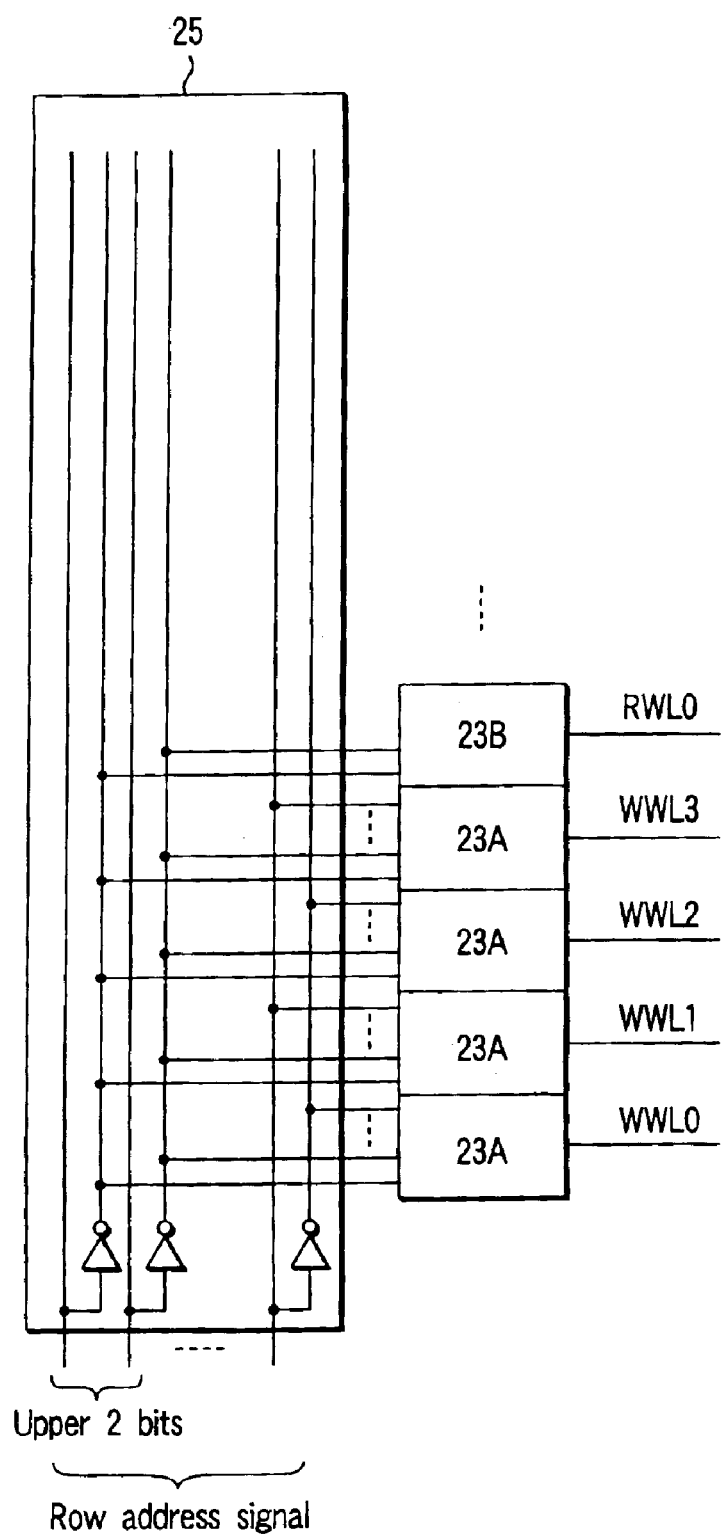
FIG. 30 is a view showing an example of a row decoder.

FIG. 30 shows an example of the row decoder.

The row decoder 25 decodes a row address signal and sets all the bits of a row address signal supplied to a write word line driver 23A in a selected row i to "1". The row decoder 25 also sets all the bits (2 bits in this example) of an upper row address signal supplied to a read word line driver 23B corresponding to a selected block BK to "1".

④ Column Decoder

A circuit example of the column decoder 32 in Improved Example 3 (FIGS. 17 and 18) will be described below.

Figure 23:
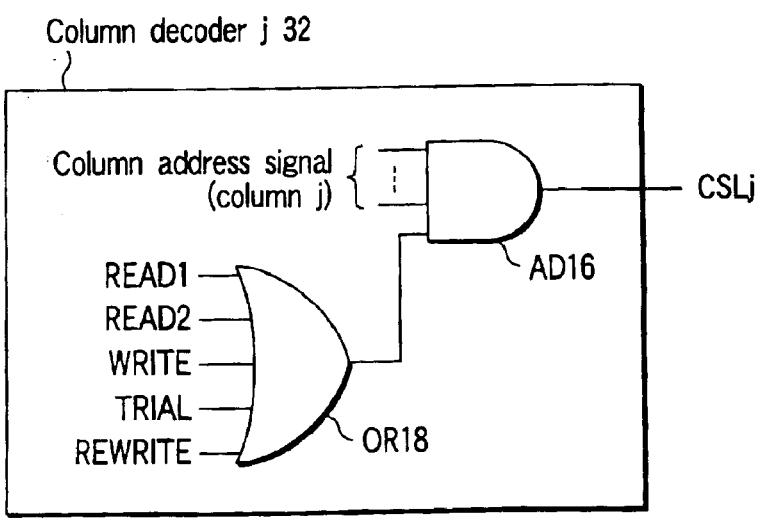
FIG. 23 is a view showing an example of a column decoder.

FIG. 23 shows an example of the column decoder.

The column decoder 32 is comprised of an OR circuit OR18 and AND circuit AD16. Read signals READ1 and READ2, write signal WRITE, trial signal TRIAL, and rewrite signal REWRITE are input to the OR circuit OR18.

The write signal WRITE, trial signal TRIAL, and rewrite signal REWRITE are identical to the write signal WRITE, trial signal TRIAL, and rewrite signal REWRITE input to the write word line driver 23A in FIG. 20.

The read signals READ1 and READ2 are set at "H" when the value of the combined resistance of the plurality of TMR elements constituting a selected column is read at the time of read operation (destructive read operation).

When one of these five signals READ1, READ2, WRITE, TRIAL, and REWRITE is set at "H", an output signal from the OR circuit OR18 is set at "H".

The output signal from the OR circuit OR18 and a column address signal (to designate a column j) are input to the AND circuit AD16. When the column j (bit line BLj) is to be selected, all the bits of the column address signal (to designate the column j) are set at "H". When, therefore, the column j is selected and one of the five signals READ1, READ2, WRITE, TRIAL, and REWRITE is set at "H", an output signal from the AND circuit AD16 is set at "H".

When the output signal from the AND circuit AD16 is set at "H", a column select switch (NMOS transistor) SW in FIG. 18 is turned on. As a consequence, in write operation, a write current flows through the bit line BLj. In read operation, a read current flows through a plurality of TMR elements.

Figure 24:
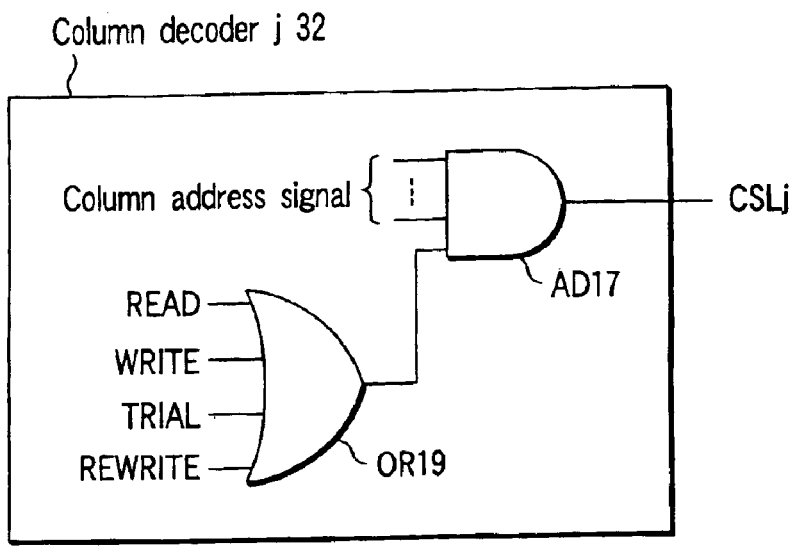
FIG. 24 is a view showing another example of the column decoder.

FIG. 24 shows another example of the column decoder.

As compared with the column decoder 32 in FIG. 23, a column decoder 32 in FIG. 24 is characterized in that a read signal READ is added in place of the read signals READ1 and READ2.

This column decoder 32 is used when the improved destructive read operation principle is applied to a magnetic random access memory. In this improved destructive read operation principle, for example, the second and third cycles in FIG. 2 are integrated into one cycle.

For example, therefore, the read signal READ is input to the column decoder 32 in place of the two read signals READ1 and READ2.

⑤ Read/Write Column Decoder

Circuit examples of the read and write column decoders 32A and 32B in Improved Example 4 (FIG. 19) will be described below.

Figure 25:
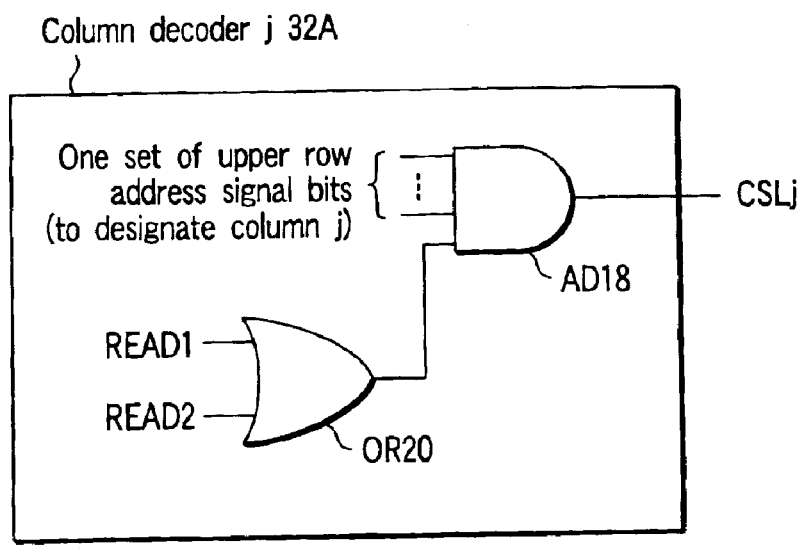
FIG. 25 is a view showing an example of a read column decoder.

FIG. 25 shows an example of the read column decoder.

The read column decoder 32A is comprised of an OR circuit OR20 and AND circuit AD18. Read signals READ1 and READ2 are input to the OR circuit OR20.

The read signals READ1 and READ2 are signals that are set at "H" when the value of the combined resistance of a plurality of TMR elements constituting a selected column is read at the time of read operation (destructive read operation).

When one of these two signals READ1 and READ2 is set at "H", an output signal from the OR circuit OR20 is set at "H".

The output signal from the OR circuit OR20 and a column address signal (to designate a column j) are input to the write select switch 18. When the column j (bit line BLj) is to be selected, all the bits of the column address signal (to designate the column j) are set at "H".

When, therefore, the column j is selected and one of the two signals READ1 and READ2 is set at "H", an output signal from the AND circuit AD18 is set at "H".

When the output signal from the AND circuit AD18 is set at "H", a column select switch (NMOS transistor) SWA in FIG. 19 is turned on. As a consequence, in read operation, a read current flows through a plurality of TMR elements.

Figure 26:
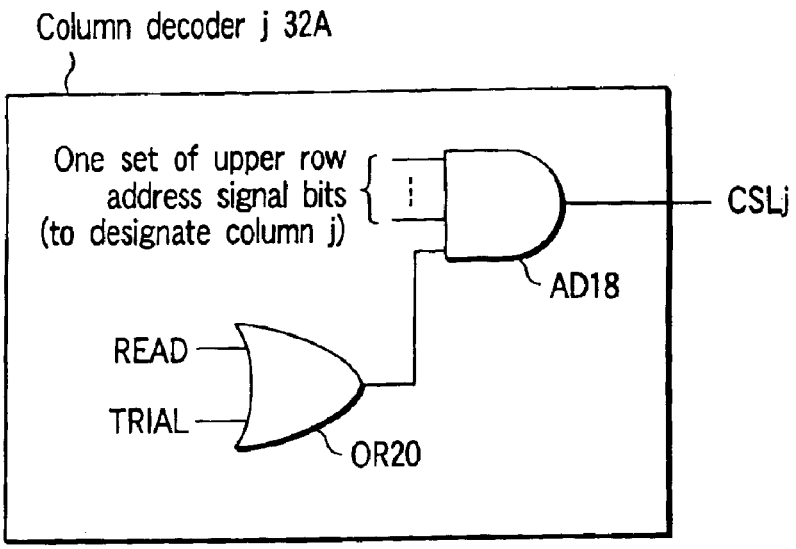
FIG. 26 is a view showing another example of the read column decoder.

FIG. 26 shows another example of the read column decoder.

As compared with the read column decoder 32A in FIG. 25, a read column decoder 32A in FIG. 26 is characterized in that a read signal READ and trial signal TRIAL are added in place of the read signals READ1 and READ2.

This read column decoder 32A is used when the improved destructive read operation principle is applied to a magnetic random access memory.

Figure 27:
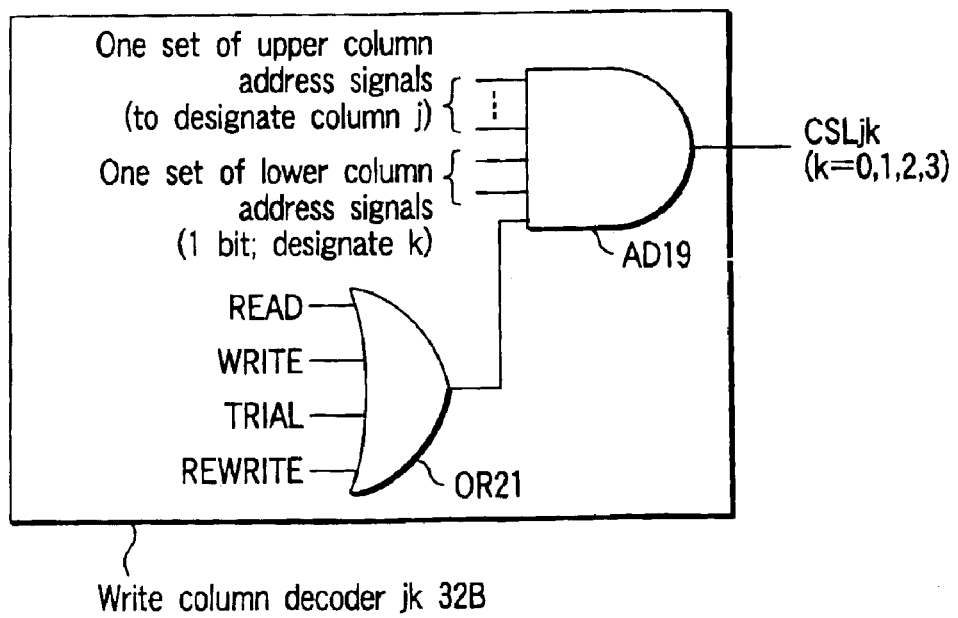
FIG. 27 is a view showing an example of a write column decoder.

FIG. 27 shows an example of the write column decoder.

A write column decoder 32B is comprised of an OR circuit OR21 and AND circuit AD19. A write signal WRITE, trial signal TRIAL, and rewrite signal REWRITE are input to the OR circuit OR21.

The write signal WRITE, trial signal TRIAL, and rewrite signal REWRITE are identical to the write signal WRITE, trial signal TRIAL, and rewrite signal REWRITE input to the write word line driver 23A in FIG. 20.

When one of these three write signal WRITE, trial signal TRIAL, and rewrite signal REWRITE is set at "H", an output signal from the OR circuit OR21 is set at "H".

The output signal from the OR circuit OR21 and a column address signal (to designate a column j) are input to the AND circuit AD19. The column address signal is formed from an upper column address signal and lower column address signal.

The upper column address signal selects one column. The lower column address signal is used to select a plurality of TMR elements which are present in the selected column and stacked in the Z-direction. In the example shown in FIG. 19, four TMR elements are stacked on each other in the Z-direction, and two write lines 33 are provided to select them. For this reason, the lower column address signal is a 1-bit signal.

When the TMR elements at the (k+1)th stage in the column j are selected by a column address signal and one of the three signals WRITE, TRIAL, and REWRITE is at "H", an output signal from the AND circuit AD19 is set at "H".

When the output signal from the AND circuit AD19 is set at "H", i.e., a column select line signal CSLjk is set at "H", a column select switch (NMOS transistor) SWB in FIG. 19 is turned on. As a consequence, in write operation, a write current flows through one of the write lines 33 in FIG. 19.

Note that the write column decoder in FIG. 27 can also be used when either the normal destructive read operation principle or the new destructive read operation principle is applied to a magnetic random access memory.

⑥ Write Bit Line Driver/Sinker

Circuit examples of the write bit line drivers/sinkers 29 and 31 in Improved Examples 3 and 4 (FIGS. 17, 18, and 19) will be described below.

Figure 28:
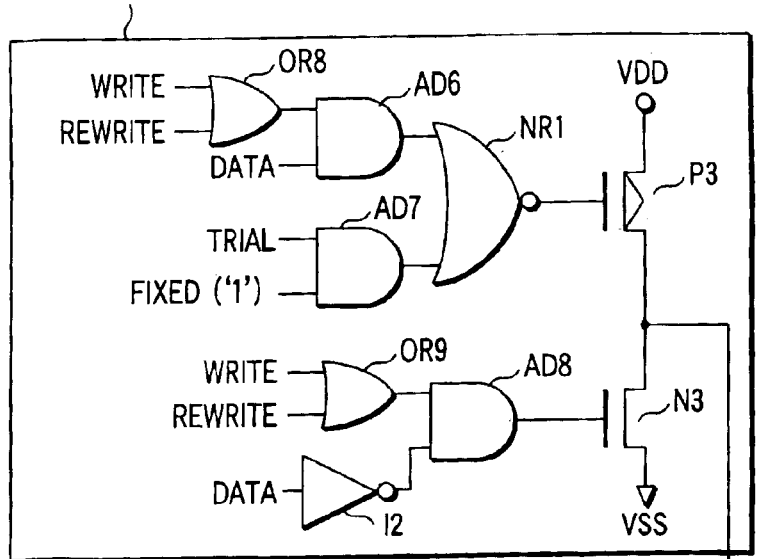
FIG. 28 is a view showing an example of a write bit line driver/sinker.
Figure 28:
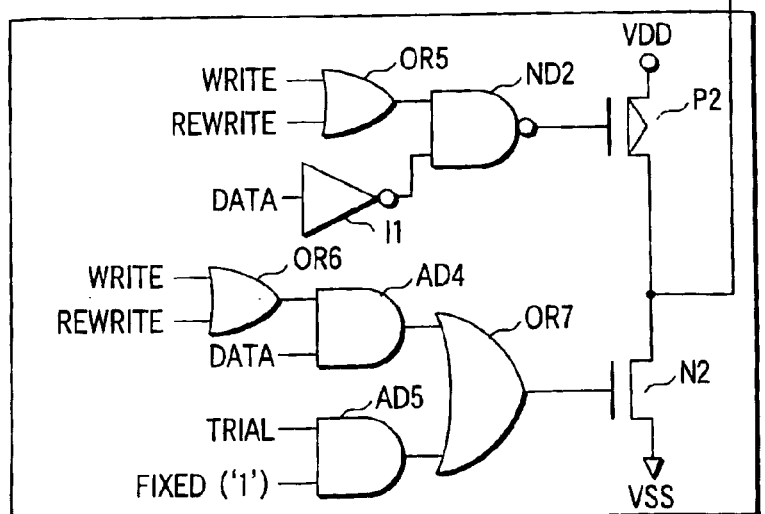

The same write bit line driver/sinker 29 and 31 can be used in Improved Examples 3 and 4. A. FIG. 28 shows an example of the write bit line driver/sinker.

The write bit line driver/sinker in this example corresponds to a case where so-called trial data to be written in a selected TMR element in the second cycle in the destructive read operation principle (see, for example, FIG. 2) is "1".

a. Write Bit Line Driver/Sinker 29

The write bit line driver/sinker 29 is comprised of OR circuits OR5, OR6, and OR7, AND circuits AD4 and AD5, NAND circuit ND2, inverter circuit I1, PMOS transistor P2, and NMOS transistor N2.

The write bit line driver is comprised of the OR circuit OR5, NAND circuit ND2, inverter circuit I1, and PMOS transistor P2. A write signal WRITE and rewrite signal REWRITE are input to the OR circuit OR5.

The write signal WRITE is a signal that is set at "H" at the time of normal write operation for a selected TMR element. The rewrite signal REWRITE is a signal that is set at "H" when correct data is to be rewritten in a selected TMR element after read operation (destructive read operation).

When one of the two signals WRITE and REWRITE is set at "H", an output signal from the OR circuit OR5 is set at "H".

Write data DATA is input to the inverter circuit I1. In this case, write data means normal write data (including rewrite data) excluding trial data.

Output signals from the OR circuit OR5 and inverter circuit I1 are input to the NAND circuit ND2. Assume that the output signal from the OR circuit OR5 is at "H". In this case, if the data DATA is "1", since the output signal from the inverter circuit I1 is set at "L", an output signal from the NAND circuit ND2 is set at "H". If the data DATA is "0", since the output signal from the inverter circuit I1 is set t "H", the output signal from the NAND circuit ND2 is set at "L".

Note that "1" and "0" respectively correspond to "H" and "L".

If the output signal from the NAND circuit ND2 is at "H", the PMOS transistor P2 is turned off. If the output signal from the NAND circuit ND2 is at "L", the PMOS transistor PMOS transistor P2 is turned on.

The write bit line sinker is comprised of the OR circuits OR6 and OR7, AND circuits AD4 and AD5, and NMOS transistor N2. The write signal WRITE and rewrite signal REWRITE are input to the OR circuit OR6. When one of these two signals WRITE and REWRITE is set at "H", an output signal from the OR circuit OR6 is set at "H".

The output signal from the OR circuit OR6 and data DATA are input to the AND circuit AD4.

Assume that the output signal from the OR circuit OR6 is at "H". In this case, if the data DATA is "1", an output signal from the AND circuit AD4 is set at "H". If the data DATA is "0", the output signal from the AND circuit AD4 is set at "L".

The trial signal TRIAL is input to the AND circuit AD5. The trial signal TRIAL is a signal that is set at "H" when trial data is to be written in a selected TMR element at the time of read operation (destructive read operation). The AND circuit AD5 has two input terminals. The trial signal TRIAL is input to one of the input terminals, while the other terminal is always fixed to "1".

The output signal from the OR circuit OR7 is set at "H" when one of output signals from the two AND circuits AD4 and AD5 is at "H". That is, when one of the two signals WRITE and REWRITE is at "H" and the data DATA is "1", the output signal from OR circuit OR7 is set at "H". When the output signal from the OR circuit OR7 is set at "H", the NMOS transistor N2 is turned on.

When the trial signal TRIAL is set at "H" as well, the output signal from the OR circuit OR7 is set at "H", and the NMOS transistor N2 is turned on. That is, when the trial data is "1", a current flows through the write lines 26 and 33 from the write bit line driver/sinker 31 to the write bit line driver/sinker 29.

b. Write Bit Line Driver/Sinker 31

The write bit line driver/sinker 31 is comprised of OR circuits OR8 and OR9, AND circuits AD6, AD7, and AD8, NOR circuit NR1, inverter circuit I2, PMOS transistor P3, and NMOS transistor N3.

The write bit line driver is comprised of the OR circuit OR8, AND circuits AD6 and AD7, NOR circuit NR1, and PMOS transistor P3. A write signal WRITE and rewrite signal REWRITE are input to the OR circuit OR8. When one of these two signals WRITE and REWRITE is set at "H", an output signal from the OR circuit OR8 is set at "H".

The output signal from the OR circuit OR8 and data DATA are input to the AND circuit AD6. Assume that an output signal from the OR circuit OR8 is at "H". In this case, if the write data DATA is "1", an output signal from the AND circuit AD6 is set at "H". If the write data DATA is "0", the output signal from the AND circuit AD6 is set at "L".

The trial signal TRIAL is input to the AND circuit AD7. As described above, the trial signal TRIAL is a signal that is set at "H" when trial data is to be written in a selected TMR element at the time of destructive read operation. The AND circuit AD7 has two input terminals. The trial signal TRIAL is input to one of the input terminals, while the other terminal is always fixed to "1".

The output signal from the NOR circuit NR1 is set at "L" when one of output signals from the two AND circuits AD6 and AD7 is at "H". That is, when one of the two signals WRITE and REWRITE is at "H" and the data DATA is "1", the output signal from NOR circuit NR1 is set at "L". When the output signal from the NOR circuit NR1 is set at "L", the PMOS transistor P3 is turned on.

When the trial signal TRIAL is set at "H" as well, the output signal from the NOR circuit NR1 is set at "L", and the PMOS transistor P3 is turned on. That is, when the trial data is "1", a current flows through the write lines 26 and 33 from the write bit line driver/sinker 31 to the write bit line driver/sinker 29.

The write bit line sinker is comprised of the OR circuit OR9, AND circuit AD8, inverter circuit I2, and NMOS transistor N3. The write signal WRITE and rewrite signal REWRITE are input to the OR circuit OR9. When one of these two signals WRITE and REWRITE is set at "H", an output signal from the OR circuit OR9 is set at "H".

The write data DATA is input to the inverter circuit I2. The output signal from the OR circuit OR9 and an output signal from the inverter circuit I2 are input to the AND circuit AD8.

Assume that the output signal from the OR circuit OR9 is at "H". In this case, if the write data DATA is "1", an output signal from the AND circuit AD8 is set at "L". If the write data DATA is "0", the output signal from the AND circuit AD8 is set at "H". When an output signal from the AND circuit AD8 is at "L", the NMOS transistor N3 is turned off. When the output signal from the AND circuit AD8 is at "H", the NMOS transistor N3 is turned on.

c. As described above, in the write bit line driver/sinker in FIG. 12, when write operation is performed, i.e., one of the signals WRITE and REWRITE is at "H", the direction of a write current flowing through the write lines 26 and 33 is determined in accordance with the value ("1" or "0") of the write data DATA.

In read operation as well, when trial data is written in a TMR element, the trial signal TRIAL is set at "H". In this example, therefore, a write current flows through the write lines 26 and 33 from the write bit line driver/sinker 31 to the write bit line driver/sinker 29. At this time, trial data "1" is written in the selected TMR element.

Figure 29:
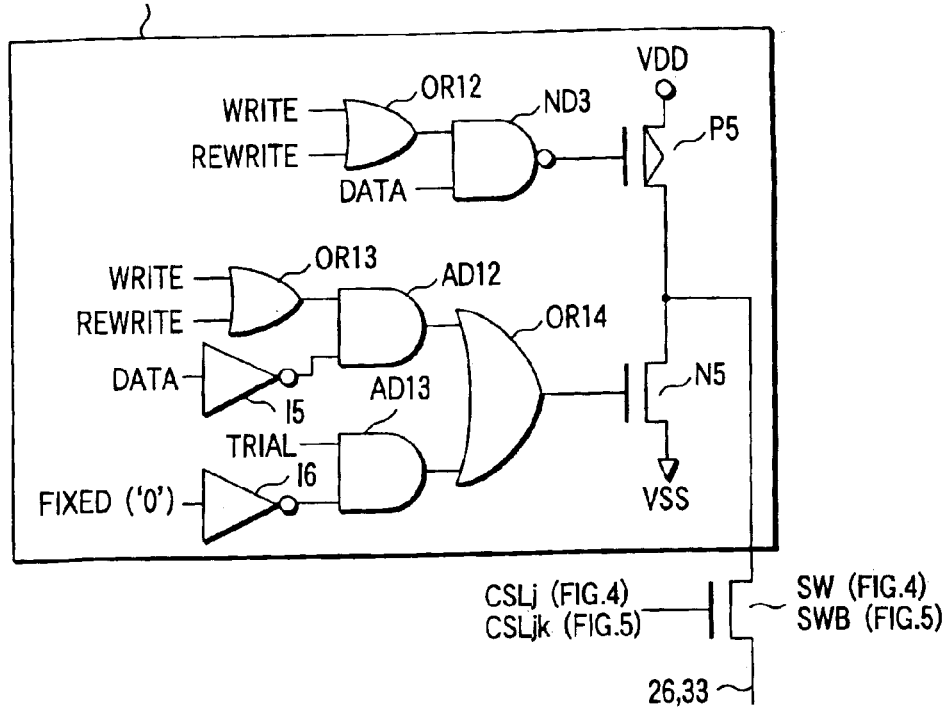
FIG. 29 is a view showing another example of the write bit line driver/sinker.
Figure 29:
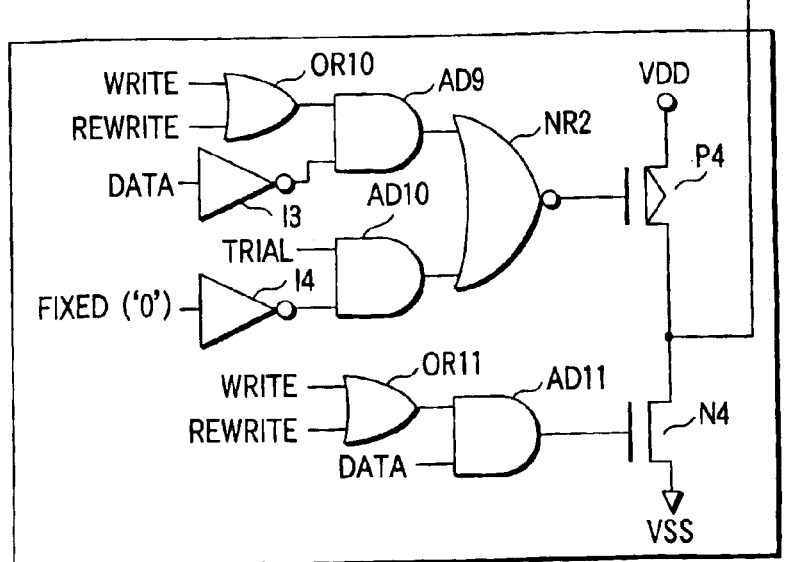

B. FIG. 29 shows another example of the write bit line driver/sinker.

The write bit line driver/sinker according to this example corresponds to a case where so-called trial data to be written in a selected TMR element in the second cycle of the destructive read operation principle (see, for example, FIG. 2) is "0".

a. Write Bit Line Driver/Sinker 29

The write bit line driver/sinker 29 is comprised of OR circuits OR10 and OR11, AND circuits AD9, AD10, and AD11, NOR circuit NR2, inverter circuits I3 and I4, PMOS transistor P4, and NMOS transistor N4.

The write bit line driver is comprised of the OR circuit OR10, AND circuits AD9 and AD10, NOR circuit NR2, inverter circuits I3 and I4, and PMOS transistor P4. A write signal WRITE and rewrite signal REWRITE are input to the OR circuit OR10. When one of these two signals WRITE and REWRITE is set at "H", an output signal from the OR circuit OR10 is set at "H".

The write data DATA is input to the inverter circuit I3. The output signal from the OR circuit OR10 and an output signal from the inverter circuit I3 are input to the AND circuit AD9. Assume that the output signal from the OR circuit OR10 is at "H". In this case, if the write data DATA is "1", an output signal from the AND circuit AD9 is set at "L". If the write data DATA is "0", the output signal from the AND circuit AD9 is set at "H".

The trial signal TRIAL is input to the AND circuit AD10. The trial signal TRIAL is a signal that is set at "H" when trial data is to be written in a selected TMR element at the time of destructive read operation. The AND circuit AD10 has two input terminals. The trial signal TRIAL is input to one of the input terminals, while the other terminal is always fixed to "1".

The output signal from the NOR circuit NR2 is set at "L" when one of output signals from the two AND circuits AD9 and AD10 is at "H". That is, when one of the two signals WRITE and REWRITE is at "H" and the data DATA is "1", the output signal from NOR circuit NR2 is set at "L". When the output signal from the NOR circuit NR2 is set at "L", the PMOS transistor P4 is turned on.

When the trial signal TRIAL is set at "H" as well, the output signal from the NOR circuit NR2 is set at "L", and the PMOS transistor P4 is turned on. That is, when the trial data is "0", a current flows through the write lines 26 and 33 from the write bit line driver/sinker 29 to the write bit line driver/sinker 31.

The write bit line sinker is comprised of the OR circuit OR11, AND circuit AD11, and NMOS transistor N4. The write signal WRITE and rewrite signal REWRITE are input to the OR circuit OR11. When one of these two signals WRITE and REWRITE is set at "H", an output signal from the OR circuit OR11 is set at "H".

The output signal from the OR circuit OR11 and the write data DATA are input to the AND circuit AD11.

Assume that the output signal from the OR circuit OR11 is at "H". In this case, if the write data DATA is "1", an output signal from the AND circuit AD11 is set at "H". If the write data DATA is "0", the output signal from the AND circuit AD11 is set at "L". If the output signal from the AND circuit AD11 is at "H", the NMOS transistor N4 is turned on. If the output signal from the AND circuit AD11 is at "L", the NMOS transistor N4 is turned off.

b. Write Bit Line Driver/Sinker 31

The write bit line driver/sinker 31 is comprised of OR circuits OR12, OR13, and OR14, AND circuits AD12 and AD13, NAND circuit ND3, inverter circuits I5 and I6, PMOS transistor P5, and NMOS transistor N5.

The write bit line driver is comprised of the OR circuit OR12, NAND circuit ND3, and PMOS transistor P5. A write signal WRITE and rewrite signal REWRITE are input to the OR circuit OR12. When one of these two signals WRITE and REWRITE is set at "H", an output signal from the OR circuit OR12 is set at "H".

The output signal from the OR circuit OR12 and data DATA are input to the NAND circuit ND2. Assume that an output signal from the OR circuit OR12 is at "H". In this case, if the write data DATA is "1", an output signal from the NAND circuit ND3 is set at "L". If the write data DATA is "0", the output signal from the NAND circuit ND3 is set at "H".

If the output signal from the NAND circuit ND3 is at "L", the PMOS transistor P5 is turned on. If the output signal from the NAND circuit ND3 is at "H", the PMOS transistor P5 is turned off.

The write bit line sinker is comprised of the OR circuits OR13 and OR14, AND circuits AD12 and AD13, inverter circuits I5 and I6, and NMOS transistor N5. The write signal WRITE and rewrite signal REWRITE are input to the OR circuit OR13. When one of these two signals WRITE and REWRITE is set at "H", an output signal from the OR circuit OR13 is set at "H".

Write data DATA is input to the inverter circuit I5. The output signal from the OR circuit OR13 and an output signal from the inverter circuit I5 are input to the AND circuit AD12.

Assume that the output signal from the OR circuit OR13 is at "H". In this case, if the write data DATA is "1", an output signal from the AND circuit AD12 is set at "L". If the write data DATA is "0", the output signal from the AND circuit AD12 is set at "H".

A trial signal TRIAL is input to the AND circuit AD13. The trial signal TRIAL is a signal that is set at "H" when so-called trial data is written in a selected TMR element at the time of read operation (destructive read operation). The AND circuit AD13 has two input terminals. The trial signal TRIAL is input to one of the input terminals, while the other terminal is always fixed to "1" because the input signal to the inverter circuit I6 is fixed to "0".

The output signal from the OR circuit OR14 is set at "H" when one of output signals from the two AND circuits AD12 and AD13 is at "H". That is, when one of the two signals WRITE and REWRITE is at "H" and the data DATA is "0", the output signal from OR circuit OR14 is set at "H". When the output signal from the OR circuit OR14 is set at "H", the NMOS transistor N5 is turned on.

When the trial signal TRIAL is set at "H" as well, the output signal from the OR circuit OR14 is set at "H", and the NMOS transistor N5 is turned on. That is, when the trial data is "0", a current flows through the write lines 26 and 33 from the write bit line driver/sinker 29 to the write bit line driver/sinker 31.

c. As described above, in the write bit line driver/sinker in FIG. 29, when trial data is written in a TMR element in read operation, the trial signal TRIAL is set at "H" to cause a write current flowing from the write bit line driver/sinker 29 to the write bit line driver/sinker 31 to flow through the write lines 26 and 33.

That is, in the example shown in FIG. 28, trial data to be written in a TMR element is "1", whereas in the example shown in FIG. 29, trial data to be written in a TMR element is "0".

Note that in normal write operation, since one of the signals WRITE and REWRITE is set at "H" (the trial signal TRIAL is set at "L"), the direction of a write current flowing through the write lines 26 and 33 is determined in accordance with the value of the write data DATA ("1" or "0").

(8) Principle of Read Operation Using Improved Examples 3 and 4

The arrangements of Improved Examples 3 and 4 have been described in detail above. The principle of read operation using Improved Examples 3 and 4 will be described below.

① Read Operation Principle 1

Figure 31:
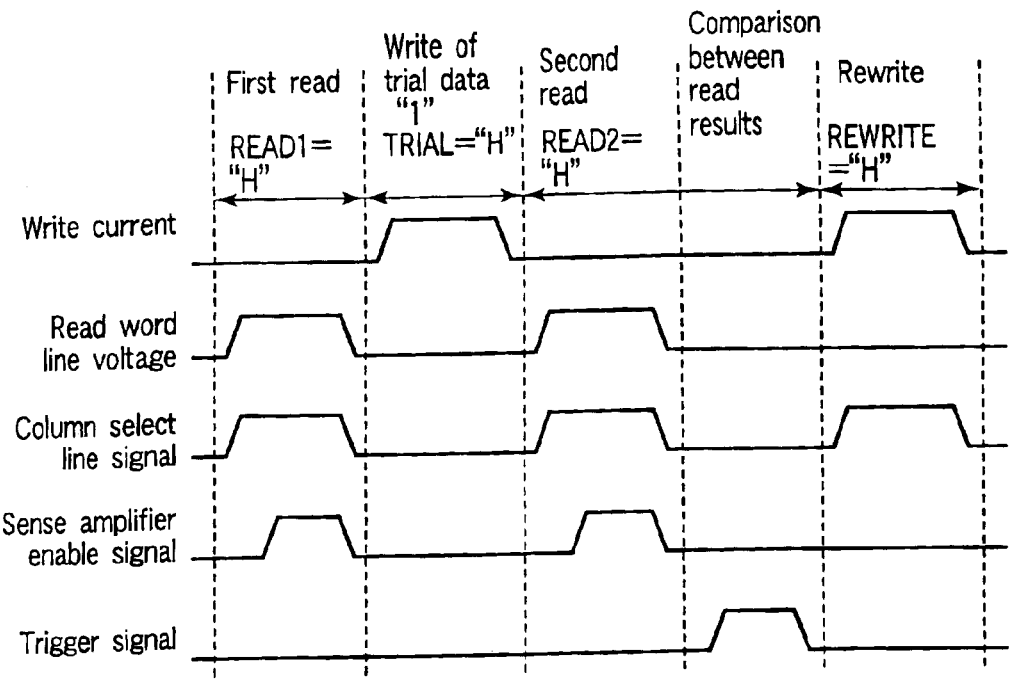
FIG. 31 is a timing chart showing an example of a destructive read operation principle in Improved Examples 3 and 4.

FIG. 31 is a timing chart showing read operation principle 1.

This read operation principle is associated with the read operation principle shown in FIG. 2. In this case, however, one read operation is constituted by five steps. That is, in this example, the step of comparing read results is inserted between the second read step and the rewrite step.

In Improved Example 3 shown in FIGS. 17 and 18, the circuits used in executing this read operation principle are the write word line driver/sinker in FIG. 20, read word line driver shown in FIG. 21, the column decoder in FIG. 23, and the write bit line driver/sinker (trial data "1") in FIG. 28.

In Improved Example 4 shown in FIG. 19, the write word line driver/sinker in FIG. 20, the read word line driver in FIG. 21, the read column decoder in FIG. 25, the write column decoder shown in FIG. 27, and the write bit line driver/sinker (trial data "1") in FIG. 28 are used.

A. First Step

In the first step, initial data is read (first read).

In this step, the read signal READ1 is set at "H".

In Improved Example 3, therefore, in a selected column in which all the bits of a column address signal are "1", the column select signal CSLj (FIG. 23) is set at "H". In Improved Example 4, in a selected column in which all the bits of an upper column address signal are "1", the column select signal CSLj (FIG. 25) is set at "H".

In addition, in Improved Examples 3 and 4, the output signal RWLo from the read word line driver 23B (FIG. 21) for which all the bits of an upper row address signal are "1" is set at "H". The read select switch RSW in the selected block BK which receives this output signal RWL0 is turned on.

In addition, a sense amplifier enable signal is set at "H" to activate the sense amplifier. As a result, in Improved Example 3 in FIG. 18, the read current generated by the current source in the read circuit in the circuit block 29 flows to the ground terminal via the plurality of TMR elements in the selected block BK. In Improved Example 4 in FIG. 19, the read current generated by the current source in the read circuit 29B flows to the ground terminal via the plurality of TMR elements of the selected block BK.

The read circuit detects initial data while a read current is flowing. The initial data depends on the combined resistance of the plurality of TMR elements which constituted the selected column and are connected in parallel with each other. The initial data is stored in the storage circuit in the sense amplifier.

B. Second Step

In the second step, trial data is written in a selected TMR element. In this example, the trial data is "1".

In this step, the trial signal TRIAL is set at "H".

In Improved Examples 3 and 4, therefore, in a selected row in which all the bits of a row address signal are "1", the PMOS transistor P6 (FIG. 20) in the write word line driver is turned on. As a consequence, a write current flows through the write word line in the selected row.

In Improved Example 3, in a column in which all the bits of a column address signal are "1", the column select line signal CSLj (FIG. 23) is set at "H". In Improved Example 4, the column select line signal CSLjk (FIG. 27) is set at "H" in a column in which all the bits of an upper column address signal are "1" and at a stage where all the bits of a lower column address signal are "1".

That is, in Improved Example 3, the column select switch SW in a selected column is turned on. In Improved Example 4, the column select switch SWB corresponding to a selected stage in a selected column is turned on.

In the write bit line driver/sinker in FIG. 28, since the trial signal TRIAL is at "H", NMOS transistor N2 is set in the ON state. In the write bit line driver/sinker 31 in FIG. 28, since the trial signal TRIAL is at "H", the PMOS transistor P2 is set in the ON state.

In Improved Example 3 in FIG. 18, therefore a write current flows through the write line 26 in the selected column from the write bit line driver/sinker 31 to the write bit line driver/sinker 29. In Improved Example 4 in FIG. 19, a write current flows through the write line 33 in the selected stage in the selected column from the write bit line driver/sinker 31 to the write bit line driver/sinker 29.

As a consequence, the trial data ("1") is written in the selected TMR element. Thereafter, the column select switches SW and SWB are turned off to block the write current. In addition, the write current flowing through the write word line in the selected row is blocked.

C. Third Step

In the third step, comparison data is read (second read).

In this step, the read signal READ2 is set at "H".

In Improved Example 3, therefore, in a selected column in which all the bits of a column address signal are "1", the column select line signal CSLj (FIG. 23) is set at "H". In addition, in Improved Example 4, in a column in which all the bits of an upper column address signal are "1", the column select line signal CSLj (FIG. 25) is set at "H".

In addition, in Improved Examples 3 and 4, the output signal RWL0 from the read word line driver 23B (FIG. 21) for which all the bits of an upper row address signal are "1" is set at "H". The read select switch RSW in the selected block BK which receives this output signal RWL0 is turned on.

In addition, a sense amplifier enable signal is set at "H" to activate the sense amplifier. As a consequence, in Improved Example 3 in FIG. 18, the read current generated by the current source in the read circuit in the circuit block 29 flows to the ground terminal via the plurality of TMR elements in the selected block BK. In Improved Example 4 in FIG. 19, the read current generated by the current source in the read circuit 29B flows to the ground terminal via the plurality of TMR elements in the selected block BK.

The read circuit detects comparison data while the read current flows. The comparison data depends on the combined resistance of the plurality of TMR elements which constitute the selected column and are connected in parallel with each other.

D. Fourth Step

In the fourth step, the initial data is compared with the comparison data to determine the value of the data in the selected TMR element.

More specifically, if it is determined that the initial data coincides with the comparison data, since it indicates that the resistance value of the TMR element has not changed upon writing of the trial data in the second step, it is determined that the value of the data in the selected TMR element is equal to that of the trial data.

In contrast to this, if it is determined that the initial data differs from the comparison data, since it indicates that the resistance value of the selected TMR element has changed upon writing of the trial data in the second step, it is determined that the value of the data in the selected TMR element has an opposite value to that of the trial data.

In this example, since the trial data is assumed to be "1", if the initial data coincides with the comparison data, it is determined the data in the selected TMR element is "1". If the initial data differs from the comparison data, it is determined that the data in the selected TMR element is "0".

In this manner, the value of the data in the selected TMR element is determined.

In the fourth step, the results obtained by two read operations are compared on the basis of a trigger signal. In this example, a column select line signal and sense amplifier enable signal are set at "L" immediately before the trigger signal is set at "H".

Figure 32:
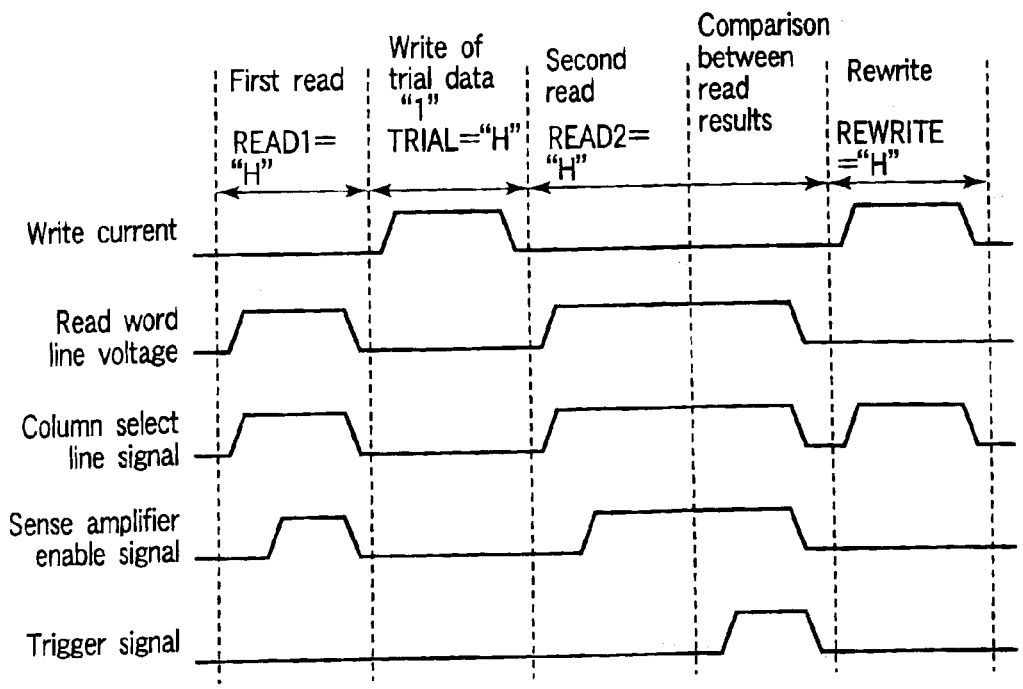
FIG. 32 is a timing chart showing another example of the destructive read operation principle in Improved Examples 3 and 4.

As shown in the timing chart of FIG. 32, the column select line signal and sense amplifier enable signal may be kept at "H" level throughout the third and fourth steps.

The detailed arrangement of a circuit for executing the fourth step, i.e., a read circuit (including a sense amplifier), will be described in detail later.

E. Fifth Step

In the fifth step, data is rewritten in a selected TMR element. According to the read operation principle in this example, in the second step, the trial data is written in the selected TMR element. At this time, the data in the selected TMR element is destroyed.

After the value of the data in the selected TMR element is determined, therefore, data is rewritten in the selected TMR element.

In this step, the rewrite signal REWRITE is set at "H".

In Improved Examples 1 and 2, in a row in which all the bits of a row address signal are "1", the PMOS transistor P6 (FIG. 20) in the write word line driver is turned on. As a consequence, a write current flows through the write word line in the selected row.

In Improved Example 3, in a column in which all the bits of a column address signal are "1", the column select line signal CSLj (FIG. 23) is set at "H". In Improved Example 2, the column select line signal CSLjk (FIG. 27) is set at "H" in a column in which all the bits of an upper column address signal are "1" and at a stage where all the bits of a lower column address signal are "1".

That is, in Improved Example 3, the column select switch SW in the selected column is turned on. In Improved Example 4, the column select switch SWB corresponding to the selected stage in the selected column is turned on.

In the write bit line driver/sinker 29 in FIG. 28, since the rewrite signal REWRITE is at "H", the ON/OFF states of the MOS transistors P2 and N2 are determined in accordance with the value of the rewrite data DATA. In the write bit line driver/sinker 31 in FIG. 28 as well, since the rewrite signal REWRITE is at "H", the ON/OFF states of the MOS transistors P3 and N3 are determined in accordance with the value of the rewrite data DATA.

In Improved Example 3 in FIG. 18, therefore, a write current flows through the write line 26 in the selected column toward the write bit line driver/sinker 29 or 31 in accordance with the value of the rewrite data DATA.

In Improved Example 4 in FIG. 19, a write current flows through the write line 33 in the selected stage in the selected column toward the write bit line driver/sinker 29 or 31 in accordance with the value of the rewrite data DATA.

As a consequence, the data ("1" or "0") which has been stored in the selected TMR element before the execution of the above read operation is rewritten in the selected TMR element. After this operation, the column select switches SW and SWB are turned off to block the write current. In addition, the write current flowing through the write word line in the selected row is blocked.

If it is determined in the fourth step that the initial data coincides with the comparison data, the data that has been stored in the selected TMR element has the same value as that of the trial data. In this case, therefore, the fifth step may be omitted.

That is, only when it is determined in the fourth step that the initial data differs from the comparison data, data having an opposite value to that of the trial data may be rewritten in the selected TMR element in the fifth step.

As described above, the magnetic random access memories according to Improved Examples 3 and 4 can use the so-called destructive read operation principle and actually execute it. Therefore, the resistance value (or MR ratio) of a selected TMR element can be accurately read regardless of variations in resistance among a plurality of TMR elements in read operation.

② Read Operation Principle 2

Figure 33:
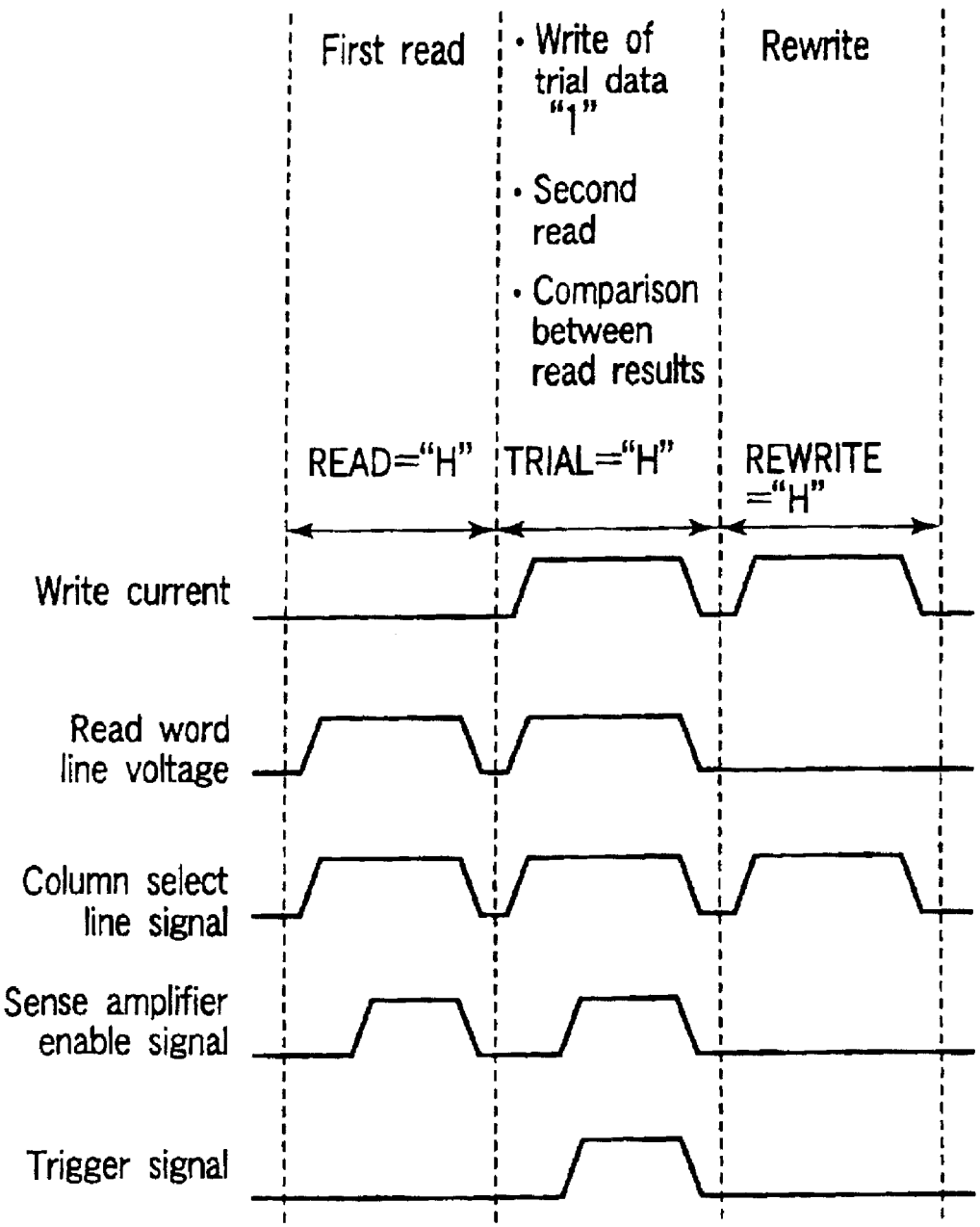
FIG. 33 is a timing chart showing an example of an improved destructive read operation principle in Improved Examples 3 and 4.

FIG. 33 is a timing chart showing read operation principle 2.

This read operation principle is an improved example of read operation principle 1 described above. A characteristic feature of this read operation principle is that the step of writing the trial data, the step of reading the comparison data (second read step), and the step of comparing read results with each other to determine the data in a TMR element are integrated into one step.

In this example, therefore, one read operation is constituted by three steps. In the read operation principle of this example, the second to fourth steps in the read operation principle in FIG. 31 or 32 are integrated into one step.

Assume that circuits to be used in executing this read operation principle in Improved Example 3 shown in FIGS. 17 and 18 are the write word line driver/sinker shown in FIG. 20, the read word line driver shown in FIG. 22, the column decoder shown in FIG. 24, and the write bit line driver/sinker shown in FIG. 28 (trial data "1").

In Improved Example 4 in FIG. 19, the write word line driver/sinker shown in FIG. 20, the read word line driver shown in FIG. 22, the read column decoder shown in FIG. 26, the write column decoder shown in FIG. 27, and the write bit line driver/sinker shown in FIG. 28 (trial data "1") are used.

A. First Step

In the first step, initial data is read (first read).

In this step, the read signal READ is set at "H".

In Improved Example 3, therefore, in a selected column in which all the bits of a column address signal are "1", the column select signal CSLj (FIG. 24) is set at "H". In Improved Example 4, in a selected column in which all the bits of an upper column address signal are "1", the column select signal CSLj (FIG. 26) is set at "H".

In addition, in Improved Examples 3 and 4, the output signal RWL0 from the read word line driver 23B (FIG. 22) for which all the bits of an upper row address signal are "1" is set at "H". The read select switch RSW in the selected block BK which receives this output signal RWL0 is turned on.

In addition, a sense amplifier enable signal is set at "H" to activate the sense amplifier. As a result, in Improved Example 3 in FIG. 18, the read current generated by the current source in the read circuit in the circuit block 29 flows to the ground terminal via the plurality of TMR elements of the selected column. In Improved Example 4 in FIG. 19, the read current generated by the current source in the read circuit 29B flows to the ground terminal via the plurality of TMR elements of the selected column.

The read circuit detects initial data while a read current is flowing. The initial data depends on the combined resistance of the plurality of TMR elements which constituted the selected column and are connected in parallel with each other. The initial data is stored in the storage circuit in the sense amplifier.

B. Second Step

In the second step, the following three items are executed simultaneously or temporally in parallel with each other:

write of trial data in selected TMR element read of comparison data (second read)

comparison between results obtained by two reads (determination of value of data in TMR element)

In this step, the trial signal TRIAL is set at "H".

In Improved Examples 3 and 4, therefore, in a selected row in which all the bits of a row address signal are "1", the PMOS transistor P6 (FIG. 20) in the write word line driver is turned on. As a consequence, a write current flows through the write word line in the selected row.

In Improved Example 3, in a column in which all the bits of a column address signal are "1", the column select line signal CSLj (FIG. 24) is set at "H". In Improved Example 2, the column select line signal CSLjk (FIG. 27) is set at "H"

in a column in which all the bits of an upper column address signal are "1" and at a stage where all the bits of a lower column address signal are 1".

That is, in Improved Example 3, the column select switch SW in a selected column is turned on. In Improved Example 4, the column select switch SWB corresponding to a selected stage in a selected column is turned on.

In the write bit line driver/sinker in FIG. 28, since the trial signal TRIAL is at "H", NMOS transistor N2 is set in the ON state. In the write bit line driver/sinker 31 in FIG. 28, since the trial signal TRIAL is at "H", the PMOS transistor P2 is set in the ON state.

In Improved Example 3 in FIG. 18, therefore a write current flows through the write line 26 in the selected column from the write bit line driver/sinker 31 to the write bit line driver/sinker 29. In Improved Example 4 in FIG. 19, a write current flows through the write line 33 in the selected stage in the selected column from the write bit line driver/sinker 31 to the write bit line driver/sinker 29.

As a consequence, the trial data ("1") is written in the selected TMR element.

A read of the comparison data (second read) is executed concurrently with such writing of the trial data.

More specifically, in Improved Example 1, when the trial signal TRIAL is at "H", the column select signal CSLj (FIG. 24) in a selected column in which all the bits of a column address signal are "1" is set at "H". In Improved Example 2, the column select line signal CSLjk (FIG. 26) in a column in which all the bits of an upper column address signal are "1" is set at "H".

In addition, in Improved Examples 3 and 4, the output signal RWL0 from the read word line driver 23B (FIG. 22) for which all the bits of an upper row address signal are "1" is set at "H". The read select switch RSW in the selected block BK which receives this output signal RWL0 is turned on.

In addition, the sense amplifier enable signal is set at "H" to activate the sense amplifier. As a consequence, in Improved Example 3 in FIG. 18, comparison data is detected by the read circuit in the circuit block 29. In Improved Example 4 in FIG. 19, comparison data is detected by the read circuit 29B. The comparison data depends on the combined resistance of the plurality of TMR elements which constitute the selected column and are connected in parallel with each other.

The comparison data detected by the read circuit is immediately compared with the initial data to determine the value of the data in the selected TMR element.

More specifically, if it is determined that the initial data coincides with the comparison data, since it indicates that the resistance value of the selected TMR element has not changed upon writing of the trial data, the data in the selected TMR element has the same value as that of the trial data.

In contrast to this, if it is determined that the initial data differs from the comparison data, it indicates that the resistance value of the selected TMR element has changed upon writing of the trial data, it is determined that the value of the data in the selected TMR element has an opposite value to that of the trial data.

In this example, since the trial data is assumed to be "1", if the initial data coincides with the comparison data, it is determined the data in the selected TMR element is "1". If the initial data differs from the comparison data, it is determined that the data in the selected TMR element is "0".

In this manner, the value of the data in the selected TMR element is determined.

C. Third Step

In the third step, data is rewritten in a selected TMR element. According to the read operation principle in this example, in the second step, the trial data is written in the selected TMR element. At this time, the data in the selected TMR element is destroyed.

After the value of the data in the selected TMR element is determined, therefore, data is rewritten in the selected TMR element.

In this step, the rewrite signal REWRITE is set at "H".

In Improved Examples 3 and 4, in a row in which all the bits of a row address signal are "1", the PMOS transistor P1 (FIG. 20) in the write word line driver is turned on. As a consequence, a write current flows through the write word line in the selected row.

In Improved Example 3, in a column in which all the bits of a column address signal are "1", the column select line signal CSLj (FIG. 24) is set at "H". In Improved Example 2, the column select line signal CSLjk (FIG. 27) is set at "H" in a column in which all the bits of an upper column address signal are "1" and at a stage where all the bits of a lower column address signal are "1".

That is, in Improved Example 3, the column select switch SW in the selected column is turned on. In Improved Example 4, the column select switch SWB corresponding to the selected stage in the selected column is turned on.

In the write bit line driver/sinker 29 in FIG. 28, since the rewrite signal REWRITE is at "H", the ON/OFF states of the MOS transistors P2 and N2 are determined in accordance with the value of the rewrite data DATA. In the write bit line driver/sinker 31 in FIG. 28 as well, since the rewrite signal REWRITE is at "H", the ON/OFF states of the MOS transistors P3 and N3 are determined in accordance with the value of the rewrite data DATA.

In Improved Example 3 in FIG. 18, therefore, a write current flows through the write line 26 in the selected column toward the write bit line driver/sinker 29 or 31 in accordance with the value of the rewrite data DATA.

In Improved Example 4 in FIG. 19, a write current flows through the write line 33 in the selected stage in the selected column toward the write bit line driver/sinker 29 or 31 in accordance with the value of the rewrite data DATA.

As a consequence, the data ("1" or "0") which has been stored in the selected TMR element before the execution of read operation is rewritten in the selected TMR element. After this operation, the column select switches SW and SWB are turned off to block the write current. In addition, the write current flowing through the write word line in the selected row is blocked.

If it is determined in the second step that the initial data coincides with the comparison data, the data that has been stored in the selected TMR element has the same value as that of the trial data. In this case, therefore, the third step may be omitted.

That is, only when it is determined in the second step that the initial data differs from the comparison data, data having an opposite value to that of the trial data may be rewritten in the selected TMR element in the third step.

As described above, the magnetic random access memories according to Improved Examples 3 and 4 can use the improved destructive read operation principle and actually execute it. Therefore, the resistance value (or MR ratio) of a selected TMR element can be accurately read regardless of variations in resistance among a plurality of TMR elements in read operation.

(9) Improved Example 5

FIG. 34 shows the main part of a magnetic random access memory as Improved Example 5 of the present invention. FIG. 35 shows only one column portion of the magnetic random access memory in FIG. 34.

The magnetic random access memory according to Improved Example 5 is a modification to the magnetic random access memory according to Improved Example 1. As compared with Improved Example 1, Improved Example 5 is characterized in that a write line 33 which extends in the Y-direction and is used for write operation is newly formed in each column.

As compared with Improved Example 1, Improved Example 5 has characteristic features associated with the arrangement of a memory cell array and peripheral circuits.

A memory cell array 11 has a plurality of TMR elements 12 arranged in the form of an array in the X- and Y-direction. A plurality of (12 in this example) word lines WL0, WL1, . . . , WL11 extending in the X-direction are arranged near the TMR elements 12 arranged in the X-direction. One end of each of the word lines WL0, WL1, . . . , WL11 is connected to a write word line driver 23. The other end of each of these write word lines is connected to a write word line sinker 24.

In write operation, a row decoder 25 selects one of the word lines WL0, WL1, . . . , WL11 on the basis of a row address signal. The write word line driver 23 supplies a write current to the selected write word line. The write current flows through the selected word line and is absorbed by the write word line sinker 24.

The TMR elements 12 arranged in the Y-direction are connected in parallel between a first data transfer line (bit line) 26 and a second data transfer line 27.

One end of the first data transfer line 26 is connected to a common data line 28 via a column select switch (MOS transistor) SWA. The common data line 28 is connected to a circuit block 29 including a read circuit (including a sense amplifier) 28B.

The gate of the column select switch SWA is connected to a read column decoder 32A. In read operation, the read column decoder 32A outputs a column select line signal RCSLj for selecting a column.

The write line (write bit line) 33 extending in the Y-direction is placed in each column. The write line 33 is placed near the plurality of TMR elements 12 in each column. One end of the write line 33 is connected to a common driver line 30A via a column select switch (MOS transistor) SWB. the common driver line 30A is connected a circuit block 29A including a write bit line driver/sinker.

The other end of the write line 33 is connected to a common driver line 30B via a column select switch (MOS transistor) SWB. The common driver line 30B is connected to a circuit block 31 including a write bit line driver/sinker.

The gate of the column select switch SWB is connected to a write column decoder 32B. The write column decoder 32B outputs a column select line signal WCSLj for selecting a column in write operation.

In the magnetic random access memory according to this example, in write operation, a write current flows through a selected write word line from the write word line driver 23 to the write word line sinker 24. In addition, the column select switch SWB in the selected column is turned on, and a write current flows through the write line (write bit line) 33. The direction of the write current flowing through the write line 33 changes in accordance with the value of write data.

In read operation, in a selected column, the column select switch SWA is turned on. As a consequence, a read current flows from the read circuit 29B to the ground terminal via the read line (read bit line) 26 and the plurality of TMR elements 12. The read circuit 29B detects read data corresponding to the combined resistance of the plurality of TMR elements while the read current flows.

(10) Improved Example 6

Figure 37:
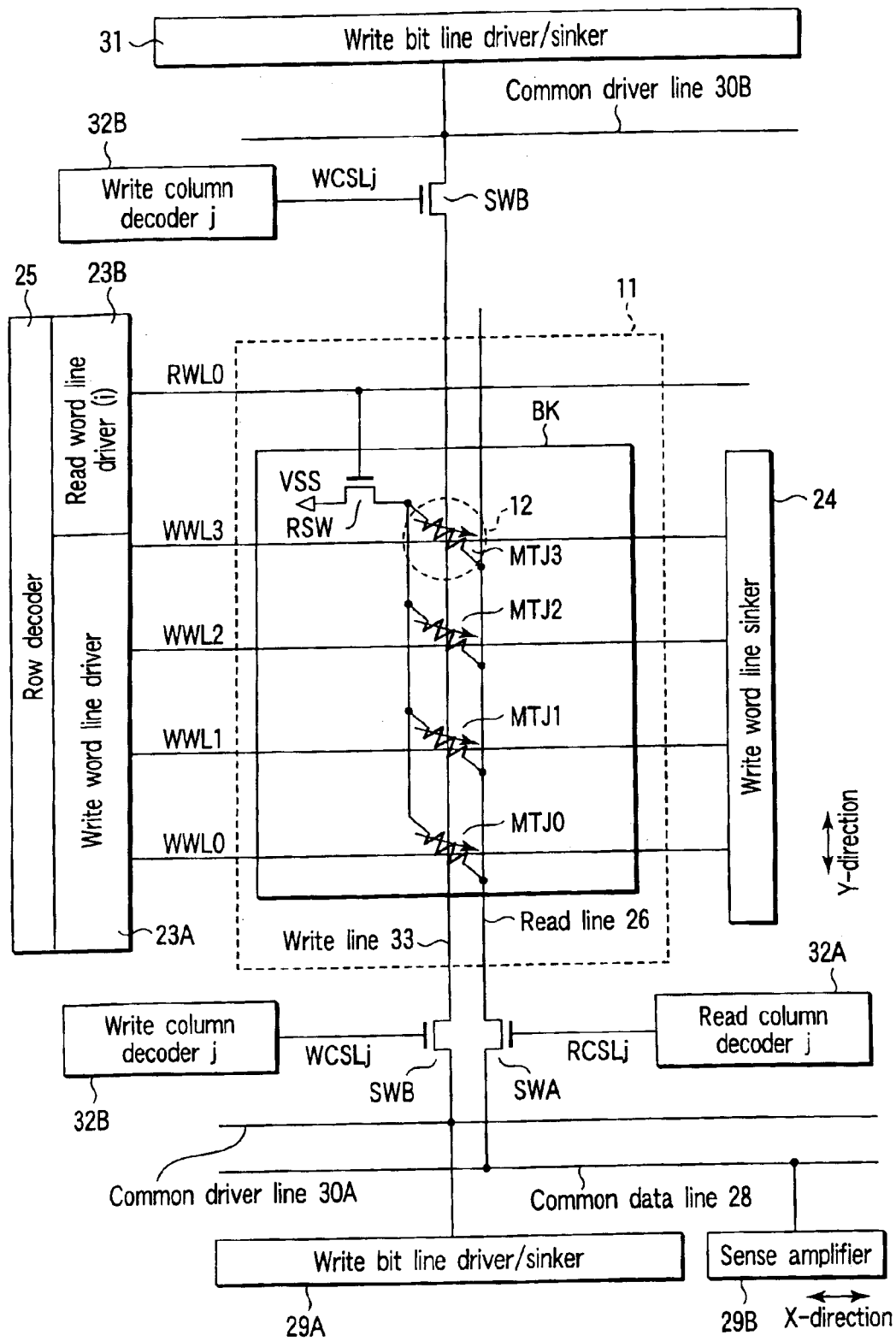
FIG. 37 is a view showing a one-column portion of the memory in FIG. 36.

FIG. 36 shows the main part of a magnetic random access memory as Improved Example 6 of the present invention. FIG. 37 shows only one column of the magnetic random access memory in FIG. 36.

The magnetic random access memory according to Improved Example 6 is a modification to the magnetic random access memory according to Improved Example 3. As compared with Improved Example 3, Improved Example 6 is characterized in that a write line 33 which extends in the Y-direction and is used for write operation is newly formed in each column.

As compared with Improved Example 3, Improved Example 6 has characteristic features associated with the arrangement of a memory cell array and peripheral circuits.

A memory cell array 11 has a plurality of TMR elements 12 arranged in the form of an array in the X- and Y-direction. A plurality of (12 in this example) word lines WWL0, WWL1, . . . , WWL11 extending in the X-direction are arranged near the TMR elements 12 arranged in the X-direction. One end of each of the word lines WWL0, WWL1, . . . , WWL11 is connected to a write word line driver 23A. The other end of each of these write word lines is connected to a write word line sinker 24.

In this example, one column is constituted by three blocks BK. One column is constituted by 12 TMR elements 12 arranged in the Y-direction. One block BK is therefore constituted by four TMR elements 12.

The TMR elements 12 in one block BK are connected in parallel with each other. One terminal of each TMR element is connected to a read line (read bit line) 26. The other end of each TMR elements is connected to the ground terminal via read select switch (MOS transistor) RSW.

One end of the read line 26 is connected to a common data line 28 via a column select switch (MOS transistor) SWA. The common data line 28 is connected to a read circuit (including a sense amplifier) 29B.

The gate of the column select switch SWA is connected to a read column decoder 32A. The read column decoder 32A outputs a column select line signal RCSLj for selecting a column in read operation.

The gate of the read select switch RSW is connected to a read word line RWLo (o=0, 1, 2). A read word line driver 23B outputs a block select signal for selecting a block BK on the basis of an upper row address signal in read operation.

One read word line RWLo corresponds to one block BK in one column, and is common to a plurality of blocks in the X-direction.

In this example, since one column is constituted by three blocks, the number of read word lines RWLo is three. The read word line RWLo extends in the X-direction, and its one end is connected to the read word line driver 23B.

In write operation, a row decoder 25 selects one of write word lines WWL0, WWL1, . . . , WWL11 on the basis of a row address signal.

The write word line driver 23A supplies a write current to the selected write word line. The write current flows through the selected write word line and is absorbed by the write word line sinker 24.

In read operation, for example, the row decoder 25 selects one block on the basis of an upper row address signal.

The read word line driver 23B applies a read word line voltage to the read word line RWLo connected to the selected block BK. In the selected block BK, since the read select switch RSW is turned on, a read current flows to the ground terminal via the plurality of TMR elements in the selected block BK.

A write line (write bit line) 33 extending in the Y-direction is placed in each column. The write line 33 is placed near the plurality of TMR elements 12 in each column. In addition, the write line 33 is common to the plurality of blocks BK in one column.

One end of the write line 33 is connected to a common driver line 30A via a column select switch (MOS transistor) SWB. The common driver line 30A is connected to a circuit block 29A including a write bit line driver/sinker.

The other end of the write line 33 is connected to a common driver line 30B via a column select switch (MOS transistor) SWB. The common driver line 30B is connected to a circuit block 31 including a write bit line driver/sinker.

The gate of the column select switch SWB is connected to a write column decoder 32B. In write operation, the write column decoder 32B outputs a column select line signal WCSLj for selecting a column.

In the magnetic random access memory according to this example, in write operation, a write current flows through a selected write word line from the write word line driver 23A to the write word line sinker 24. In the selected column, a write current flows through the write line (write bit line) 33. The direction of the write current flowing through the write line 33 changes in accordance with the value of write data.

In read operation, in a selected block in a selected column, a read current flows from the read circuit 29B to the ground terminal via the read line (read bit line) 26 and the plurality of TMR elements 12. The read circuit 29B detects read data corresponding to the combined resistance of the plurality of TMR elements in the selected block while the read current flows.

(11) Examples of Peripheral Circuits in Improved Examples 5 and 6

① Write Word Line Driver/Sinker

In Improved Examples 5 and 6, for example, the circuit shown in FIG. 6 can be used as a write word line driver/sinker.

② Write Bit Line Driver/Sinker

In Improved Examples 5 and 6, for example, the circuits shown in FIGS. 12 and 13 can be used as write bit line drivers/sinkers.

③ Read/Write Column Decoder

Circuit examples of the read and write column decoders 32A and 32B in Improved Examples 5 and 6 will be described below.

Figure 38:
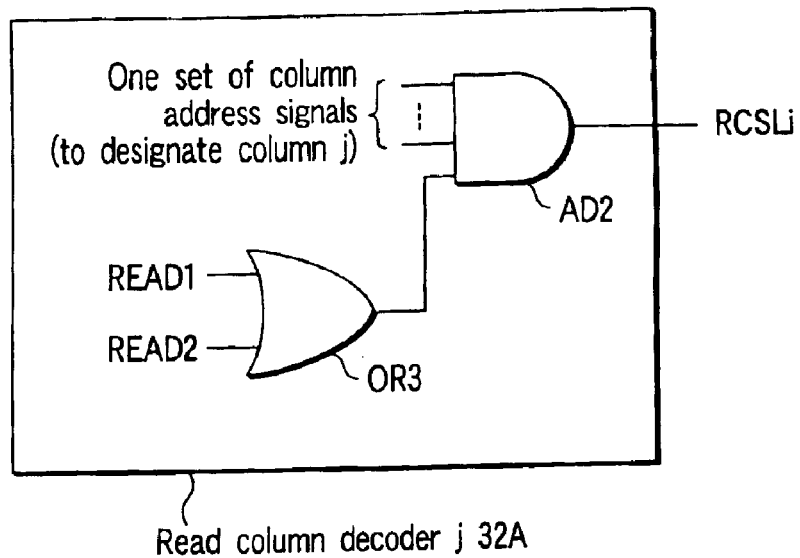
FIG. 38 is a view showing an example of a read column decoder.

FIG. 38 shows an example of the read column decoder.

A read column decoder 32A is comprised of OR circuit OR3 and AND circuit AD2. Read signals READ1 and READ2 are input to the OR circuit OR3.

The read signals READ1 and READ2 are signals that are set at "H" when the value of the combined resistance of a plurality of TMR elements constituting a selected column is read at the time of read operation (destructive read operation). According to the normal destructive read operation principle, read operation needs to be performed twice (the first and second cycles in FIG. 2). That is, the read signal READ1 is set at "H" in the first read, whereas the read signal READ2 is set at "H" in the second read.

When one of the two signals READ1 and READ2 is set at "H", an output signal from the OR circuit OR3 is set at "H".

The output signal from the OR circuit OR3 and a column address signal (to designate a column j) are input to the AND circuit AD2. When the column j (bit line BLj) is to be selected, all the bits of the column address signal (to designate the column j) are set at "H". If, therefore, the column j is selected and one of the two signals READ1 and READ2 is at "H", an output signal from the AND circuit AD2 is set at "H".

When the output signal from the AND circuit AD2 is set at "H", i.e., the column select line signal RCSLj is set at "H", the column select switch (NMOS transistor) SWA in FIGS. 35 and 37 is turned on. As a consequence, in read operation, a read current flows to the plurality of TMR elements in the selected column.

Figure 39:
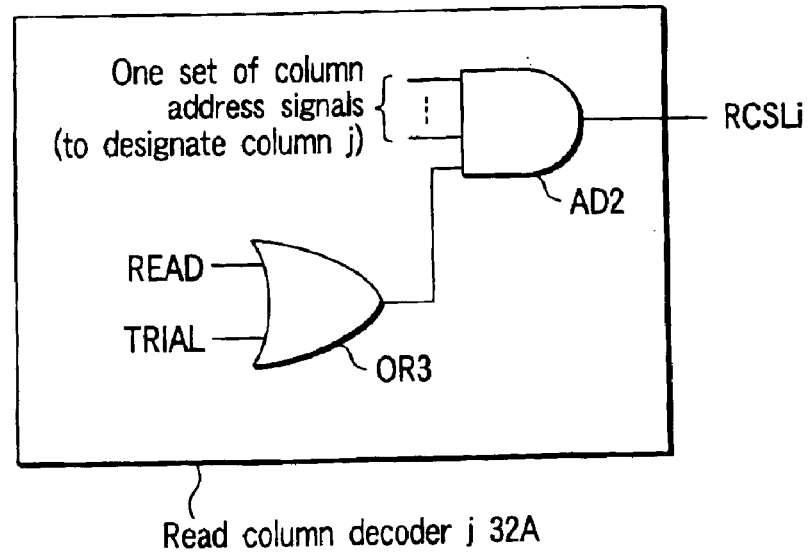
FIG. 39 is a view showing another example of the read column decoder.

FIG. 39 shows another example of the read column decoder.

As compared with the read column decoder 32A in FIG. 38, a read column decoder 32A in FIG. 39 is characterized in that a read signal READ and trial signal TRIAL are added in place of the read signals READ1 and READ2.

Figure 40:
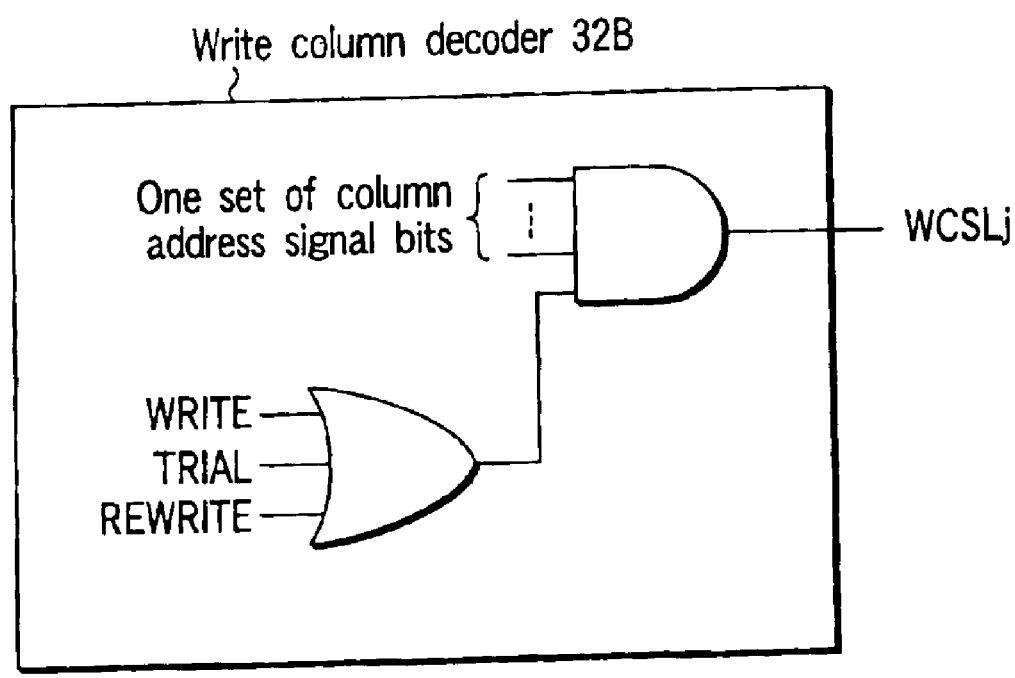
FIG. 40 is a view showing an example of a write column decoder.

FIG. 40 shows an example of the write column decoder.

A write column decoder 32B is comprised of an OR circuit OR4 and AND circuit AD3. A write signal WRITE, trial signal TRIAL, and rewrite signal REWRITE are input to the OR circuit OR4. When one of these three signals WRITE, TRIAL, and REWRITE is set at "H", an output signal from the OR circuit OR4 is set at "H".

The output signal from the OR circuit OR4 and a column address signal (to designate a column j) are input to the OR circuit OR4. When the column j is selected by the column address signal and one of the three signals WRITE, TRIAL, and REWRITE is set at "H", an output signal from the AND circuit AD3 is set at "H".

When the output signal from the AND circuit AD3 is set at "H", i.e., the column select line signal WCSLj is set at "H", the column select switch (NMOS transistor) SWB in FIGS. 35 and 37 is turned on. As a consequence, in write operation, a write current flows through the write line 33 in FIGS. 35 and 37.

(12) Principles of Read Operation Using Improved Examples 5 and 6

① Principle of Read Operation Using Improved Example 5

Almost the same read operation principles as those used for the magnetic random access memory according to Improved Example 2 can be applied to Improved Example 5. That is, the normal destructive read operation principle (FIGS. 14 and 15) and improved destructive read operation principle (FIG. 16) can be applied to Improved Example 5.

The difference in array structure between Improved Examples 2 and 5 is whether the plurality of TMR elements 12 in one column are arranged in the Y-direction (horizontal direction) or in the Z-direction (vertical direction). Consequently, in Improved Example 2, a plurality of write bit lines are arranged in one column, whereas in Improved Example 5, one write bit line is placed in one column.

Read operation in Improved Example 5 differs from that in Improved Example 2 in the operation of the write column decoder.

② Principle of Read Operation Using Improved Example 6

Almost the same read operation principles as those used for the magnetic random access memory according to Improved Example 4 can be applied to Improved Example 6. That is, the normal destructive read operation principle (FIGS. 31 and 32) and improved destructive read operation principle (FIG. 33) can be applied to Improved Example 6.

The difference in array structure between Improved Examples 4 and 6 is whether the plurality of TMR elements 12 in one column are arranged in the Y-direction (horizontal direction) or in the Z-direction (vertical direction). Consequently, in Improved Example 4, a plurality of write bit lines are arranged in one column, whereas in Improved Example 6, one write bit line is placed in one column.

Read operation in Improved Example 6 differs from that in Improved Example 4 in the operation of the write column decoder.

(13) Examples of Device Structures of Improved Examples 5 and 6

Figure 41:
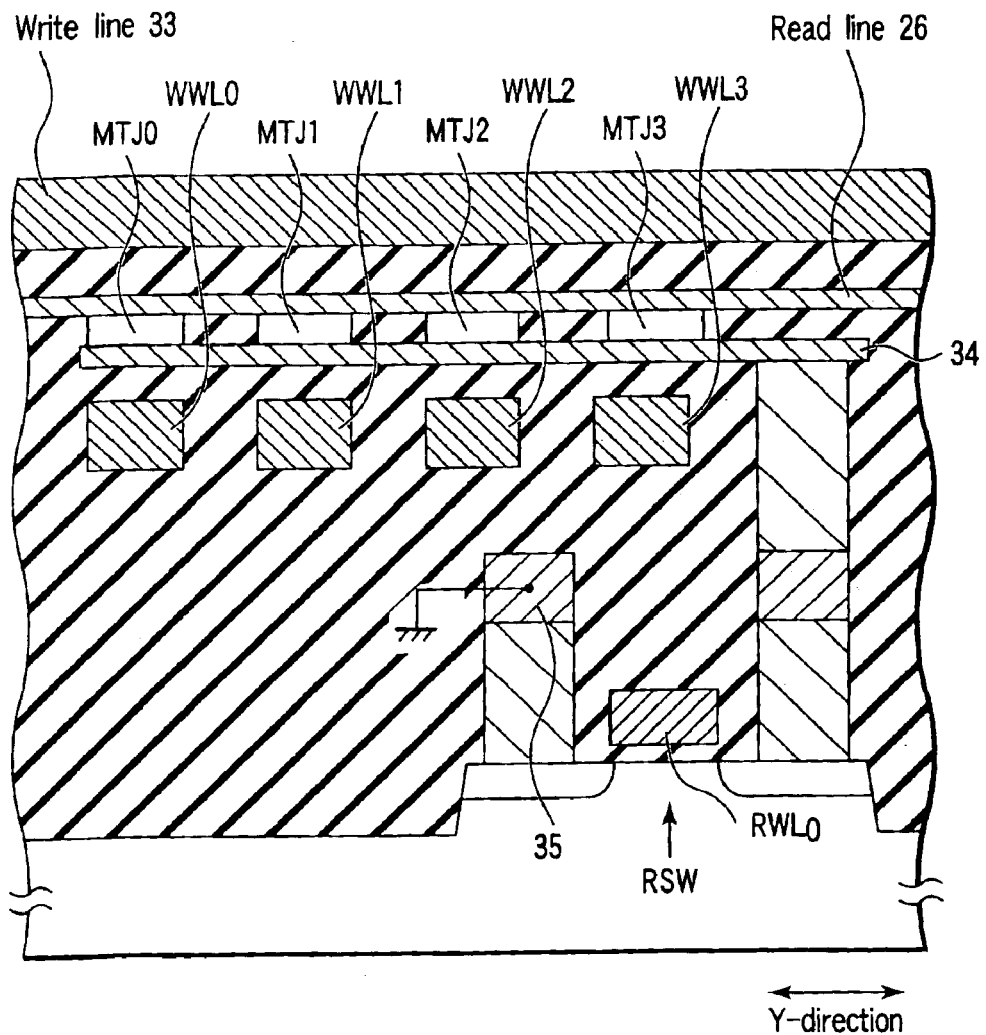
FIG. 41 is a view showing an example of a device structure of Improved Example 6.

FIG. 41 shows an example of the device structure of Improved Example 6.

This example shows the device structure of one block in one column in Improved Example 6.

A plurality of TMR elements are arranged in Y-direction and connected in parallel between a read line (upper interconnection) 26 and a lower interconnection 34. The lower interconnection 34 is connected to a source line 35 via a read select switch RSW.

The read select switch RSW is placed immediately below a TMR element. Both a read word line RWLo and the source line 35 extend in the X-direction (a direction perpendicular to the drawing surface). The source line 35 is connected to a ground terminal.

A write bit line 33 extending in the Y-direction is placed on a plurality of TMR elements. The write bit line 33 is common to a plurality of TMR elements. Write word lines WWL0, WWL1, WWL2, and WWL3 extending in the X-direction are arranged immediately below the respective TMR elements.

Referring to FIG. 41, the lower interconnection 34 may be directly connected to the ground terminal without using any read select switch RSW, and the numbers of TMR elements and write word lines are increased, the device structure of Improved Example 5 can be obtained.

3. Read Circuit

The reference example, Improved Examples 1 to 6, peripheral circuits (except for the read circuits), and read operation principles have been described in detail above in association with magnetic random access memories. Specific examples of a read circuit (including a sense amplifier) which can be applied to any of the reference example and Improved Examples 1 to 6 and can realize destructive read operation principles 1 and 2 described above, and the operation of each example will be described below.

(1) Circuit Example 1

Figure 42:
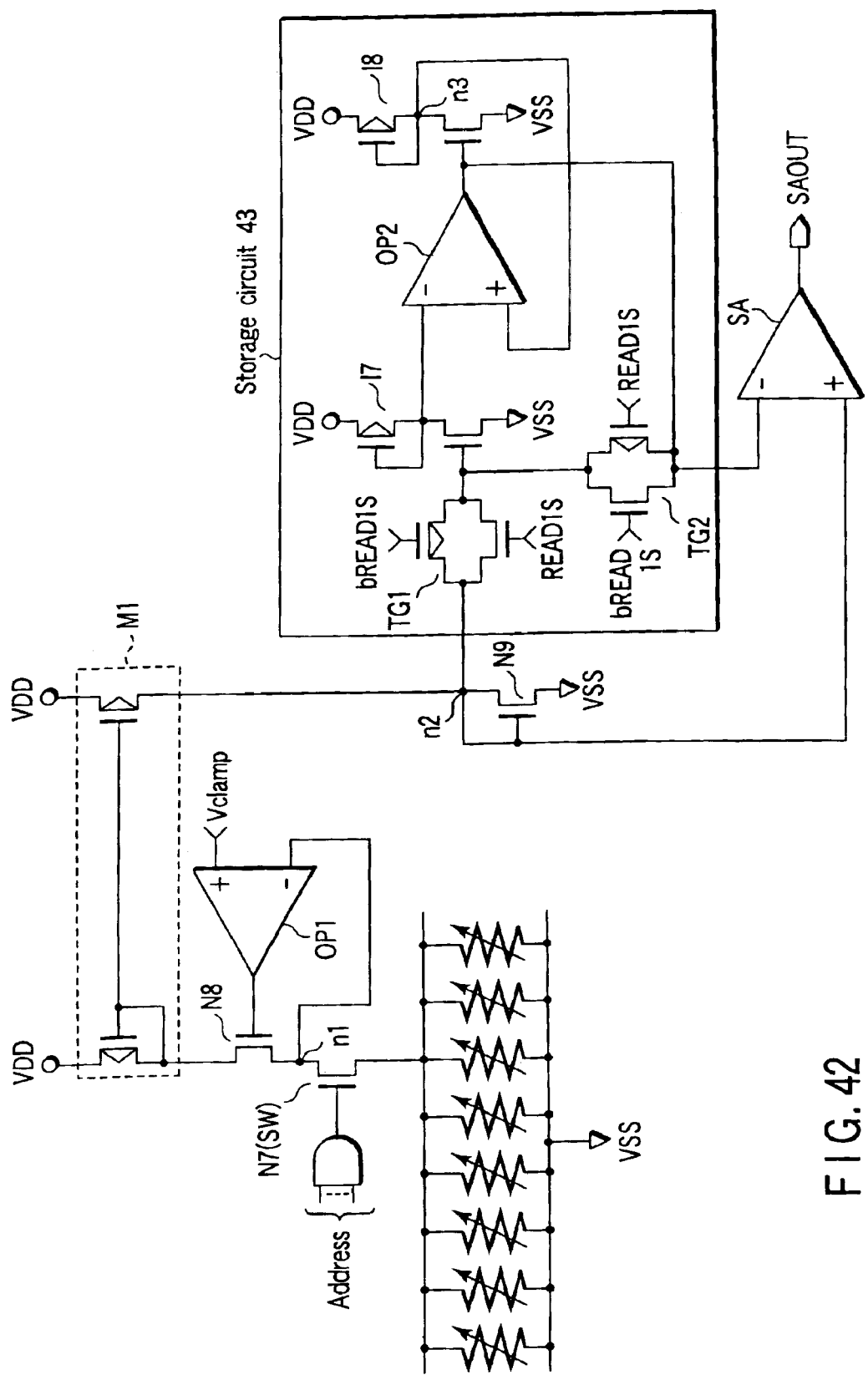
FIG. 42 is a view showing Circuit Example 1 of a read circuit.

FIG. 42 shows Circuit Example 1 of a read circuit of a magnetic random access memory.

A plurality of TMR elements are connected in parallel with each other. One terminal of each TMR element is connected to a ground terminal. The other terminal of each TMR element is connected to a node n1 via an NMOS transistor N7 (SW) serving as a column select switch. The TMR element group shown in FIG. 42 corresponds to one column in the reference example and Improved Examples 1, 2, and 5, and one block in one column in Improved Examples 3, 4, and 6.

The potential of the node n1 is set to a clamp potential Vclamp by a clamp circuit. The clamp circuit is comprised of an operational amplifier OP1 and NMOS transistor N8.

The NMOS transistor N8 is placed between the node n1 and a current mirror circuit M1. The operational amplifier OP1 controls the gate potential of the NMOS transistor N8 to equalize the potential of the node n1 with the clamp potential Vclamp.

The function of the clamp circuit is to adjust the voltage between the two terminals of each TMR element in one column or one block.

Assume that a ground potential is applied to one terminal of a TMR element. In this case, if the potential of the other terminal of the TMR element increases excessively, the MR ratio of the TMR element becomes low. That the MR ratio of the TMR element is low means that the difference in resistance between the TMR element in the "1"-state and the TMR element in the "0"-state is small. That is, the margin of determination on "1" and "0" in read operation is small.

In order to prevent this, in this example, the clamp circuit is used to adjust the potential of the other terminal of the TMR element, i.e., the voltage between the two terminals of the TMR element, so as to prevent a reduction in the MR ratio of the TMR element.

The current mirror circuit M1 functions to supply a current equal to the sum of read currents flowing in a plurality of TMR elements to an NMOS transistor N9. At this time, the potential (e.g., initial data) of a node n2 is stored in a storage circuit 43 by a transfer gate circuit TG1.

The transfer gate circuit TG1 is ON/OFF-controlled by control signals READ1S and bREAD1S. The control signal READ1S is a signal that is set at "H" at the time of first read operation (initial data read). Note that the control signal bREAD1S is an inverted signal having an opposite value to that of the control signal READ1S.

When the control signal READ1S is at "H" (at the time of first read operation), the potential of the node n2 is input to an inverter circuit I7 via the transfer gate circuit TG1. The output signal from the inverter circuit I7 is input to the negative input terminal of an operational amplifier OP2. The output signal from the operational amplifier OP2 is input to an inverter circuit I8. The output signal from the inverter circuit I8 is input to the positive input terminal of the operational amplifier OP2.

The operational amplifier OP2 controls, for example, the gate potential of the NMOS transistor in the inverter circuit I8 so as to equalize the input potential input to the negative input terminal with the input potential input to the positive input terminal. As a consequence, a current flowing in the inverter circuit I8 that receives the output signal from the operational amplifier OP2 becomes initial data (cell data).

A transfer gate circuit TG2 is connected between the output terminal of the operational amplifier OP2 and the input terminal of the inverter circuit I7. After the first read operation, the control signal READ1S is set at "L", and the control signal bREAD1S is set at "H". As a consequence, the initial data is latched in the storage circuit 43.

The positive input terminal of a sense amplifier SA is connected to the node n2. The negative input terminal of the sense amplifier SA is connected to an output terminal n3 of the operational amplifier OP2. When the data in a selected TMR element is determined, the sense amplifier SA compares the potential of the node n2 with the potential of the output terminal n3 of the operational amplifier OP2.

That is, the potential of the node n2 represents the second read result (comparison data), and the potential of the output terminal n3 of the operational amplifier OP2 represents the first read result (initial data).

(2) Circuit Example 2

Figure 43:
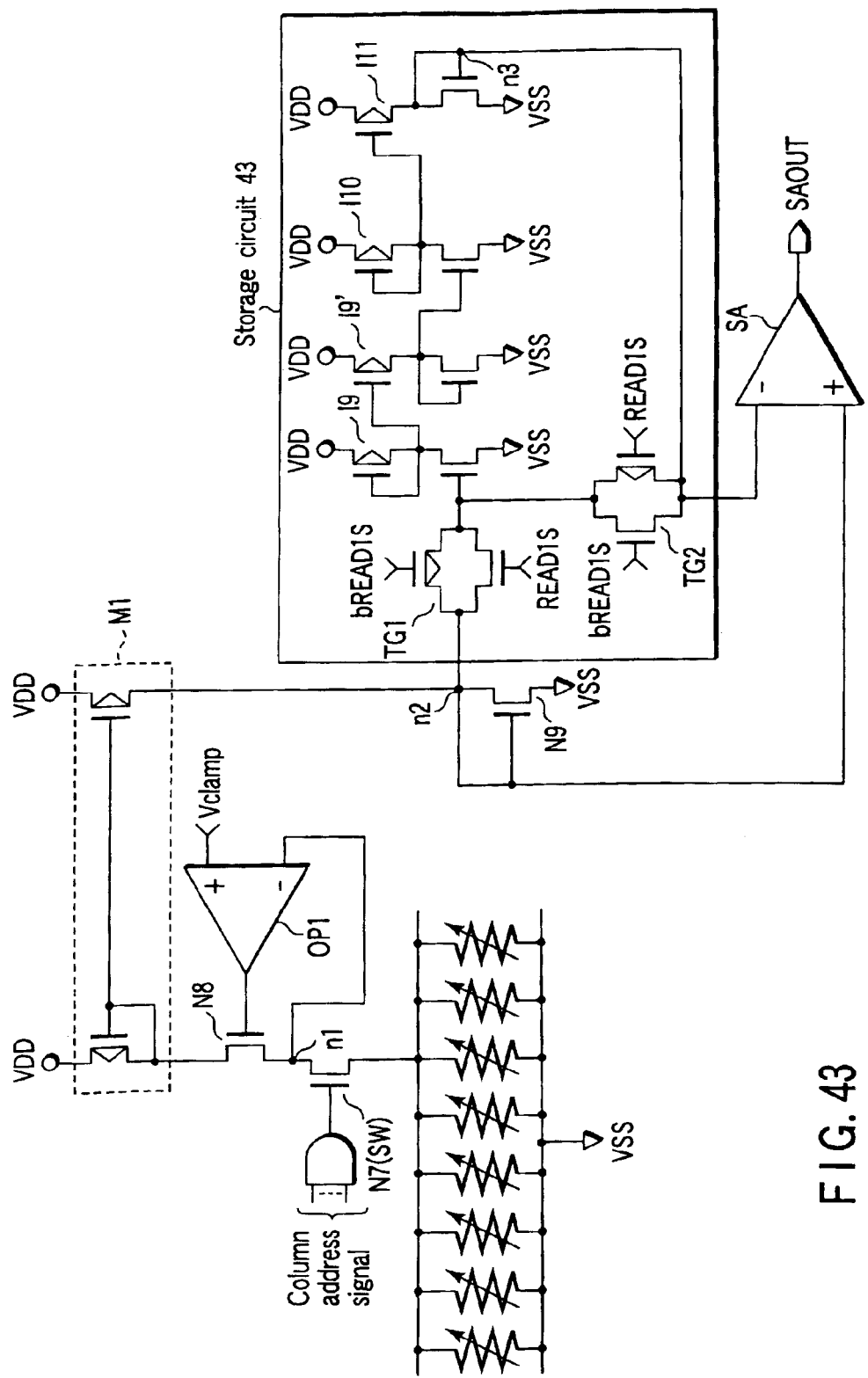
FIG. 43 is a view showing Circuit Example 2 of the read circuit.

FIG. 43 shows Circuit Example 2 of a read circuit in the magnetic random access memory.

Circuit Example 2 is a modification to Circuit Example 1. As compared with Circuit Example 1, Circuit Example 2 is characterized in a storage circuit 43. More specifically, the storage circuit 43 in Circuit Example 1 has the two inverter circuits I7 and I8 and operational amplifier OP2, whereas the storage circuit 43 in Circuit Example 2 has no operational amplifier but has four inverter circuits I9, I9', I10, and I11.

In Circuit Example 2, initial data is latched in the storage circuit 43 using a current mirror circuit without using any operational amplifier.

For example, in the first read operation (initial data read), since a control signal READ1S is set at "H", the potential (initial data) of a node n1 is transferred to the storage circuit 43 constituted by the four inverter circuits I9, I9', I10, and I11. After the first read operation, since the control signal READ1S is set at "L", and a control signal bREAD1S is set at "H", the initial data is latched in the storage circuit 43.

(3) Circuit Example 3

FIG. 44 shows Circuit Example 3 of a read circuit in the magnetic random access memory.

Circuit Example 3 is also a modification to Circuit Example 1. As compared with Circuit Example 1, Circuit Example 3 is also characterized in a storage circuit 43. More specifically, in Circuit Example 3, the storage circuit 43 is formed from a capacitor C1.

In this example, for example, the potential (initial data) of a node n2 is dynamically stored in the capacitor C1. For this reason, the interval between the first read and the second read must be shorter than the interval during which the capacitor C1 keeps holding data.

The interval during which the capacitor C1 keeps holding data is, for example, several ms, as fully studied in the field of DRAMs (Dynamic Random Access Memories). If, therefore, the interval between the first read and the second read is set to be shorter than several m, the capacitor C1 can be used for the storage circuit 43.

(4) Specific Examples of Sense Amplifier

Specific examples of the sense amplifier SA used in Circuit Examples 1, 2, and 3 will be described below. The arrangement of the sense amplifier SA is determined in accordance with the value of trial data to be written in a selected TMR element at the time of destructive read operation.

① Case Where Trial Data is "1"

Figure 45:
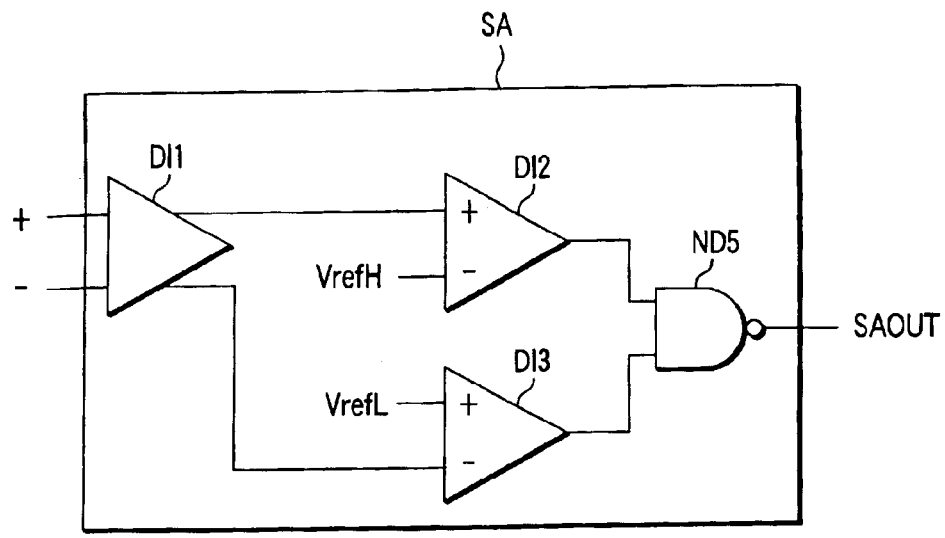
FIG. 45 is a view showing an example of a sense amplifier.

FIG. 45 shows an example of the sense amplifier in a case where the trial data is "1".

The sense amplifier SA is comprised of, for example, three differential amplifiers DI1, DI2, and DI3 and NAND circuit ND5.

The differential amplifier DI1 at the first stage compares the potential (e.g., comparison data) of the node n2 with the potential (e.g., initial data) of the output terminal n3 in FIGS. 42 to 44. The differential amplifier DI1 outputs two output potentials on the basis of two input potentials. The difference between the two output potentials from the differential amplifier DI1 is determined on the basis of the difference between the two input potentials.

The potential based on the potential of the node n2 is input to the positive input terminal of the differential amplifier DI2, and a reference potential VrefH is input to the negative input terminal. If the potential input to the positive input terminal is higher than the reference potential VrefH, the differential amplifier DI2 outputs "H". If this input potential is lower than the reference potential VrefH, the differential amplifier DI2 outputs "L".

The potential based on the potential of the node n3 is input to the negative input terminal of the differential amplifier DI3, and a reference potential VrefL is input to the positive input terminal. If the potential input to the negative input terminal is lower than the reference potential VrefL, the differential amplifier DI3 outputs "H". If this input potential is higher than the reference potential VrefL, the differential amplifier DI3 outputs "L".

If, for example, the data in a selected TMR element is "0" and the trial data is "1", the comparison data read in the second read operation, i.e., the potential of the node n2, is higher than the initial data read in the first read operation, i.e., the potential of the node n3.

At this time, since the potential input to the positive input terminal of the differential amplifier DI2 is higher than the reference potential VrefH input to the negative input terminal, the output signal from the differential amplifier DI2 is set at "H". In addition, since the potential input to the negative input terminal of the differential amplifier DI3 is lower than the reference potential VrefL input to the positive input terminal, the output signal from the differential amplifier DI3 is also set at "H".

The output signal from the NAND circuit ND5 is set at "L", i.e., the output signal from the sense amplifier SA becomes "0" ("L"="0"). That is, the data in the selected TMR element is determined as "0".

If the data in the selected TMR element is "1" and the trial data is "1", the comparison data read in the second read operation, i.e., the potential of the node n2, becomes substantially equal to the initial data read in the first read operation, i.e., the potential of the node n3.

At this time, the differential amplifier DI1 outputs two output potentials on the basis of the small potential difference between the nodes n2 and n3.

The potential input to the positive input terminal of the differential amplifier DI2, however, does not exceed the reference potential VrefH input to the negative input terminal, and hence the output signal from the differential amplifier DI2 is set at "L". In addition, since the potential input to the negative input terminal of the differential amplifier DI3 does not become lower than the reference potential VrefL input to the positive input terminal, the output signal from the differential amplifier DI3 is also set at "L".

The output signal from the NAND circuit ND5 is therefore set at "H", i.e., the output signal from the sense amplifier SA becomes "1" ("H"="1"). That is, the data in the selected TMR element is determined as "1".

Figure 46:
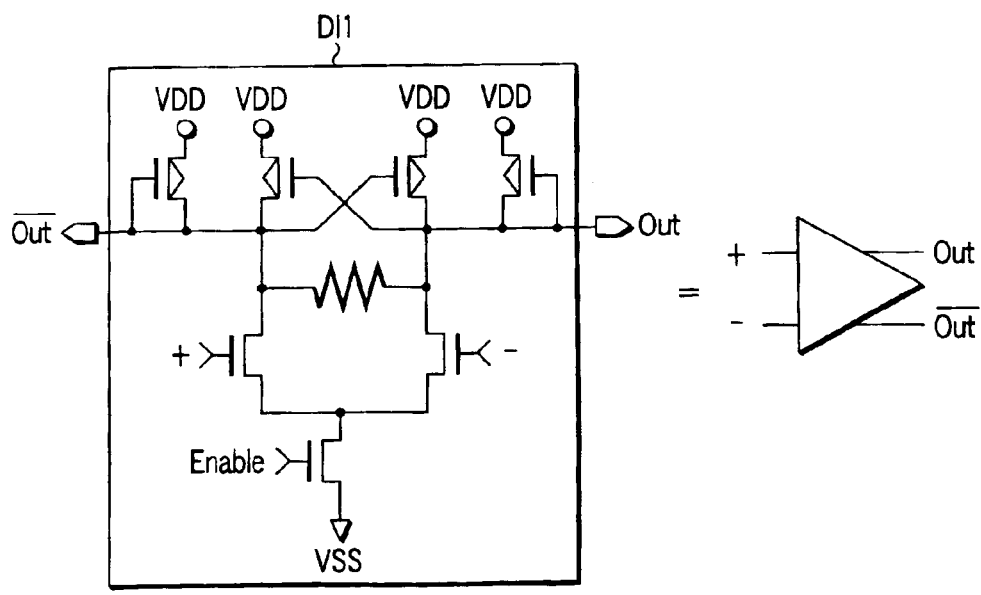
FIG. 46 is a view showing an example of a differential amplifier in a sense amplifier.

FIG. 46 shows an example of the differential amplifier at the first stage in the sense amplifier in FIG. 45.

A characteristic feature of this differential amplifier DI1 is that a resistor Rr having a large resistance value is connected between the two output terminals.

A resistor is connected between the two output terminals of the differential amplifier DI1 in this manner. With this arrangement, when the data in a selected TMR element is equal to the trial data, i.e., there is hardly any difference between the two input potentials, the differential amplifier DI1 does not amplify or output the difference. Only when there is a distinct difference between the two input potentials, the differential amplifier DI1 amplifies and outputs the difference.

Figure 47:
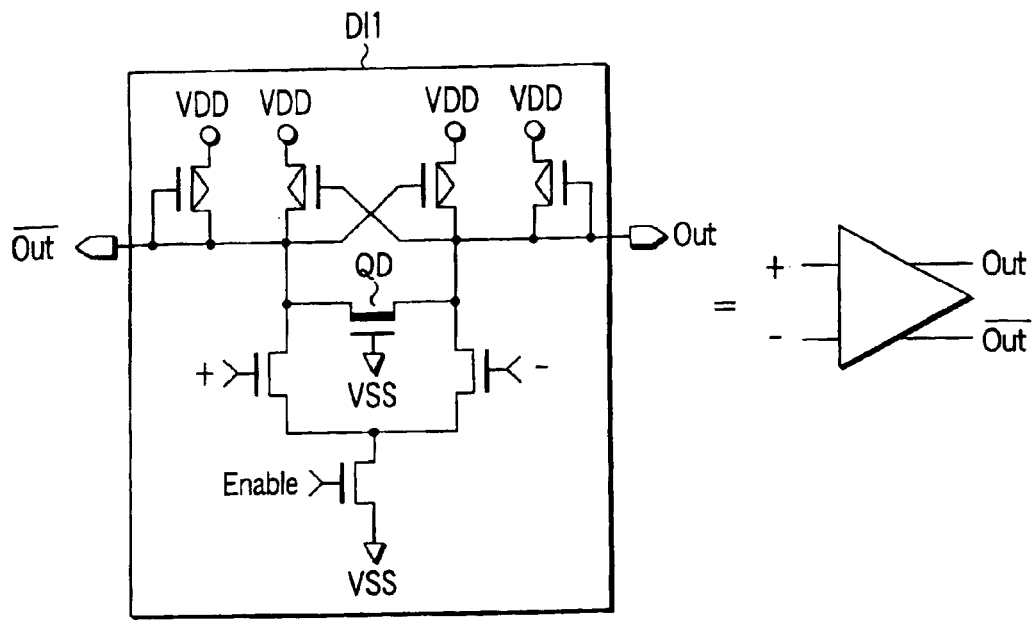
FIG. 47 is a view showing another example of the differential amplifier in a sense amplifier.

FIG. 47 shows another example of the differential amplifier at the first stage in the sense amplifier in FIG. 45.

A characteristic feature of this differential amplifier DI1 is that a depletion type MOS transistor QD is connected between the two output terminals.

The depletion type MOS transistor QD has the same function as that of the resistor Rr in FIG. 46. That is, when the data in an selected TMR element is equal to the trial data, i.e., there is hardly any difference between the two input potentials, the differential amplifier DI1 does not amplify or output the difference. Only when there is a distinct difference between the two input potentials, the differential amplifier DI1 amplifies and outputs the difference.

② Case Where Trial Data is "0"

Figure 48:
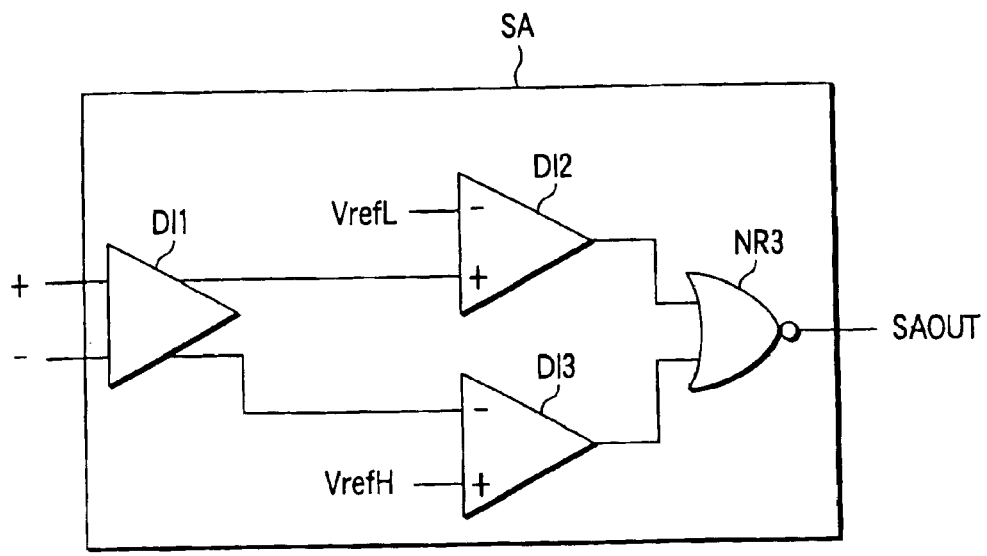
FIG. 48 is a view showing another example of the sense amplifier.

FIG. 48 shows an example of the sense amplifier in a case where the trial data is "0".

The sense amplifier SA is comprised of, for example, three differential amplifiers DI1, DI2, and DI3, and a NOR circuit NR3.

The differential amplifier DI1 at the first stage compares the potential (e.g., comparison data) of the node n2 with the potential (e.g., initial data) of the output terminal n3 in FIGS. 42 to 44. The differential amplifier DI1 outputs two output potentials on the basis of two input potentials. The difference between the two output potentials from the differential amplifier DI1 is determined on the basis of the difference between the two input potentials.

The potential based on the potential of the node n2 is input to the positive input terminal of the differential amplifier DI2, and a reference potential VrefL is input to the negative input terminal. If the potential input to the positive input terminal is lower than the reference potential VrefL, the differential amplifier DI2 outputs "L". If this input potential is higher than the reference potential VrefL, the differential amplifier DI2 outputs "H".

The potential based on the potential of the node n3 is input to the negative input terminal of the differential amplifier DI3, and a reference potential VrefH is input to the positive input terminal. If the potential input to the negative input terminal is higher than the reference potential VrefH, the differential amplifier DI3 outputs "L". If this input potential is lower than the reference potential VrefH, the differential amplifier DI3 outputs "H".

If, for example, the data in a selected TMR element is "1" and the trial data is "0", the comparison data read in the second read operation, i.e., the potential of the node n2, is lower than the initial data read in the first read operation, i.e., the potential of the node n3.

At this time, since the potential input to the positive input terminal of the differential amplifier DI2 is lower than the reference potential VrefL input to the negative input terminal, the output signal from the differential amplifier DI2 is set at "L". In addition, since the potential input to the negative input terminal of the differential amplifier DI3 is higher than the reference potential VrefH input to the positive input terminal, the output signal from the differential amplifier DI3 is also set at "L".

The output signal from the NOR circuit NR3 is set at "H", i.e., the output signal from the sense amplifier SA becomes "1" ("H"="1"). That is, the data in the selected TMR element is determined as "1".

If the data in the selected TMR element is "0" and the trial data is "0", the comparison data read in the second read operation, i.e., the potential of the node n2, becomes substantially equal to the initial data read in the first read operation, i.e., the potential of the node n3.

At this time, the differential amplifier DI1 outputs two output potentials on the basis of the small potential difference between the nodes n2 and n3.

The potential input to the positive input terminal of the differential amplifier DI2, however, does not become lower the reference potential VrefL input to the negative input terminal, and hence the output signal from the differential amplifier DI2 is set at "H". In addition, since the potential input to the negative input terminal of the differential amplifier DI3 does not become higher than the reference potential VrefH input to the positive input terminal, the output signal from the differential amplifier DI3 is also set at "H".

The output signal from the NAND circuit ND5 is therefore set at "L", i.e., the output signal from the sense amplifier SA becomes "0" ("L"="0"). That is, the data in the selected TMR element is determined as "0".

Note that as the differential amplifier DI1 at the first stage in the sense amplifier in FIG. 48, the differential amplifier DI1 having the arrangement shown in FIG. 46 or 47 can be used.

If the data in a selected magnetic random access memory coincides with trial data, i.e., there is hardly any difference between two input potentials, the sense amplifier does not amplify or output the difference. Only when there is a distinct difference between two input potentials, the sense amplifier amplifies and outputs the difference.

(5) Specific Examples of Operational Amplifiers

FIG. 49 shows specific examples of the operational amplifiers OP1 in FIGS. 42 to 44.

A clamp potential Vclamp is input to the positive input terminal of the operational amplifier OP1, and the potential of a node n1 is input to the negative input terminal. When an enable signal Enable is set at "H", the operational amplifier outputs an output signal Out so as to match the potential of the node n1 with the clamp potential Vclamp.

FIG. 50 shows a specific example of the operational amplifier OP2 in FIG. 42.

The output signal from the inverter circuit I8 in FIG. 42 is input to the negative input terminal of the operational amplifier OP2, and the output signal from the inverter circuit I7 is input to the negative input terminal. When the enable signal Enable is set at "H", the operational amplifier outputs the output signal Out so as to match the output signal from the inverter circuit I7 with the output signal from the inverter circuit I8.

(6) Operations of Circuit Examples 1, 2, and 3

The operation of a read circuit associated with Circuit Examples 1, 2, and 3 will be described below. In Circuit Examples 1, 2, and 3, either the normal destructive read operation (FIGS. 14, 15, and 16) or the improved destructive read operation (FIGS. 31, 32, and 33) can be executed.

① First Read Operation

In the first read operation, initial data is read.

A column address signal is input to the read circuit to turn on the column select switch N7 (SW). The operational amplifier OP1 controls the gate potential of the NMOS transistor N8 so as to match the potential of the node n1 with the clamp potential Vclamp.

At this time, a read current flows from the power supply terminal VDD to the ground terminal via the transistors M7 and M8 and a plurality of TMR elements. The current mirror circuit M1 functions to supply a current equal to this read current to the NMOS transistor N9.

As a consequence, a potential (initial data) corresponding to the combined resistance of the plurality of TMR elements appears at the node n2.

At the time of the first read operation, the control signal READ1S is at "H". That is, the transfer gate circuit TG1 is in the ON state, and the transfer gate circuit TG2 is in the OFF state. The potential of the node n2 is therefore input to the storage circuit 43 via the transfer gate circuit TG1.

In the example shown in FIG. 42, the operational amplifier OP2 controls the gate potential of the NMOS transistor in the inverter circuit I8 so as to match the potential of the negative input terminal with the potential of the positive input terminal. As a result, a current flowing in the inverter circuit I8 becomes initial data (cell data).

In the example shown in FIG. 43, the potential of the output node n3 of the inverter circuit I11 becomes initial data (cell data). In the example shown in FIG. 44, the potential of one terminal n3 of the capacitor C1 becomes initial data (cell data).

After the first read operation, the control signal READ1S is set at "L", and the control signal bREAD1S is set at "H". As a result, the initial data is latched in the storage circuit 43.

② Second Read Operation and Data Determining Operation

After trial data is written in a selected TMR element (normal destructive read operation) or at the same time the data is written (improved destructive read operation), the second read operation is performed to read comparison data.

A column address signal is input to the read circuit to turn on the column select switch N7 (SW). The operational amplifier OP1 controls the gate potential of the NMOS transistor N8 so as to match the potential of the node n1 with the clamp potential Vclamp.

At this time, a read current flows from the power supply terminal VDD to the ground terminal via the transistors M7 and M8 and a plurality of TMR elements. The current mirror circuit M1 functions to supply a current equal to this read current to the NMOS transistor N9.

As a consequence, a potential (comparison data) corresponding to the combined resistance of the plurality of TMR elements appears at the node n2.

At this time, the potential of the node n2 is input to the positive input terminal of the sense amplifier SA, and the potential of the node n3 in the storage circuit 43 is input to the negative input terminal. As a consequence, the sense amplifier SA determines the value of the data in a selected TMR element on the basis of the potential of the node n2 and the potential of the node n3.

Note that data determining operation in the sense amplifier SA is the same as that described in the item "(4) Specific Examples of Sense Amplifier".

(7) Circuit Example 4

FIG. 51 shows Circuit Example 4 of a read circuit in a magnetic random access memory.

In Circuit Examples 1, 2, and 3, read data (initial data) is stored as an analog value in a storage circuit. In contrast to this, in Circuit Example 4, read data is stored as a digital value in a storage circuit.

A plurality of TMR elements are connected in parallel with each other. One end of each TMR element is connected to a ground terminal, and the other end is connected to a node n1 via an NMOS transistor N7 (SW) serving as a column select switch. The group of TMR elements shown in FIG. 51 corresponds to one column in Improved Examples 1, 2, and 5, and one block in one column in Improved Examples 3, 4, and 6.

The potential of the node n1 is set to a clamp potential Vclamp by a clamp circuit. The clamp circuit is comprised of an operational amplifier OP1 and NMOS transistor N8. As the operational amplifier OP1, for example, the operational amplifier OP1 shown in FIG. 49 can be used.

An NMOS transistor N8 is placed between the node n1 and a current mirror circuit M1. The operational amplifier OP1 controls the gate potential of the NMOS transistor N8 so as to match, for example, the potential of the node n1 with the clamp potential Vclamp.

The current mirror circuit M1 functions to supply a current equal to the sum of read currents flowing in the plurality of TMR elements to an NMOS transistor N9. At this time, the potential (initial data) of a node n2 is input to the positive input terminal of an operational amplifier OP3 in the storage circuit 43.

As the operational amplifier OP3, for example, the operational amplifier OP2 shown in FIG. 40 can be used.

In Circuit Example 4, the storage circuit 43 includes an operational amplifier OP3, BGR (Band Gap Reference) circuit 36, oscillator 37, sample/hold circuit 38, counter trigger signal generating circuit 39, counter/counter driving circuit 40, DAC (Digital/Analog Converter) 41, PMOS transistor P7, and NMOS transistor N10.

The BGR circuit 36 outputs an output signal independent of temperature. The output signal from the BGR circuit 36 is supplied to the oscillator 37 and DAC 41. On the basis of the output signal from the BGR circuit 36, the oscillator 37 generates a signal OSC whose level periodically changes.

The output signal from the operational amplifier OP3 is input the sample/hold circuit 38. The sample/hold circuit 38 holds the output signal from the operational amplifier OP3 as a sampling result, and periodically outputs the sampling result to the counter trigger signal generating circuit 39 on the basis of the signal OSC whose level periodically changes.

The counter trigger signal generating circuit 39 outputs a counter trigger signal on the basis of the signal OSC whose level periodically changes and the sampling result. The counter/counter driving circuit 40 changes a count value which is its output signal on the basis of a counter trigger signal.

The DAC (Digital/Analog Converter) 41 converts the count value of the counter/counter driving circuit 40 from a digital signal into an analog signal. The output signal from the DAC 41 is input to the gate of the PMOS transistor P7.

The PMOS transistor P7 and NMOS transistor N10 are connected in series between a power supply terminal VDD and a ground terminal VSS.

The gate and drain of the NMOS transistor N10 are connected to each other. The drains of the PMOS transistor P7 and NMOS transistor N10 are respectively connected to the negative input terminal of the operational amplifier OP3 and the negative input terminal of the sense amplifier SA.

The sense amplifier SA compares the potential of the node n2 with the potential of the node n3 (the negative input terminal of the operational amplifier OP3) to determine the data in the selected TMR element.

In Circuit Example 4, the initial data obtained by the first read operation in destructive read operation is stored as a digital value in a storage circuit 43.

More specifically, the storage circuit 43 operates to match the value of a current flowing in the MOS transistors P7 and N10 with the value of a current flowing in the MOS transistors P8 and N9. That is, the storage circuit 43 adjusts the gate potential (the output value from the DAC 41) of the PMOS transistor P7 so as to match the potential of the node n3 with the potential of the node n2.

In this case, the PMOS transistors P7 and P8 have the same size (driving force), and the NMOS transistors N9 and N10 have the same size (driving force).

In Circuit Example 4, since the output signal from the operational amplifier OP3, i.e., the difference (analog value)

between the potential of the node n2 and the potential of the node n3, is stored as a count value (digital value) of the counter, it is difficult to accurately store a read current (initial data).

Even in this case, if a current change amount (the change amount of current flowing in the MOS transistors P7 and N10) per count of the counter is set to be sufficiently smaller than the change amount of read current based on the MR ratio of a TMR element, read operation can be done without posing any problem.

(8) Specific Example of BGR Circuit

FIG. 52 shows an example of the BGR circuit.

A BGR circuit 36 is a well-known circuit. In this example, an output current Ibgr for a DAC and an output current Ibgr for an oscillator are generated by using the BGR circuit 36.

(9) Specific Example of Oscillator

Figure 53:
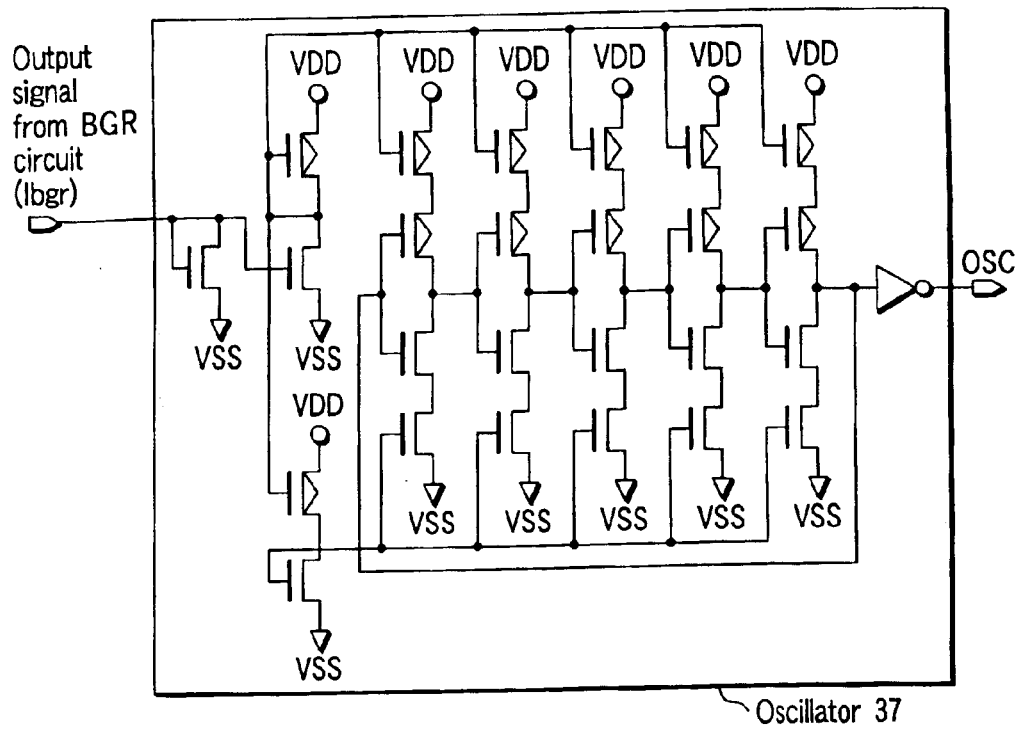
FIG. 53 is a view showing an example of an oscillator.

FIG. 53 shows an example of the oscillator.

An oscillator 37 receives an output current Ibgr from a BGR circuit, and generates a signal OSC whose level periodically changes. By supplying the output signal from the BGR circuit to the oscillator 37, a signal which is independent of temperature and power supply voltage and has a level that periodically changes can be generated.

This makes it possible to always keep the sampling time constant.

(10) Specific Example of Sample/Hold Circuit

Figure 54:
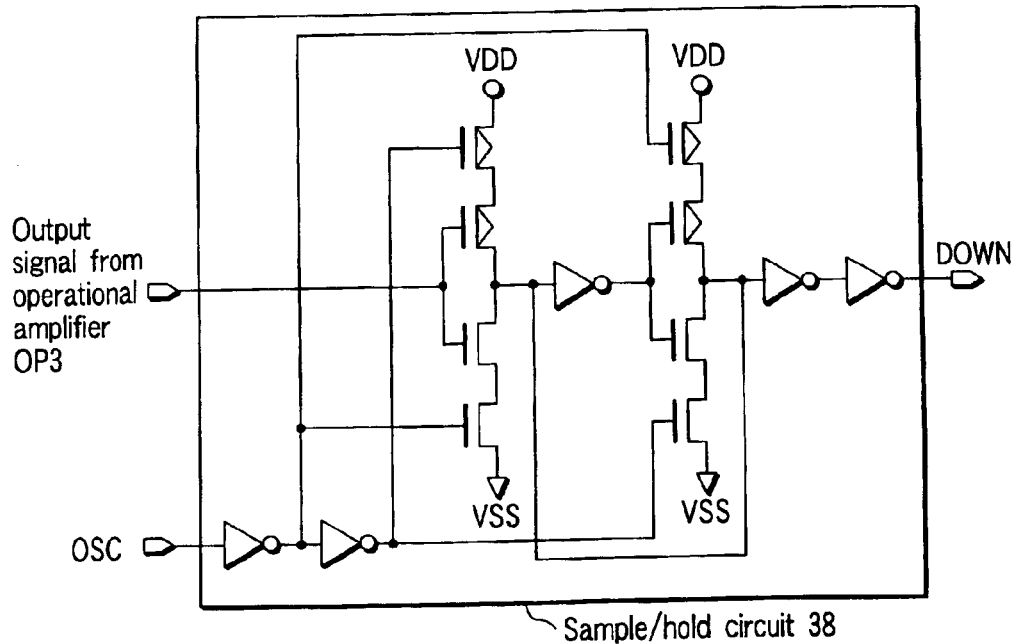
FIG. 54 is a view showing an example of a sample/hold circuit.
Figure 58:
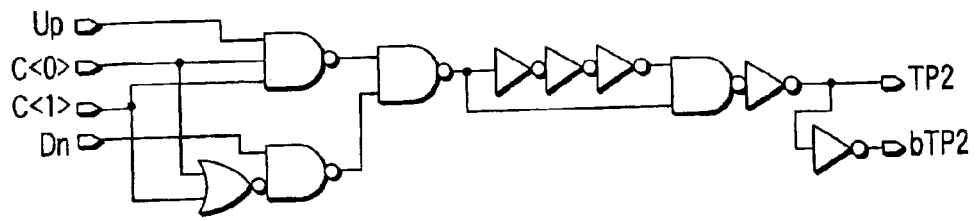
FIG. 58 is a view showing part of a counter driving circuit.
Figure 59:
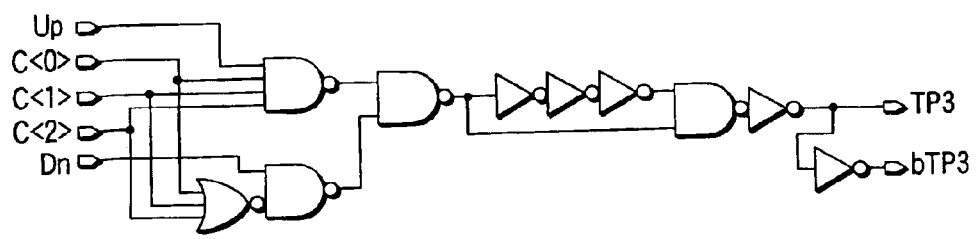
FIG. 59 is a view showing part of a counter driving circuit.
Figure 60:
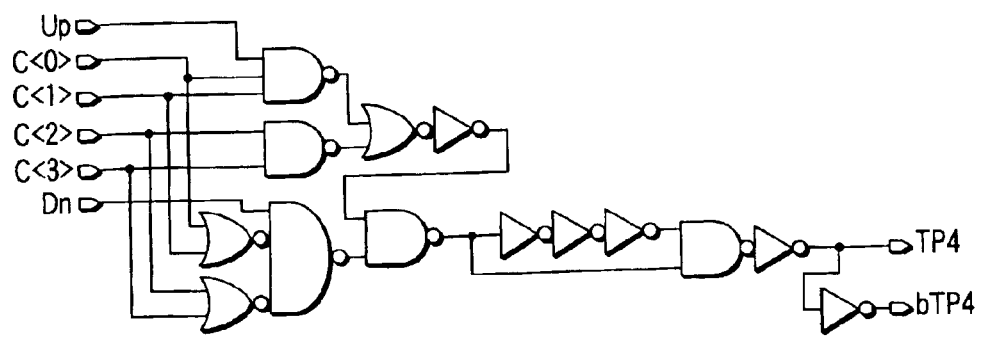
FIG. 60 is a view showing part of a counter driving circuit.
Figure 61:
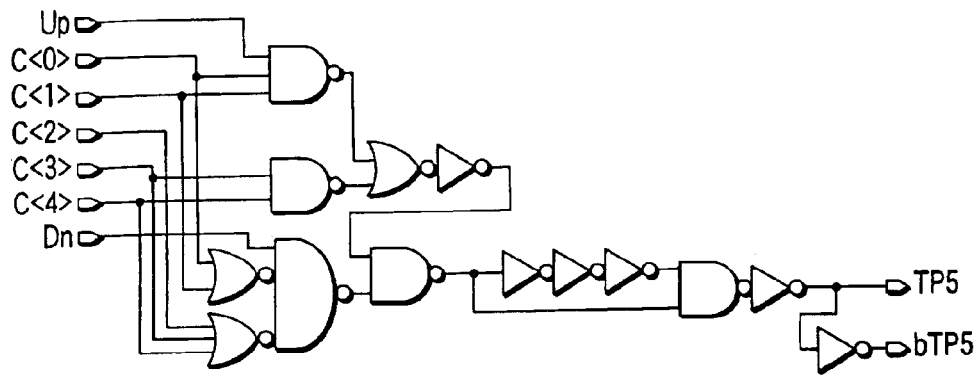
FIG. 61 is a view showing part of a counter driving circuit.
Figure 62:
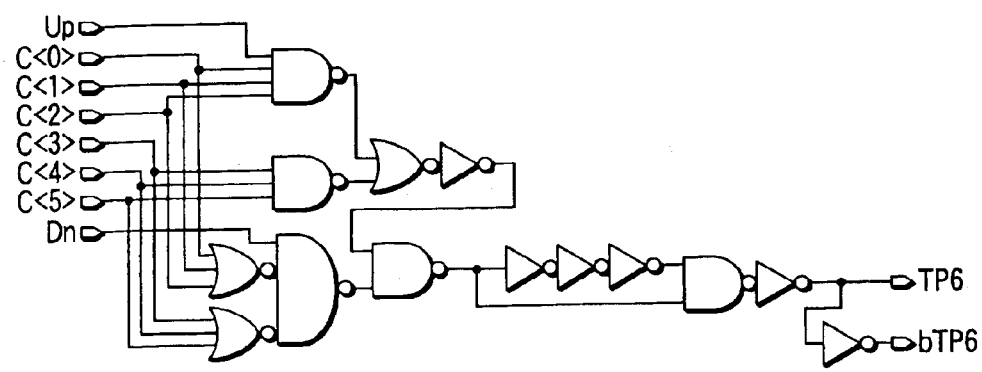
FIG. 62 is a view showing part of a counter driving circuit.
Figure 63:
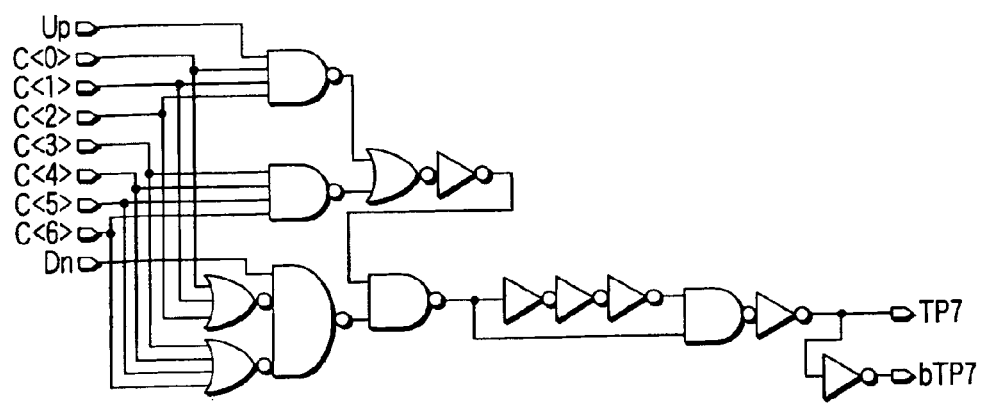
FIG. 63 is a view showing part of a counter driving circuit.

FIG. 54 shows an example of the sample/hold circuit.

A sample/hold circuit 38 holds the output signal from an operational amplifier OP3 as a sampling result, and outputs a sampling result DOWN to a counter trigger signal generating circuit 39 on the basis of a signal OSC whose level periodically changes.

(11) Specific Example of Counter Trigger Signal Generating Circuit

FIG. 55 shows an example of the counter trigger signal generating circuit.

A counter trigger signal generating circuit 39 outputs counter trigger signals Dn and Up on the basis of a sampling result DOWN and a signal OSC whose level periodically changes.

(12) Specific Example of Counter Driving Circuit FIGS. 56 to 63 show an example of the counter driving circuit.

The counter driving circuit generates control signals TP0, bTP0, TP1, bTP1, . . . , TP7, bTP7 for driving a counter on the basis of counter trigger signals Dn and Up.

(13) Specific Example of Counter

Figure 64:
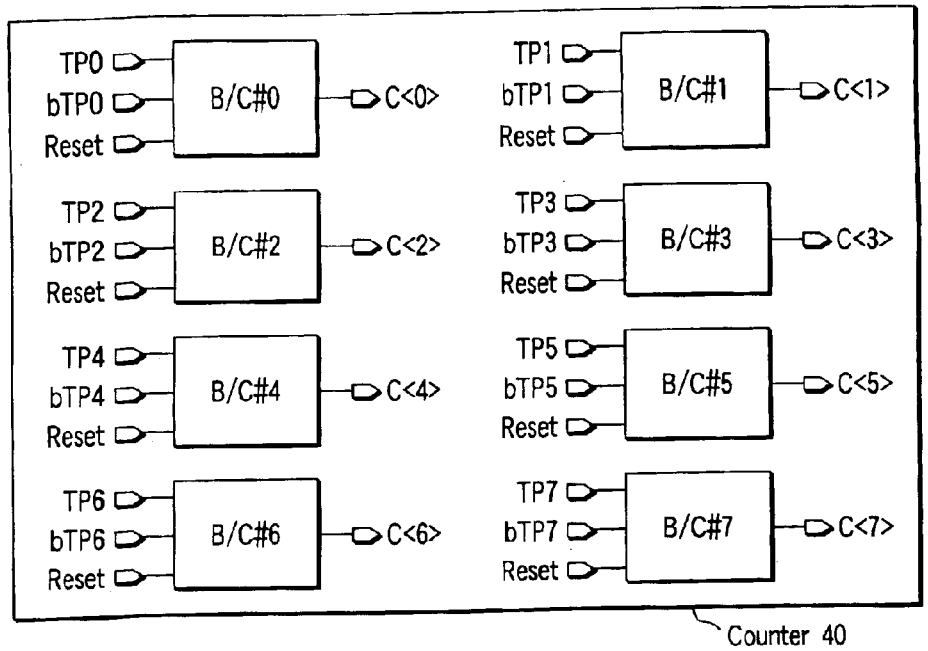
FIG. 64 is a view showing an example of a counter.
Figure 65:
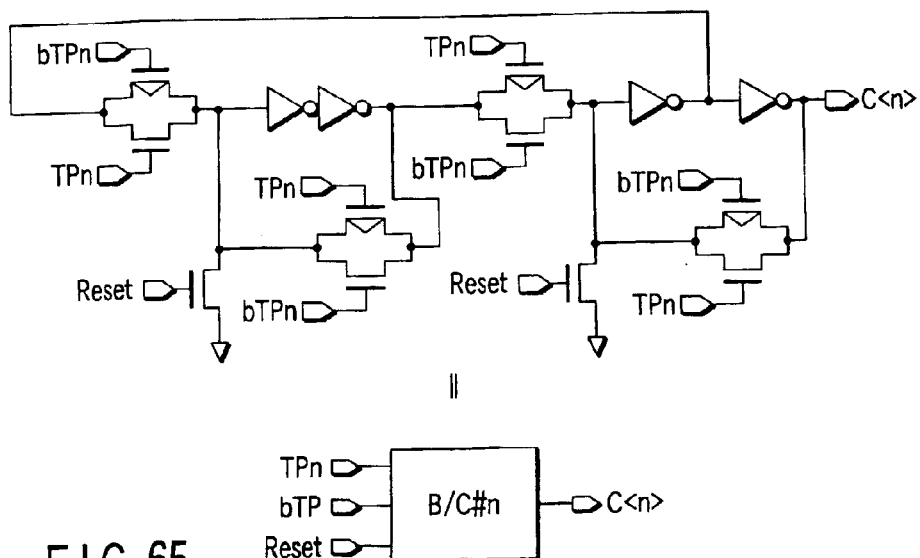
FIG. 65 is a view showing an example of a block in the counter in FIG. 64.

FIGS. 64 and 65 show an example of the counter. A counter 40 changes count values C<0>, C<1>, . . . , C<7> on the basis of control signals TP0, bTP0, TP1, bTP1, . . . , TP7, bTP7.

(14) Specific Example of DAC

Figure 66:
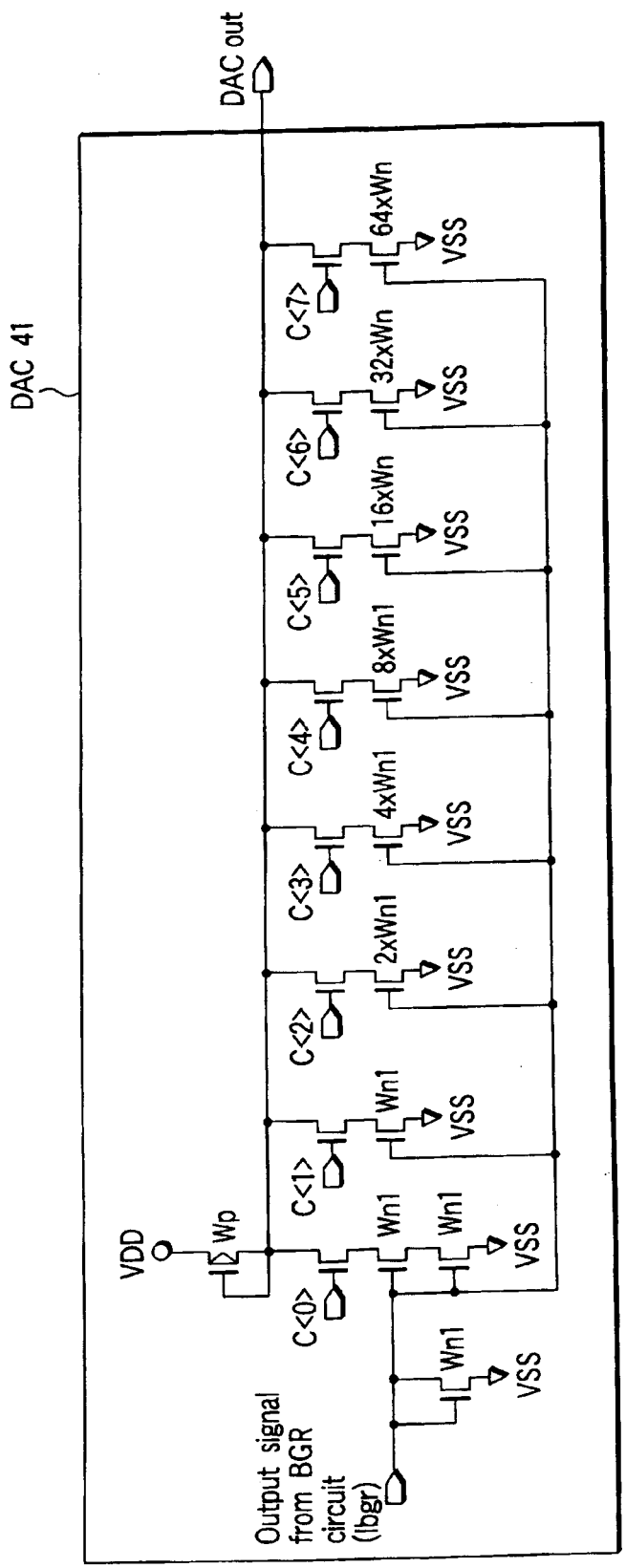
FIG. 66 is a view showing an example of a DAC.

FIG. 66 shows an example of the DAC.

A DAC 41 receives an output current Ibgr from a BGR circuit and output signals (count values) C<0>, C<1>, . . . , C<7> from a counter. The DAC 41 converts the count value of the counter from a digital signal to an analog signal.

(15) Operation of Circuit Example 4

The operation of the read circuit associated with Circuit Example 4 is the same as that of the read circuits associated with Circuit Examples 1, 2, and 3 except for a point associated with the improved destructive read operation principle and a point associated with storage of the initial data obtained by the first read operation as a digital value in the storage circuit.

① First Read Operation

In the first read operation, initial data is read.

A column address signal is input to the read circuit to turn on the column select switch N7 (SW). The operational amplifier OP1 controls the gate potential of the NMOS transistor N8 so as to match the potential of the node n1 with the clamp potential Vclamp.

At this time, a read current flows from the power supply terminal VDD to the ground terminal via the transistors N7 and N8 and a plurality of TMR elements. The current mirror circuit M1 functions to supply a current equal to this read current to the NMOS transistor N9.

As a consequence, a potential (initial data) corresponding to the combined resistance of the plurality of TMR elements appears at the node n2.

The potential of the node n2 is input to the positive input terminal of the operational amplifier OP3 in the storage circuit 43. The potential of the node n2 is stored in the storage circuit 43 as the count value of the counter 40. Since a current flows in the MOS transistors P7 and N10 on the basis of the count value of the counter 40, the potential of the node n3 becomes equal to the potential of the node n2 in consequence.

② Second Read Operation and Data Determining Operation

At the same time trial data is written in a selected TMR element, the second read operation is performed to read comparison data.

At this time, a read current flows from the power supply terminal VDD to the ground terminal via the transistors N7 and N8 and a plurality of TMR elements. The current mirror circuit M1 functions to supply a current equal to this read current to the NMOS transistor N9.

As a consequence, a potential (comparison data) corresponding to the combined resistance of the plurality of TMR elements appears at the node n2.

At this time, the potential of the node n2 is input to the positive input terminal of the sense amplifier SA, and the potential of the node n3 in the storage circuit 43 is input to the negative input terminal. As a consequence, the sense amplifier SA determines the value of the data in a selected TMR element on the basis of the potential of the node n2 and the potential of the node n3.

Note that data determining operation in the sense amplifier SA is the same as that described in the item "(4) Specific Examples of Sense Amplifier".

(16) Circuit Example 5

FIG. 67 shows Circuit Example 5 of a read circuit in a magnetic random access memory.

Circuit Example 5 does not have a storage circuit like that in Circuit Examples 1, 2, 3, and 4. In Circuit Example 5, an inductance element is simply connected to a current path, and the potential difference between the two terminals of the inductance element is detected by a sense amplifier SA. Circuit Example 5 is much simpler than Circuit Examples 1, 2, 3, and 4.

A plurality of TMR elements are connected in parallel with each other. One end of each TMR element is connected to a ground terminal, and the other end is connected to a node n1 via an NMOS transistor N7 (SW) serving as a column select switch. The group of TMR elements shown in FIG. 51 corresponds to one column in Improved Examples 1, 2, and 5, and one block in one column in Improved Examples 3, 4, and 6.

The potential of the node n1 is set to a clamp potential Vclamp by a clamp circuit. The clamp circuit is comprised of an operational amplifier OP1 and NMOS transistor N8. As the operational amplifier OP1, for example, the operational amplifier OP1 shown in FIG. 49 can be used.

An NMOS transistor N8 is placed between the node n1 and a current mirror circuit M1. The operational amplifier OP1 controls the gate potential of the NMOS transistor N8 so as to match, for example, the potential of the node n1 with the clamp potential Vclamp.

The current mirror circuit M1 functions to supply a current equal to the sum of read currents flowing in the plurality of TMR elements to an NMOS transistor N9. An inductance element L is connected between the current mirror circuit M1 and the NMOS transistor N9.

One terminal (node n2) of the inductance element L is connected to the positive input terminal of the sense amplifier SA, and the other terminal (node n3) is connected to the negative input terminal of the sense amplifier SA.

Since V=IR+L·dI/dt (where V is the power supply potential, I is the current value, R is the ON resistance of the MOS transistor, and L is the inductance), when a sufficiently long period of time has elapsed and a current flowing in the inductance element L becomes constant, the potential of the node n2 becomes equal to that of the node n3.

FIGS. 68A, 68B, 68C and 69 show an example of the inductance element.

An inductance element can be formed by using, for example, an LSI wiring technique. In this case, the inductance element can be formed within an LSI chip. That is, an inductance element for a read circuit can be formed in a magnetic random access memory chip.

An inductance element is made of an ordinary metal (Al, Cu, or the like) or a metal containing a magnetic substance. As shown in FIGS. 68A, 68B and 68C, a metal containing a magnetic substance includes a metal containing magnetic atoms (e.g., Fe, Fe—Ni, or Fe—Ni—Co) and a material obtained by partly or entirely covering the surface of an ordinary metal 61 with a magnetic metal 62.

Figure 69:
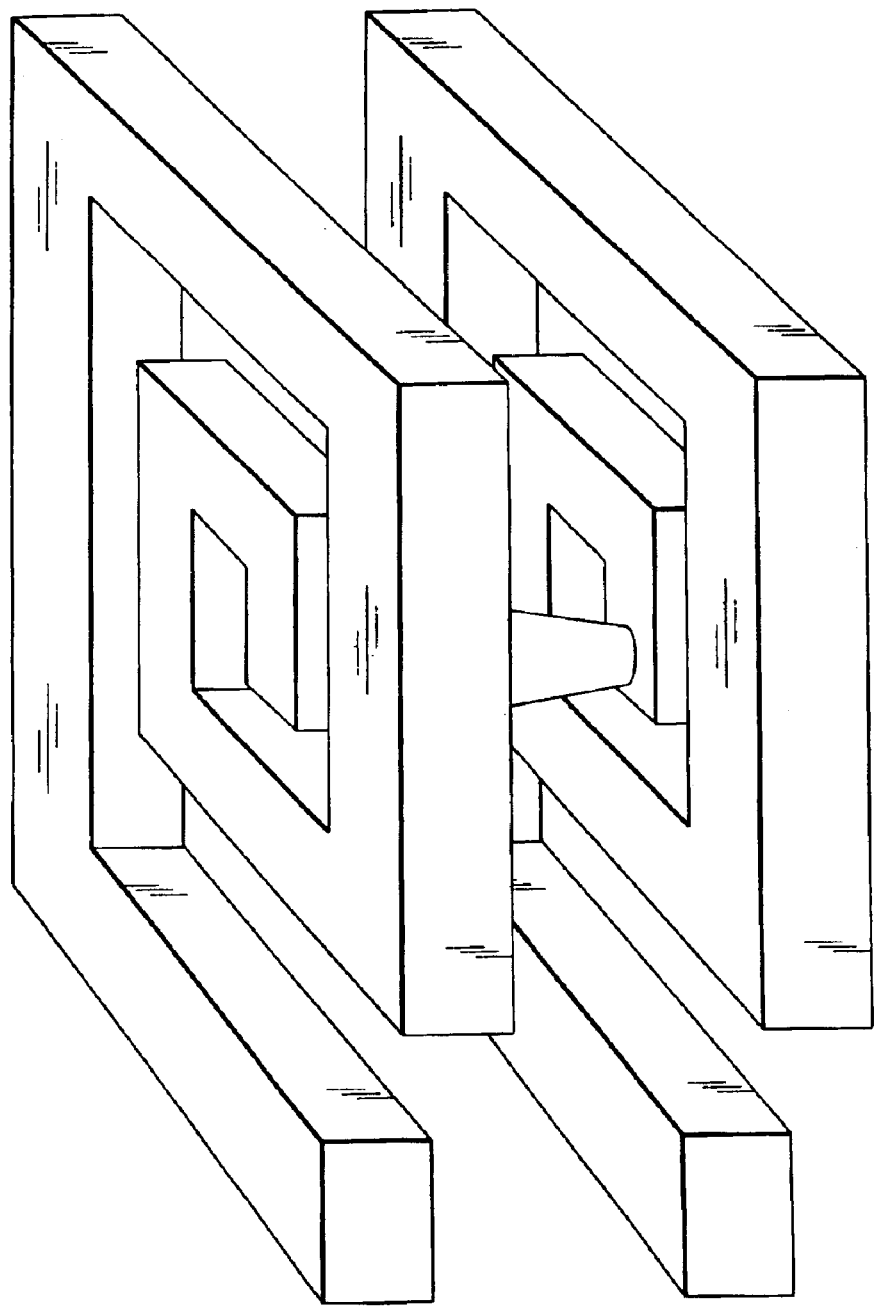
FIG. 69 is a view showing an example of an inductance element.

Since the permeability of a magnetic substance is sufficiently higher (100 to 1,000 times) than that of an ordinary metal, an inductance element made of a metal containing a magnetic substance can attain a higher inductance than an inductance element made of an ordinary metal (with the same area). In other words, an inductance element made of a metal containing a magnetic substance can attain a predetermined inductance value with a smaller area (for example, there is no need to stack inductance elements as shown in FIG. 69) than an inductance element made of an ordinary metal.

When an interconnection structure like the one shown in FIGS. 68B and 68C is to be used, a similar interconnection structure may be applied not only to inductance elements but also to interconnections (write word/bit lines for generating write magnetic fields, in particular) formed to be flush with the inductance elements.

(17) Operation of Circuit Example 5

The operation of a read circuit associated with Circuit Example 5 is associated with the improved destructive read operation principle, and is characterized in that there is no operation of storing the initial data obtained by the first read operation in a storage circuit.

① First Read Operation

In the first read operation, initial data is read.

A column address signal is input to the read circuit to turn on the column select switch N7 (SW). The operational amplifier OP1 controls the gate potential of the NMOS transistor N8 so as to match the potential of the node n1 with the clamp potential Vclamp.

At this time, a read current flows from the power supply terminal VDD to the ground terminal via the transistors N7 and N8 and a plurality of TMR elements. The current mirror circuit M1 functions to supply a current equal to this read current to the NMOS transistor N9.

When, therefore, a sufficiently long period of time has elapsed and a current flowing in the inductance element L becomes constant, a potential (initial data) corresponding to the combined resistance of a plurality of TMR elements appears at the node n2.

② Second Read Operation and Data Determining Operation

At the same time trial data is written in a selected TMR element, the second read operation is performed to read comparison data.

At this time, a read current flows from the power supply terminal VDD to the ground terminal via the transistors N7 and N8 and a plurality of TMR elements. The current mirror circuit M1 functions to supply a current equal to this read current to the NMOS transistor N9.

If, therefore, the combined resistance of the plurality of TMR elements does not change (the data in the selected TMR element coincides with the trial data), since no change in current value occurs, the potential of the node n2 remains equal to that of the node n3.

If the combined resistance of the plurality of TMR elements changes (the data in the selected TMR element differs from the trial data), since the current value changes, the potential of the node n3 becomes different from that of the node n2 by the inductance component.

When changes in potentials at the nodes n2 and n3 are detected by the sense amplifier SA, the data value of the selected TMR element can be determined.

(18) Other Circuit Example

① Circuit Example 6

FIG. 70 shows Circuit Example 6 of a read circuit in a magnetic random access memory.

Circuit Example 6 is an improved example of Circuit Example 1 (FIG. 42).

Circuit Example 6 is the same as Circuit Example 1 except that it has an additive current generating section 42.

As the number of TMR elements connected in parallel in one block or one column increases, the value of a single current greatly decreases relative to the value of a read current. This makes it difficult for a sense amplifier to detect such a small signal current.

In this example, therefore, the additive current generating section 42 is newly provided.

The additive current generating section 42 has a current source Is. The constant current generated by this current source Is is supplied to TMR elements via a current mirror circuit M2.

In Circuit Example 6, if a cell current flowing in the TMR elements connected in parallel in one block or one column is represented by Icell, a current flowing in the current mirror circuit M1, i.e., a current Isense flowing in an NMOS transistor N9, is given by Isense=Icell−Is.

This makes it possible to increase the value of a signal current relative to the value of a read current. Therefore, the detection sensitivity of the sense amplifier with respect to a signal current can be improved.

② Circuit Example 7

Figure 71:
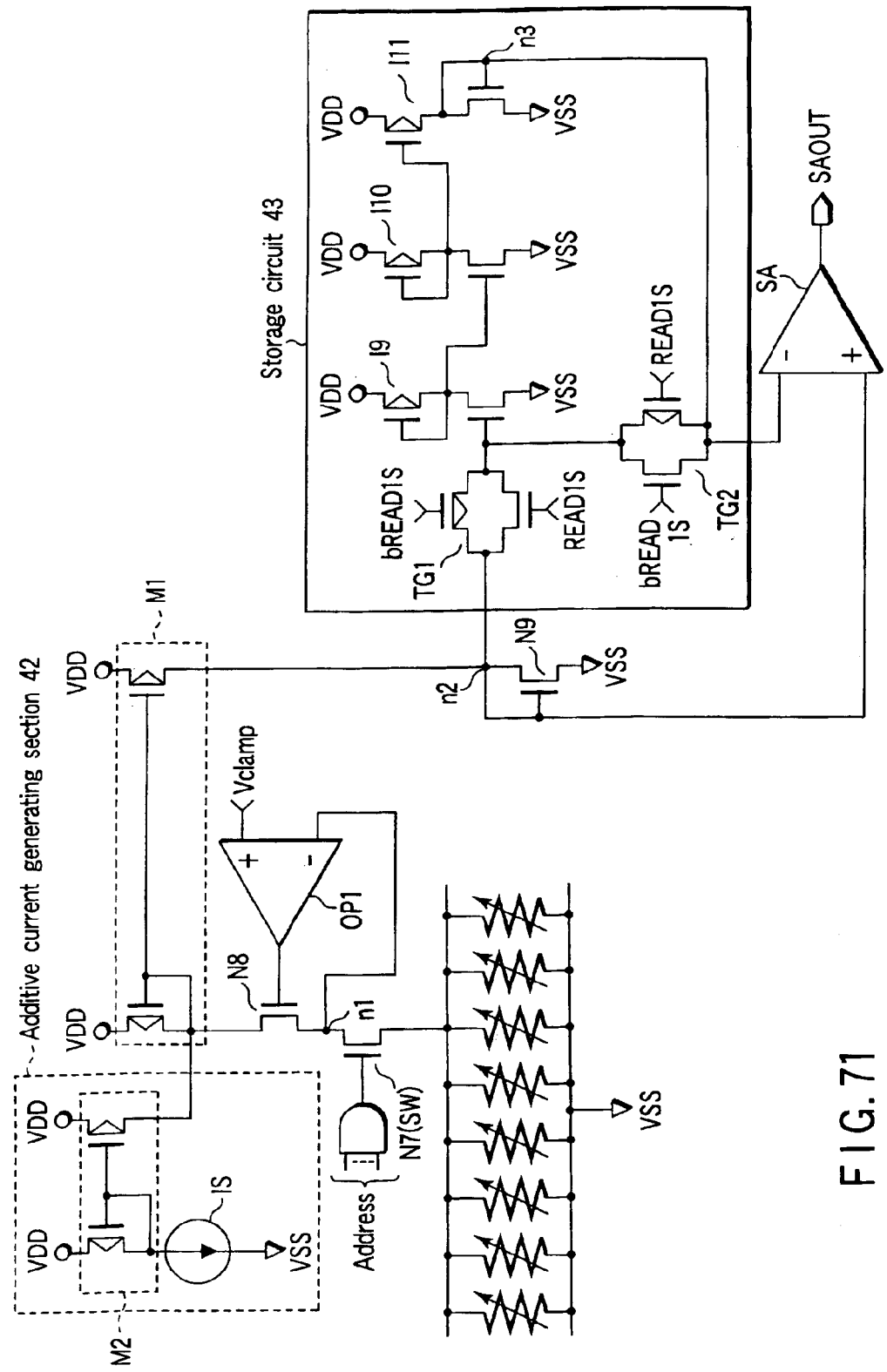
FIG. 71 is a view showing Circuit Example 7 of a read circuit.

FIG. 71 shows Circuit Example 7 of a read circuit in a magnetic random access memory.

Circuit Example 7 is an improved example of Circuit Example 2 (FIG. 43).

Circuit Example 7 is the same as Circuit Example 2 except that it has an additive current generating section 42.

The additive current generating section 42 is the same as that in Circuit Example 6. In Circuit Example 7 as well, since the value of a signal current relative to the value of a read current can be increased, the detection sensitivity of a sense amplifier with respect to a signal current can be improved.

③ Circuit Example 8

Figure 72:
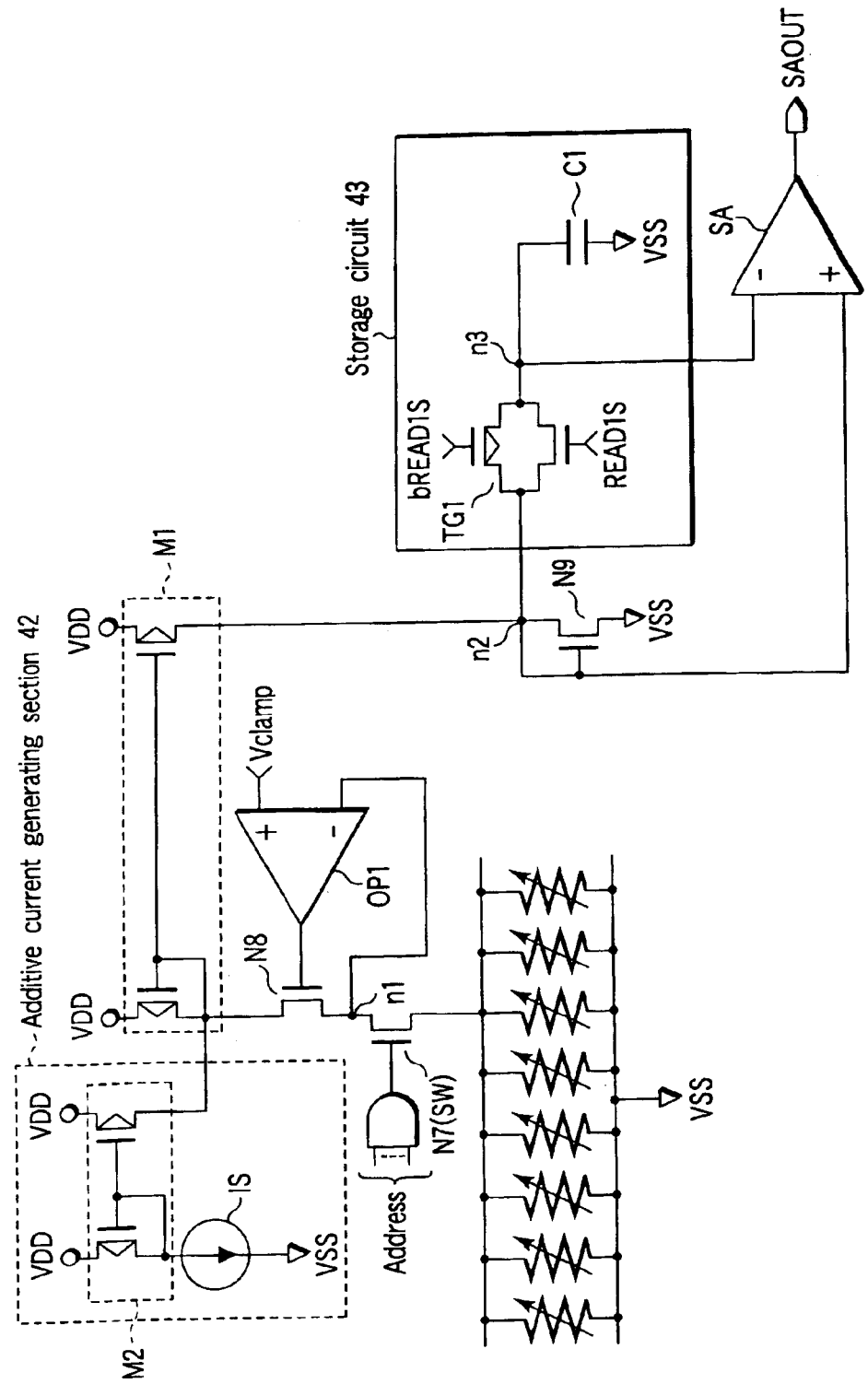
FIG. 72 is a view showing Circuit Example 8 of a read circuit.

FIG. 72 shows Circuit Example 8 of a read circuit in a magnetic random access memory.

Circuit Example 8 is an improved example of Circuit Example 3 (FIG. 44).

Circuit Example 8 is the same as Circuit Example 3 except that it has an additive current generating section 42.

The additive current generating section 42 is the same as that in Circuit Example 6. In Circuit Example 8 as well, since the value of a signal current relative to the value of a read current can be increased, the detection sensitivity of a sense amplifier with respect to a signal current can be improved.

④ Specific Example of Current Source for Additive Current Generating Section

Figure 73:
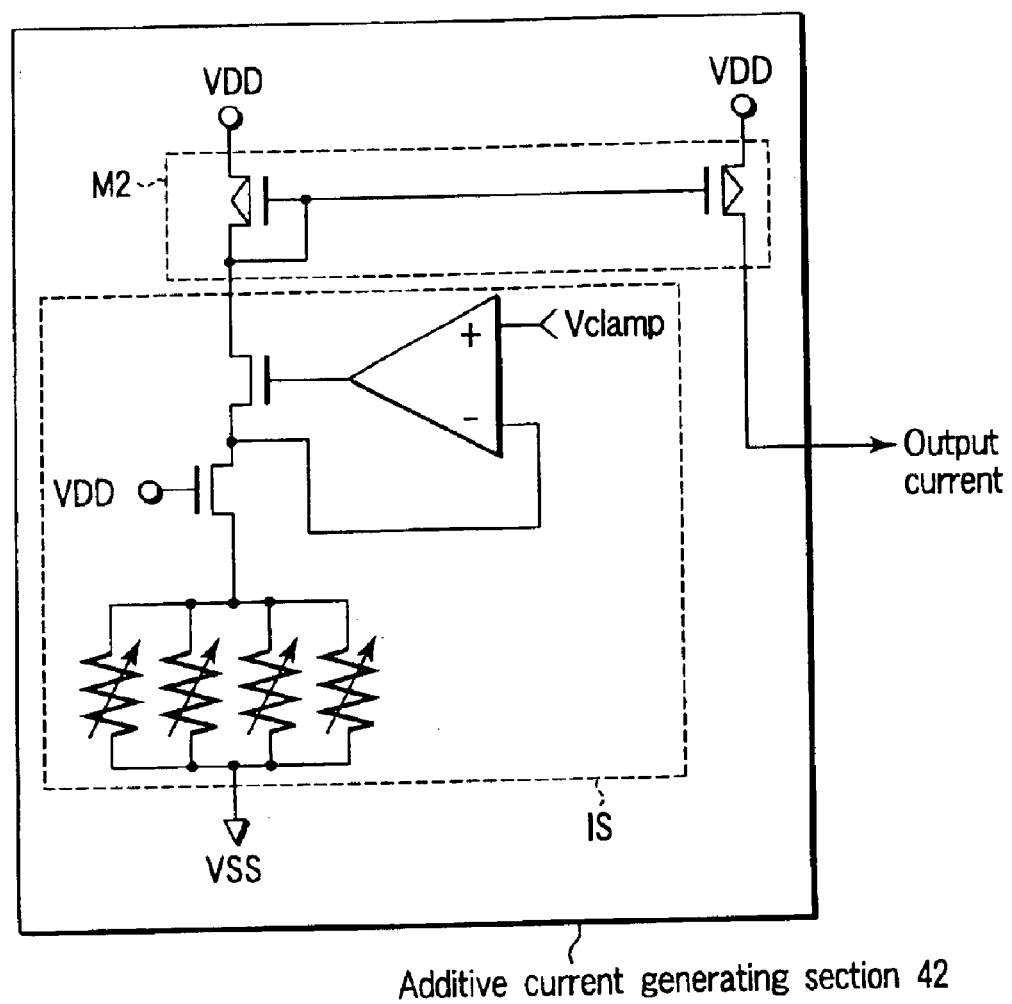
FIG. 73 is a view showing an example of an additive current generating section.

FIG. 73 shows an example of a current source for an additive current generating section.

A current source Is for an additive current generating section 42 can have, for example, the same arrangement as that of a memory cell array section. That is, the current source Is can be constituted by a plurality of TMR elements connected in parallel, a clamp circuit, and an NMOS transistor.

In this case, the number of TMR elements in the current source Is is preferably smaller than the number of TMR elements connected in parallel in one block or one column of a memory cell array.

In this example, the additive current generating section 42 is formed by using TMR elements. However, BGR circuits and the like may be used instead.

4. Others

The above description is based on the assumption that TMR elements are used as the memory cells of a magnetic random access memory. However, the present invention, i.e., various improved examples, read operation principles, specific examples of peripheral circuits, and the like, can be applied to a case where memory cells are GMR (Giant MagnetoResistance) elements.

In addition, the structure of a TMR element or GMR element is not specifically limited in practicing the present invention.

The read operation principles according to the present invention can be applied to a magnetic random access memory in which a plurality of memory cells (TMR elements) are connected in parallel in one block or one column, like the reference example and Improved Examples 1 to 6, and can also be applied to a magnetic random access memory having a so-called 1-MTJ+1-transistor structure in which one memory cell consists of one memory element (MTJ) and one select transistor.

The read operation to be done in this case is substantially the same as that applied to the reference example and Improved Examples 1 to 6. In addition, the same effect as that described above can be obtained. That is, data can be accurately read regardless of variations in resistance value among a plurality of memory cells.

As has been described above, according to the present invention, in a magnetic random access memory using the destructive read operation principle, in particular, a write circuit such as a write driver and a read circuit such as a sense amplifier are implemented. This makes it possible to take a step toward the mass production of magnetic random access memories. Furthermore, with regard to the array structure of a magnetic random access memory and read operation principles, improved techniques for improving feasibility can be proposed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   memory cells which are connected in parallel with each other and store data by using a magnetoresistive effect;
   a write bit line which is placed near said memory cells and extends in a first direction;
   first and second write bit line drivers/sinkers which supply a write current to said write bit line or absorb the write current from said write bit line;
   a first switch connected between one end of said write bit line and said first write bit line driver/sinker;
   a second switch connected between the other end of said write bit line and said second write bit line driver/sinker;
   a read bit line which is connected to one terminal of each of said memory cells and extends in the first direction;
   a read circuit which supplies a read current to said read bit line;
   a third switch connected between said read bit line and said read circuit; and
   write word lines extending in a second direction perpendicular to the first direction.

2. A memory according to claim 1, wherein said memory cells are stacked on a semiconductor substrate.

3. A memory according to claim 1, wherein said memory cells are arranged in the first direction.

4. A memory according to claim 1, wherein the other terminal of each of said memory cells is directly connected to a ground terminal.

5. A memory according to claim 1, further comprising:
   a fourth switch connected between the other terminal of each of said memory cells and the ground terminal; and
   a read word line which is connected to a control terminal of said fourth switch and extends in the second direction.

6. A memory according to claim 5, wherein a column of a memory cell array is constituted by blocks, and each of said blocks is constituted by said memory cells.

7. A memory according to claim 1, wherein said first and second switches are turned on in write operation.

8. A memory according to claim 1, wherein said third switch is turned on in read operation.

9. A memory according to claim 5, wherein said third and fourth switches are turned on in read operation.

* * * * *